(12) United States Patent
Moriwaka

(10) Patent No.: US 8,278,739 B2
(45) Date of Patent: Oct. 2, 2012

(54) CRYSTALLINE SEMICONDUCTOR FILM, SEMICONDUCTOR DEVICE, AND METHOD FOR MANUFACTURING THEREOF

(75) Inventor: Tomoaki Moriwaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 40 days.

(21) Appl. No.: 11/715,473

(22) Filed: Mar. 8, 2007

(65) Prior Publication Data

US 2007/0222038 A1   Sep. 27, 2007

(30) Foreign Application Priority Data

Mar. 20, 2006  (JP) ................................ 2006-077484

(51) Int. Cl.
  *H01L 29/04*  (2006.01)
(52) U.S. Cl. .............. 257/627; 257/57; 257/59; 257/66; 257/649; 257/E21.134; 257/E21.347; 257/E29.003; 257/E29.004; 257/E27.112; 438/149; 438/151; 438/166; 438/482; 438/487; 438/535; 438/798
(58) Field of Classification Search .................... 257/57, 257/59, 66, 627, 649, E21.347, E29.004, 257/E21.134, E29.003, E27.112; 438/149, 438/151, 166, 482, 487, 535, 798
See application file for complete search history.

(56) References Cited

U.S. PATENT DOCUMENTS

| | | |
|---|---|---|
| 5,313,076 A | 5/1994 | Yamazaki et al. |
| 5,643,826 A | 7/1997 | Ohtani et al. |
| 5,670,793 A | 9/1997 | Miura et al. |
| 5,753,542 A | 5/1998 | Yamazaki et al. |
| 5,899,547 A | 5/1999 | Yamazaki et al. |
| 5,899,709 A | 5/1999 | Yamazaki et al. |
| 5,962,869 A | 10/1999 | Yamazaki et al. |
| 6,071,764 A | 6/2000 | Zhang et al. |

(Continued)

FOREIGN PATENT DOCUMENTS

EP      0 651 431 A2      5/1995

(Continued)

OTHER PUBLICATIONS

Fabrication of UV-transparent SixOyNz membranes with a low frequency PECVD reactor K. Danaiea, A. Bosseboeuf, , a, C. Clercb, C. Gousseta and G. Juliea Sensors and Actuators A: Physical vol. 99, Issues 1-2, Apr. 30, 2002, pp. 78-81.*

(Continued)

*Primary Examiner* — A. Sefer
*Assistant Examiner* — Farid Khan
(74) *Attorney, Agent, or Firm* — Nixon Peabody LLP; Jeffrey L. Costellia

(57) ABSTRACT

A method for manufacturing is: forming an insulating film over a substrate; forming an amorphous semiconductor film over the insulating film; forming over the amorphous semiconductor film, a silicon nitride film in which a film thickness is equal to or more than 200 nm and equal to or less than 1000 nm, equal to or less than 10 atomic % of oxygen is included, and a relative proportion of nitrogen to silicon is equal to or more than 1.3 and equal to or less than 1.5; irradiating the amorphous semiconductor film with a continuous-wave laser light or a laser light with repetition rate of equal to or more than the wave length of 10 MHz transmitting the silicon nitride film to melt and later crystallize the amorphous semiconductor film to form a crystalline semiconductor film.

14 Claims, 33 Drawing Sheets

U.S. PATENT DOCUMENTS

| | | | |
|---|---|---|---|
| 6,172,380 | B1 | 1/2001 | Noguchi et al. |
| 6,358,766 | B1 | 3/2002 | Kasahara |
| 6,423,586 | B1 | 7/2002 | Yamazaki et al. |
| 6,545,320 | B2 | 4/2003 | Ohtani et al. |
| 6,787,807 | B2 | 9/2004 | Yamazaki et al. |
| 6,797,550 | B2 | 9/2004 | Kokubo et al. |
| 6,881,615 | B2 | 4/2005 | Yamazaki et al. |
| 6,908,797 | B2 | 6/2005 | Takano |
| 7,306,981 | B2 | 12/2007 | Kuwabara et al. |
| 7,319,055 | B2 | 1/2008 | Kokubo et al. |
| 7,709,309 | B2 | 5/2010 | Moriwaka |
| 2004/0201022 | A1* | 10/2004 | Yamazaki et al. ............... 257/72 |
| 2005/0115930 | A1 | 6/2005 | Tanaka et al. |
| 2005/0139786 | A1 | 6/2005 | Tanaka et al. |
| 2005/0202602 | A1* | 9/2005 | Asami et al. .................. 438/149 |
| 2005/0255716 | A1* | 11/2005 | Tanaka et al. ................. 438/795 |
| 2006/0088986 | A1* | 4/2006 | Lin et al. ....................... 438/482 |
| 2006/0246693 | A1* | 11/2006 | Tanaka et al. ................. 438/487 |
| 2007/0264836 | A1* | 11/2007 | Chen et al. .................... 438/736 |

FOREIGN PATENT DOCUMENTS

| | | | |
|---|---|---|---|
| JP | 05-299339 | | 11/1993 |
| JP | 07-135174 | | 5/1995 |
| JP | 11-145056 | | 5/1999 |
| JP | 2003-197521 | | 7/2003 |
| JP | 2004-179195 | | 6/2004 |
| JP | 2004-327677 | | 11/2004 |
| JP | 2005-191546 | | 7/2005 |
| JP | 2006-310445 | * | 9/2006 |
| JP | 2006-310445 | * | 11/2006 |

OTHER PUBLICATIONS

"Fabrication of UV-transparent SixOyNz membranes with a low frequency PECVD reactor" K. Danaiea, A. Bosseboeuf a, C. Clercb, C. Gousseta and G. Juliea; Sensors and Actuators A: Physical vol. 99, Issues 1-2, Apr. 30, 2002, pp. 78-81.*

Y. Ohashi et al., "Crystalline Orientation of Large-Grain Poly-Si Thin Films Observed by Raman Spectroscopy", Dig. Tech. Papers AM-LCD 04, TFTp5-4, Aug. 25, 2004, pp. 269-272.

* cited by examiner

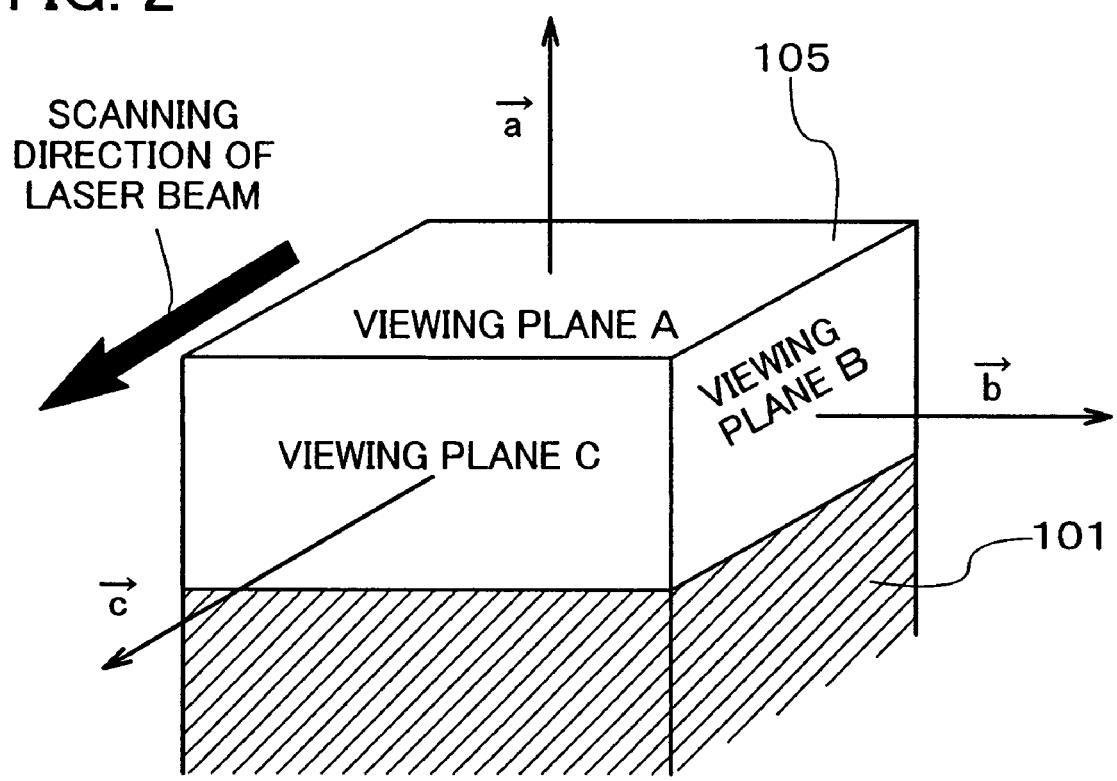

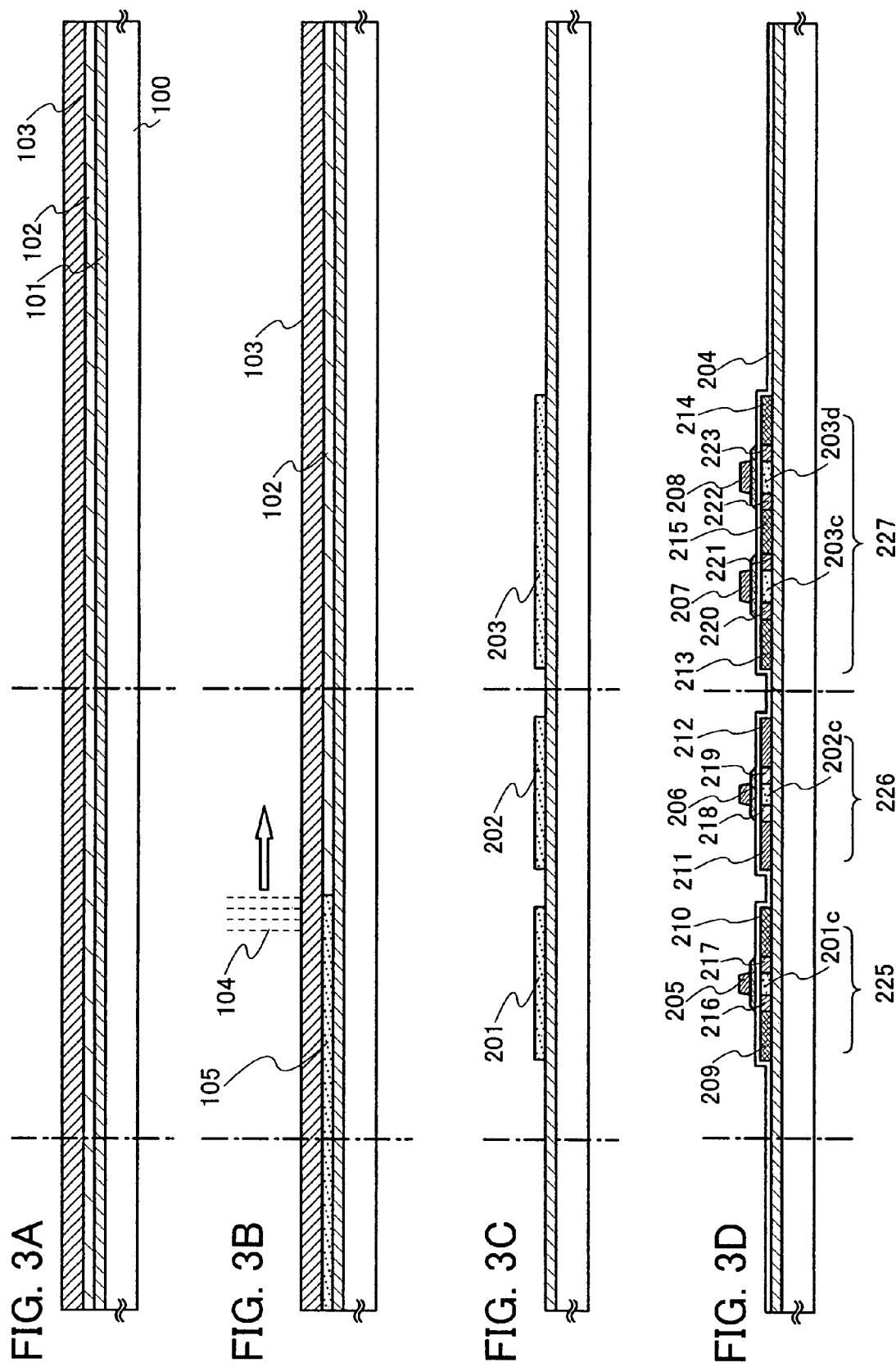

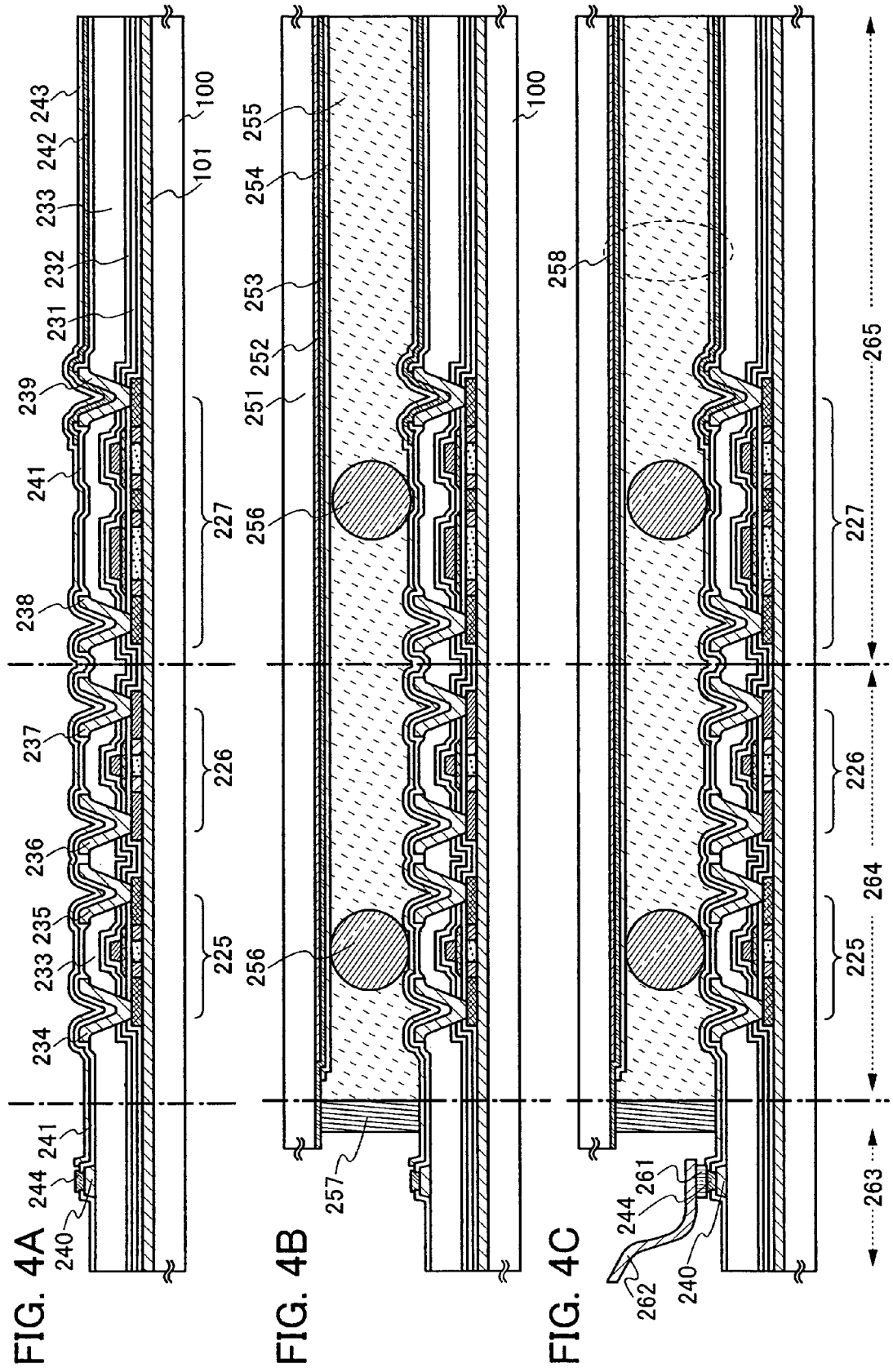

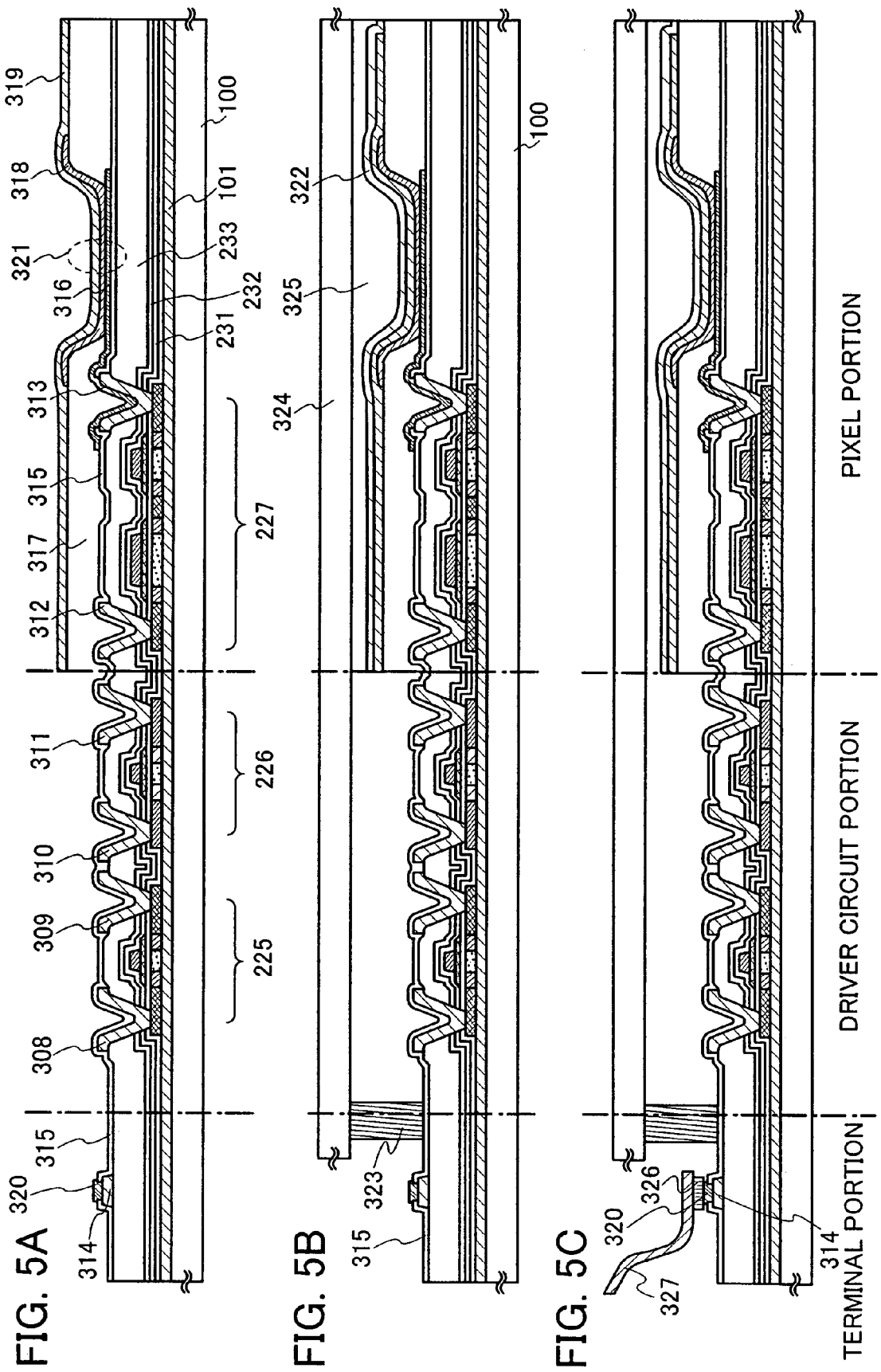

FIG. 19C VIEWING PLANE C
FIG. 19B VIEWING PLANE B
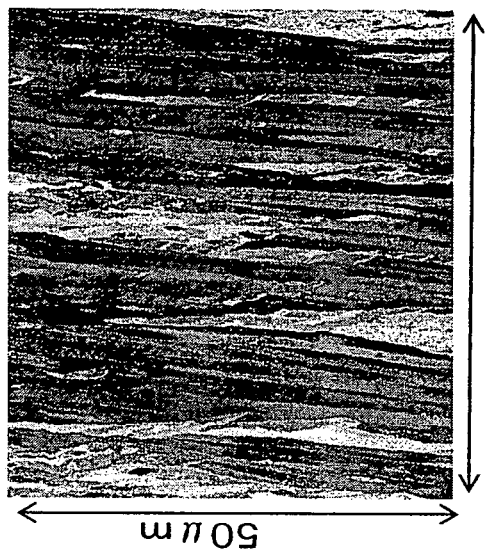
FIG. 19A VIEWING PLANE A
50 μm
50 μm
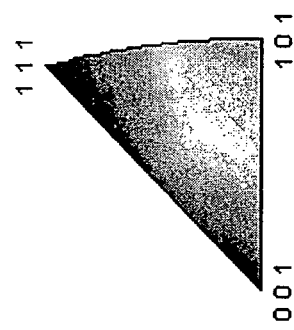
FIG. 19D
Silicon

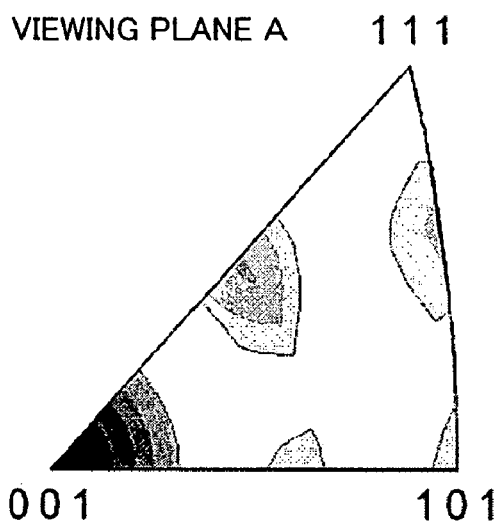
FIG. 20A
VIEWING PLANE A
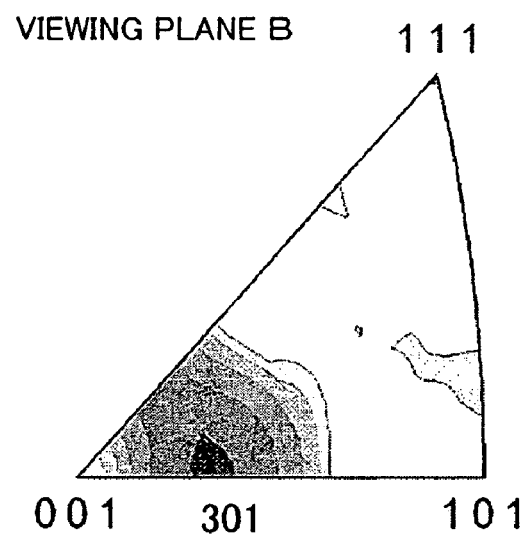
FIG. 20B
VIEWING PLANE B
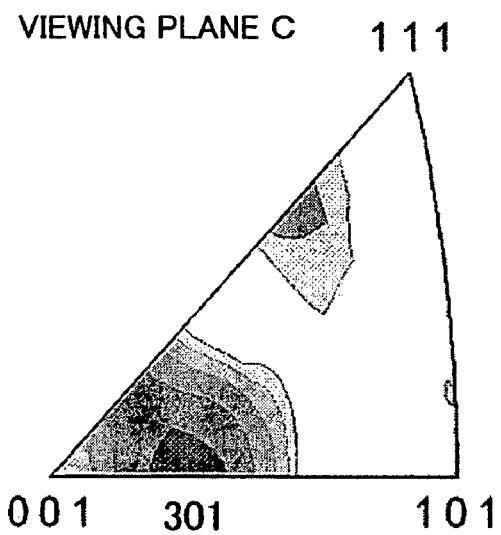
FIG. 20C
VIEWING PLANE C
FIG. 20D
Texture Name: Harmonic: L=16, HW=5.0
Calculation Method: Harmonic Series Expansion
Series Rank (l): 16
Gaussian Smoothing: 5.0°
Sample Symmetry: Triclinic
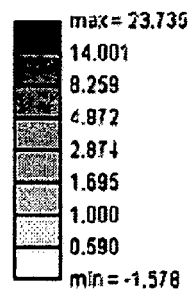

VIEWING PLANE A

VIEWING PLANE B

VIEWING PLANE C

FIG. 22A  VIEWING PLANE A
FIG. 22B  VIEWING PLANE B
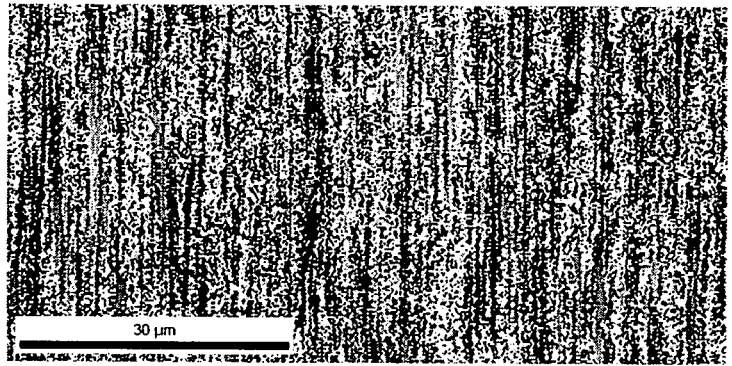
FIG. 22C  VIEWING PLANE C
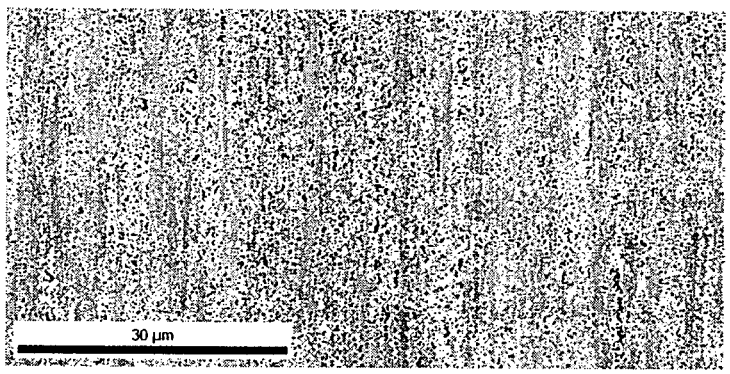
FIG. 22D
Color Coded Map Type: Inverse Pole Figure [100]
fcc_generic
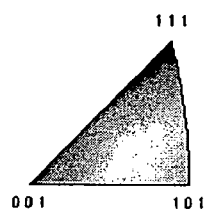

VIEWING PLANE A

VIEWING PLANE B

VIEWING PLANE C

Texture Name: Harmonic: L=16, HW=5.0
Calculation Method: Harmonic Series Expansion
Series Rank (l): 16
Gaussian Smoothing: 5.0°
Sample Symmetry: Triclinic

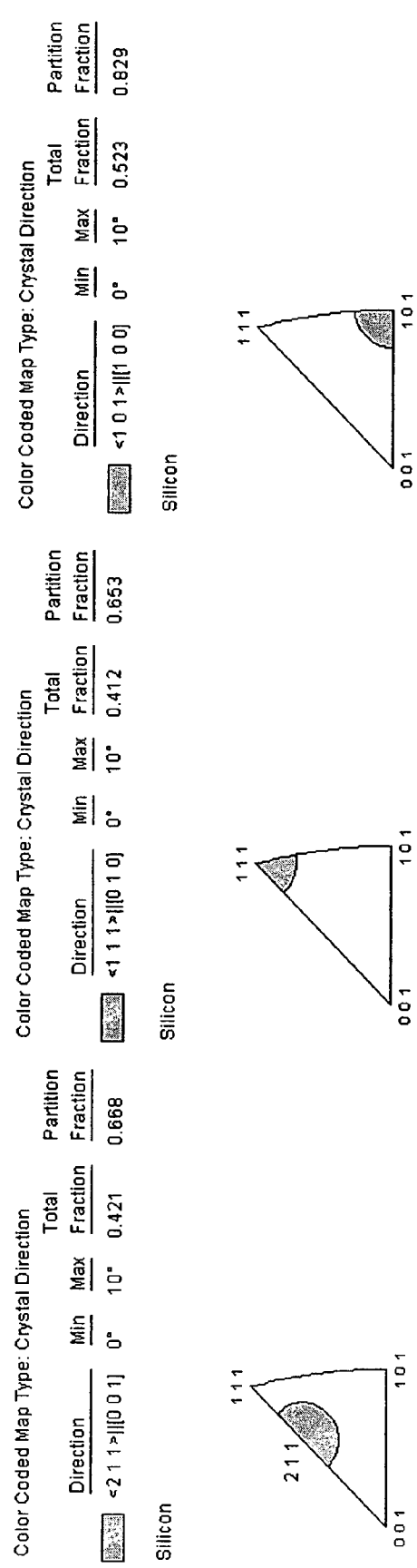
FIG. 24A VIEWING PLANE A
FIG. 24B VIEWING PLANE B
FIG. 24C VIEWING PLANE C

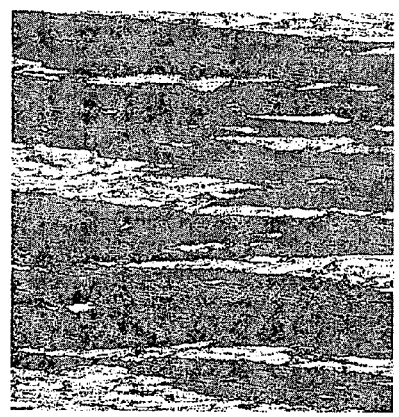
FIG. 25A ⟨601⟩
FIG. 25B ⟨501⟩
FIG. 25C ⟨401⟩
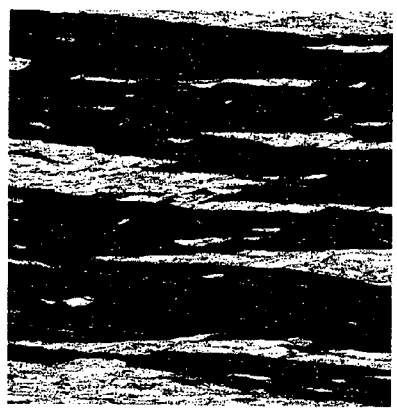
FIG. 25D ⟨301⟩
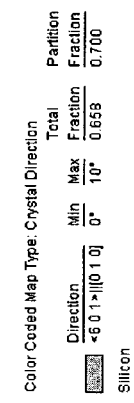
FIG. 25E ⟨601⟩
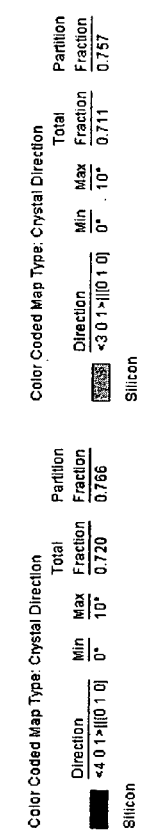
FIG. 25F ⟨501⟩
FIG. 25G ⟨401⟩
FIG. 25H ⟨301⟩

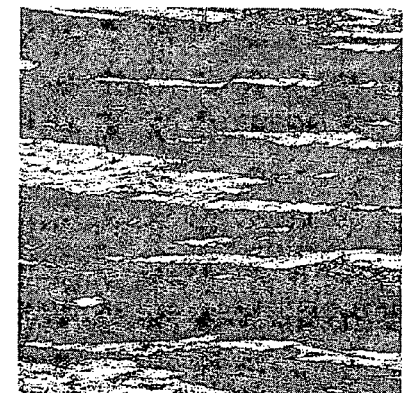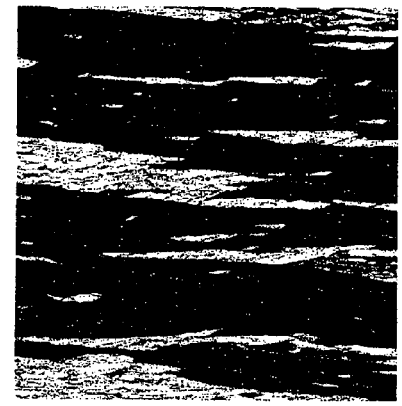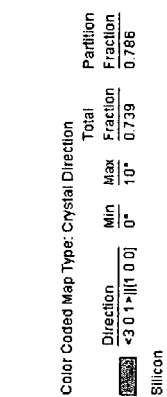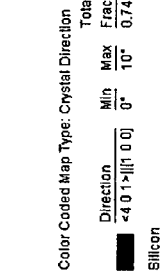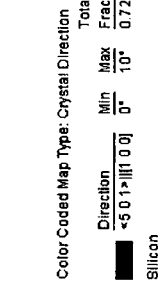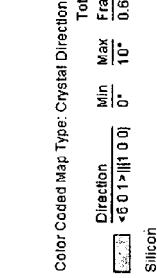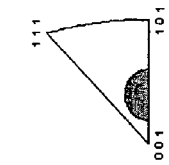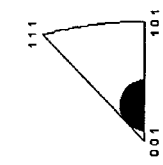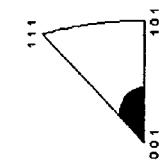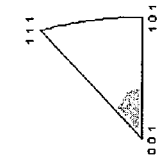
FIG. 26A ⟨601⟩ FIG. 26B ⟨501⟩ FIG. 26C ⟨401⟩ FIG. 26D ⟨301⟩
FIG. 26E ⟨601⟩ FIG. 26F ⟨501⟩ FIG. 26G ⟨401⟩ FIG. 26H ⟨301⟩

<001>

⟨001⟩

⟨601⟩

⟨501⟩

⟨401⟩

⟨301⟩

⟨201⟩

⟨101⟩

⟨001⟩

⟨601⟩

⟨501⟩

⟨401⟩

⟨301⟩

⟨201⟩

⟨101⟩

FIG. 30A
VIEWING PLANE A

FIG. 30B
VIEWING PLANE B

FIG. 30C
VIEWING PLANE C

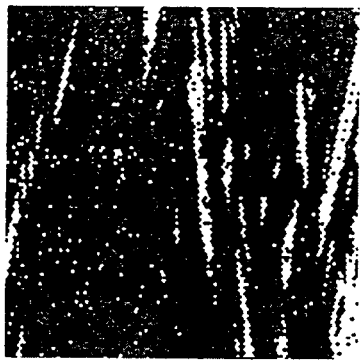
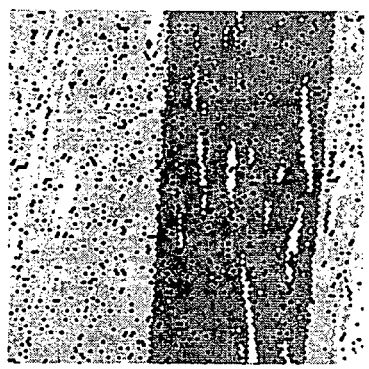
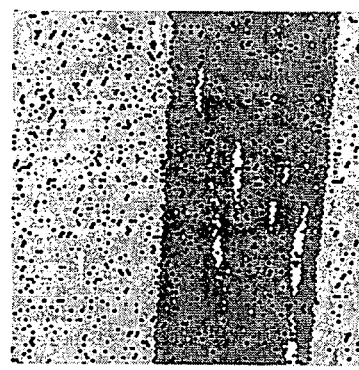

FIG. 30D
VIEWING PLANE A

FIG. 30E
VIEWING PLANE B

FIG. 30F
VIEWING PLANE C

Color Coded Map Type: Crystal Direction

| Direction | Min | Max | Total Fraction | Partition Fraction |
|---|---|---|---|---|
| <0 0 1>‖[0 0 1] | 0° | 10° | 0.804 | 0.869 |

Silicon

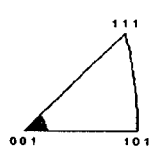

Color Coded Map Type: Crystal Direction

| Direction | Min | Max | Total Fraction | Partition Fraction |
|---|---|---|---|---|
| <0 0 1>‖[0 1 0] | 0° | 10° | 0.000 | 0.000 |
| <6 0 1>‖[0 1 0] | 0° | 10° | 0.001 | 0.002 |
| <5 0 1>‖[0 1 0] | 0° | 10° | 0.000 | 0.000 |
| <4 0 1>‖[0 1 0] | 0° | 10° | 0.004 | 0.004 |
| <3 0 1>‖[0 1 0] | 0° | 10° | 0.394 | 0.426 |
| <2 0 1>‖[0 1 0] | 0° | 10° | 0.414 | 0.448 |
| <1 0 1>‖[0 1 0] | 0° | 10° | 0.003 | 0.003 |

Silicon

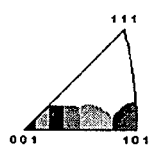

Color Coded Map Type: Crystal Direction

| Direction | Min | Max | Total Fraction | Partition Fraction |
|---|---|---|---|---|
| <0 0 1>‖[1 0 0] | 0° | 10° | 0.000 | 0.000 |
| <6 0 1>‖[1 0 0] | 0° | 10° | 0.004 | 0.004 |
| <5 0 1>‖[1 0 0] | 0° | 10° | 0.001 | 0.001 |
| <4 0 1>‖[1 0 0] | 0° | 10° | 0.001 | 0.002 |
| <3 0 1>‖[1 0 0] | 0° | 10° | 0.409 | 0.442 |
| <2 0 1>‖[1 0 0] | 0° | 10° | 0.478 | 0.517 |
| <1 0 1>‖[1 0 0] | 0° | 10° | 0.001 | 0.001 |

Silicon

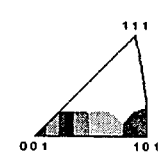

FIG. 31A
VIEWING PLANE A

FIG. 31B
VIEWING PLANE B

FIG. 31C
VIEWING PLANE C

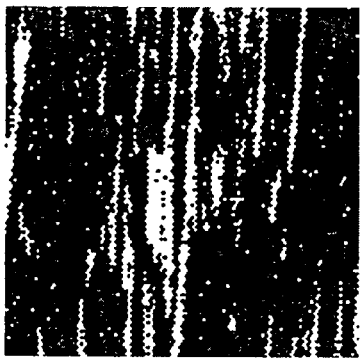
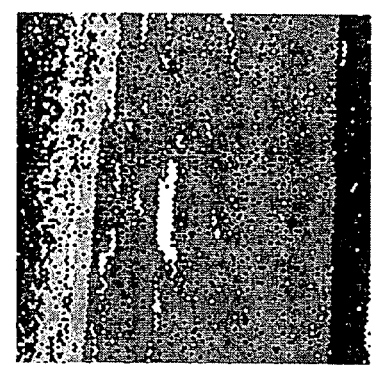

FIG. 31D
VIEWING PLANE A

FIG. 31E
VIEWING PLANE B

FIG. 31F
VIEWING PLANE C

Color Coded Map Type: Crystal Direction

| Direction | Min | Max | Total Fraction | Partition Fraction |
|---|---|---|---|---|
| <0 0 1>\|\|[0 0 1] | 0° | 10° | 0.763 | 0.830 |

Silicon

Color Coded Map Type: Crystal Direction

| Direction | Min | Max | Total Fraction | Partition Fraction |
|---|---|---|---|---|
| <0 0 1>\|\|[0 1 0] | 0° | 10° | 0.095 | 0.104 |
| <3 0 1>\|\|[0 1 0] | 0° | 10° | 0.463 | 0.504 |
| <2 0 1>\|\|[0 1 0] | 0° | 10° | 0.106 | 0.115 |
| <1 0 1>\|\|[0 1 0] | 0° | 10° | 0.052 | 0.057 |

Silicon

Color Coded Map Type: Crystal Direction

| Direction | Min | Max | Total Fraction | Partition Fraction |
|---|---|---|---|---|
| <0 0 1>\|\|[1 0 0] | 0° | 10° | 0.102 | 0.111 |
| <3 0 1>\|\|[1 0 0] | 0° | 10° | 0.569 | 0.619 |
| <2 0 1>\|\|[1 0 0] | 0° | 10° | 0.104 | 0.113 |
| <1 0 1>\|\|[1 0 0] | 0° | 10° | 0.087 | 0.094 |

Silicon

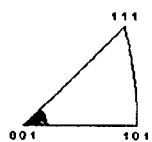
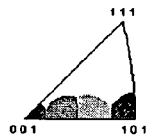
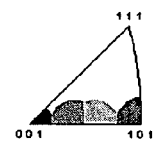

FIG. 32A
VIEWING PLANE A

FIG. 32B
VIEWING PLANE B

FIG. 32C
VIEWING PLANE C

FIG. 32D
VIEWING PLANE A

FIG. 32E
VIEWING PLANE B

FIG. 32F
VIEWING PLANE C

Color Coded Map Type: Crystal Direction

| Direction | Min | Max | Total Fraction | Partition Fraction |
|---|---|---|---|---|
| <0 0 1>‖[0 0 1] | 0° | 10° | 0.681 | 0.749 |

Silicon

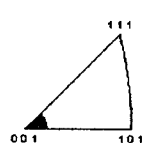

Color Coded Map Type: Crystal Direction

| Direction | Min | Max | Total Fraction | Partition Fraction |
|---|---|---|---|---|
| <0 0 1>‖[0 1 0] | 0° | 10° | 0.360 | 0.396 |
| <3 0 1>‖[0 1 0] | 0° | 10° | 0.202 | 0.222 |
| <2 0 1>‖[0 1 0] | 0° | 10° | 0.157 | 0.173 |
| <1 0 1>‖[0 1 0] | 0° | 10° | 0.005 | 0.006 |

Silicon

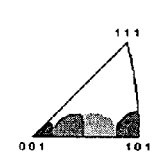

Color Coded Map Type: Crystal Direction

| Direction | Min | Max | Total Fraction | Partition Fraction |
|---|---|---|---|---|
| <0 0 1>‖[1 0 0] | 0° | 10° | 0.446 | 0.480 |
| <3 0 1>‖[1 0 0] | 0° | 10° | 0.180 | 0.199 |
| <2 0 1>‖[1 0 0] | 0° | 10° | 0.185 | 0.203 |
| <1 0 1>‖[1 0 0] | 0° | 10° | 0.003 | 0.003 |

Silicon

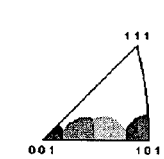

CRYSTALLINE SEMICONDUCTOR FILM, SEMICONDUCTOR DEVICE, AND METHOD FOR MANUFACTURING THEREOF

BACKGROUND OF THE INVENTION

1. Field of the Invention

The present invention relates to a semiconductor film having a crystal structure formed by using a technique of laser crystallization and a semiconductor device such as a thin film transistor (hereinafter, TFT) including the semiconductor film and methods for manufacturing thereof. More specifically, the present invention relates to a semiconductor film having a specific crystal structure formed by a technique of laser crystallization, in other words, a plane orientation of crystal grains of three directions that are perpendicular to each other is aligned at equal to or more than a certain ratio. The present invention also relates to a semiconductor device including the semiconductor film, and a method for manufacturing thereof.

2. Description of the Related Art

In recent years, the technique of crystallizing an amorphous semiconductor film formed over a glass substrate by laser irradiation to form a semiconductor film having a crystal structure (hereinafter referred to as a crystalline semiconductor film) has been widely researched, and numerous suggestions are given. Since that crystalline semiconductor film has higher mobility compared to an amorphous semiconductor film, this crystalline semiconductor film is utilized for manufacturing of TFTs for, for example, an active matrix type liquid crystal display device, an organic EL display device, and the like in which over a single glass substrate, TFTs are formed for a pixel portion or for the pixel portion and a driver circuit.

As the method of crystallization, except for the laser crystallization, there are a thermal annealing using a furnace and a rapid thermal annealing (RTA); however, when the laser crystallization is used, without much raise in temperature, heat is only absorbed by the semiconductor film and crystallization is performed; therefore, material such as glass, plastic, and the like that have low melting point can be used as the substrate. As a result, a glass substrate which is inexpensive and is easily processed to have large area can be used, and production efficiency can be drastically improved by the laser crystallization; therefore the laser crystallization is an excellent technique of crystallization.

This applicant focused attention on excellent characteristics of the crystallization, eagerly strived to manufacture a semiconductor film by laser crystallization, and consequently succeeded in the development of many techniques. Among the successful techniques, there is a technique of obtaining excellent semiconductor characteristics: a non-crystallized film which has reduced concentration of oxygen, nitrogen, and carbon is irradiated with a laser light, and melting and re-crystallization steps are performed to obtain a crystalline semiconductor film having high mobility (Patent Document 1). In the suggestion of this technique, it is disclosed that at laser irradiation, it is preferable for a protective film to be formed over the non-crystallized film, and it is also disclosed that by the placement of the protective film, impurity mixing into a silicon film can be evaded.

[Patent Document 1] Japanese Published Patent Application No. H5-299339

SUMMARY OF THE INVENTION

This applicant, without being content with the development of the crystallization technique, continued research and development in order to manufacture a crystalline semiconductor film with superior characteristics, ultimately, a single-crystal semiconductor film from a non-single crystal semiconductor film, and as a result, the inventor discovered that a crystalline semiconductor film having a specific crystal structure can be made from a non-single crystal semiconductor film, and it became clear that the semiconductor film has a structure in which the plane orientation of crystal grains of three directions that are perpendicular to each other is aligned at equal to or more than a certain ratio.

As set forth, this inventor succeeded in the development of a crystalline semiconductor film having a specific crystal structure and a method for manufacturing thereof. In addition, the inventor, with the use of the crystalline semiconductor film and the method for manufacturing thereof, also succeeded in the development of a semiconductor device including the crystalline semiconductor film and a manufacturing method thereof. Therefore, a problem to be solved by the present invention, in other words, a purpose of the present invention is to provide a semiconductor film having a specific crystal structure close to a single crystal structure and a manufacturing method thereof, and a semiconductor device having excellent electrical characteristics and reduced variation in electrical characteristics among semiconductor elements in a similar manner to using a single crystalline semiconductor substrate and a method for manufacturing thereof.

The present invention is as aforementioned, to provide a crystalline semiconductor film, a semiconductor device, and a method for manufacturing thereof, and the crystalline semiconductor film and the semiconductor device each have two modes. A first mode of the crystalline semiconductor film is a semiconductor film structured with plural crystal grains over a substrate. In a first surface of the semiconductor film, as to a plane orientation of crystal grains, an orientation of <001> within a range of ±10° of angle fluctuation is equal to or more than 60% and less than 100%. In a second surface of the semiconductor film, as to a plane orientation of crystal grains, an orientation of any one of <001>, <101>, <201>, <301>, <401>, <501>, or <601> within a range of ±10° of angle fluctuation is equal to or more than 60% and less than 100%. In a third surface of the semiconductor film, as to a plane orientation of crystal grains, an orientation of any one of <001>, <101>, <201>, <301>, <401>, <501>, or <601> within a range of ±10° of angle fluctuation is equal to or more than 60% and equal to or less than 100%. As to the first surface, a first direction is a direction perpendicular to the surface of the substrate, and the first surface is a surface to which the first direction serves as a normal vector. As to the second surface, a second direction is a direction parallel to the surface of the substrate, and the second surface is a surface to which the second direction serves as a normal vector. And as to the third surface, a third direction is a direction parallel to the surface of the substrate and is perpendicular to the direction of crystal growth of crystal grains, and the third surface is a surface to which the third direction serves as a normal vector.

A second mode of the crystalline semiconductor film is a semiconductor film structured with plural crystal grains over a substrate. In a first surface of the semiconductor film, as to a plane orientation of crystal grains, an orientation of <001> within a range of ±10° of angle fluctuation is equal to or more than 60% and less than 100%. In a second surface of the semiconductor film, as to a plane orientation of crystal grains, an orientation of <x01> (x=0, 1, 2, 3, 4, 5, 6) within a range of ±10° of angle fluctuation is equal to or more than 60% and less than 100%. In a third surface of the semiconductor film, as to a plane orientation of crystal grains, an orientation of <x01> (x=0, 1, 2, 3, 4, 5, 6) within a range of ±10° of angle fluctuation is equal to or more than 60% and equal to or less than 100%. As to the first surface of the semiconductor film, a first direction is a direction perpendicular to the surface of the substrate, and the first surface is a surface to which the first direction serves as a normal vector. As to the second surface, a second direction is a direction parallel to the surface of the substrate, and the second surface is a surface to which the second direction serves as a normal vector. And as to the third surface, a third direction is a direction parallel to the surface of the substrate and is perpendicular to the direction of crystal growth of crystal grains, and the third surface is a surface to which the third direction serves as a normal vector.

In addition, a first mode of the semiconductor device is a semiconductor device having a semiconductor element provided with a semiconductor film structured with plural crystal grains over a substrate. In a first surface of the semiconductor film, as to the plane orientation of crystal grains, an orientation of <001> within a range of ±10° of angle fluctuation is equal to or more than 60% and less than 100%. In a second surface of the semiconductor film, as to the plane orientation of crystal grains, an orientation of any one of <001>, <101>, <201>, <301>, <401>, <501>, or <601> within a range of ±10° of angle fluctuation is equal to or more than 60% and less than 100%. In a third surface of the semiconductor film, as to the plane orientation of crystal grains, an orientation of any one of <001>, <101>, <201>, <301>, <401>, <501>, or <601> within a range of ±10° of angle fluctuation is equal to or more than 60% and less than 100%. As to the first surface of the semiconductor film, a first direction is a direction perpendicular to the surface of the substrate, and the first surface is a surface to which the first direction is serves as a normal vector. As to the second surface of the semiconductor film, a second direction is a direction parallel to the surface of the substrate, and the second surface is a surface to which the second direction serves as a normal vector. And as to the third surface of the semiconductor film, a third direction is a direction parallel to the surface of the substrate and is perpendicular to the direction of crystal growth of crystal grain, and the third surface is a surface to which the third direction serves as a normal vector.

In addition, a second mode of the semiconductor device is a semiconductor device having a semiconductor element provided with a semiconductor film structured with plural crystal grains over a substrate. In a first surface of the semiconductor film, as to the plane orientation of crystal grains, the orientation of <001> within the range of ±10° of angle fluctuation is equal to or more than 60% and less than 100%. In a second surface of the semiconductor film, as to the plane orientation of crystal grains, the direction of <x01> (x=0, 1, 2, 3, 4, 5, 6) within a range of ±10° of angle fluctuation is equal to or more than 60% and less than 100%. In a third surface of the semiconductor film, as to the plane orientation of crystal grains, the direction of <x01> (x=0, 1, 2, 3, 4, 5, 6) within the range of ±10° of angle fluctuation is equal to or more than 60% and less than 100%. As to the first surface of the semiconductor film, a first direction is a direction perpendicular to the surface of the substrate, and the first surface is a surface to which the first direction serves as a normal vector. As to the second surface of the semiconductor film, a second direction is a direction parallel to the surface of the substrate, and the second surface is a surface to which the second direction serves as a normal vector. And as to the third surface of the semiconductor film, a third direction is a direction parallel to the surface of the substrate and is perpendicular to the direction of crystal growth of crystal grains, and the third surface is a surface to which the third direction serves as a normal vector.

Moreover, with respect to the semiconductor film and the semiconductor device, in the first mode, the following are preferable respectively.

1) In the first surface of the semiconductor film, a plane orientation of crystal grains within a range of ±10° of angle fluctuation includes: a direction of <001> is equal to or more than 70% and less than 100%. In the second surface of the semiconductor film, the plane orientation of crystal grains within a range of ±10° of angle fluctuation includes: a direction of any one of <301>, <401>, <501>, or <601> is equal to or more than 70% and less than 100%. In the third surface of the semiconductor film, the plane orientation of crystal grains in a range of ±10° of angle fluctuation includes: a direction of any one of <301>, <401>, <501>, or <601> is equal to or more than 70% and less than 100%, 2) a size of crystal grain of the semiconductor film is: a width is equal to or more than 0.1 μm and equal to or less than 10 μm and a length is equal to or more than 5 μm and equal to or less than 50 μm, 3) the semiconductor is Si, $Si_{1-x}Ge_x$ (0<x<0.1), 4) the semiconductor element is a thin film transistor, a diode, a resistance element, capacitative element, a CCD, or a photoelectric conversion element (correspond to only semiconductor device).

In addition, with respect to the plane orientation of crystal grains in the present invention, the following is a description with examples. For example, with respect to a plane orientation <001>, [100], [010], and [001], and in addition, an equivalent orientation family such as plane orientations in which each 1 in the aforementioned plane orientations is −1 are collectively referred to as <001>. In addition, with respect to a plane orientation <301>, [310], [301], [130], [103], [013], and [031], and an equivalent orientation family such as plane orientations in which any one or both of each 1 and 3 in each the aforementioned plane orientations are negative are collectively referred to as <301>.

In addition, signification of plane orientation <x01> (x=0, 1, 2, 3, 4, 5, 6) is described below. Aforementioned <x01> is a summation of orientation ratios of plane orientations <001>, <601>, <501>, <401>, <301>, <201>, and <101>. In addition, in that case, when plane orientations of <001> to <601> are simply totaled, a portion of each plane orientation has a part that overlaps; therefore, a result of overlapping portion of each plane orientation <001> to <601> calculated as either one orientation ratio of plane orientation is referred to as plane orientation <x01>.

Note that the range of an angle fluctuation of ±10° shows that a deviation from a certain plane orientation is within the range of −10 to ±10°, which means that the angle fluctuation of a certain plane orientation is allowed within the range of ±10°. For example, the plane orientation <001> of a crystal grain within the range of an angle fluctuation of +10' includes a crystal grain, which is deviated from the plane orientation <001> by −10° to a crystal grain, which is deviated from the plane orientation <001> by +100.

In addition, a method for manufacturing a crystalline semiconductor film includes: forming an insulating film over a substrate; forming an amorphous semiconductor film over the insulating film, forming, over the amorphous semiconductor film a silicon nitride film in which a film thickness is 200 nm to 1000 nm, equal to or less than 10 atomic % of oxygen is included, and a relative proportion of nitrogen in silicon is equal to or more than 1.3 and equal to or less than 1.5; and irradiating the amorphous semiconductor film with a laser light transmitting the silicon nitride film which is a continuous-wave laser light or a laser light with repetition rate of equal to or more than the wave length of 10 MHz to melt and later crystallize the amorphous semiconductor film.

In addition, a method for manufacturing a semiconductor device includes: forming an insulating film over a substrate; forming an amorphous semiconductor film over the insulating film; forming, over the amorphous semiconductor film, a silicon nitride film in which a film thickness is equal to or more than 200 nm and equal to or less than 1000 nm, and equal to or less than 10 atomic % of oxygen is included, and a relative proportion of nitrogen in silicon is equal to or more than 1.3 and equal to or less than 1.5; irradiating the amorphous semiconductor film with a laser light transmitting the silicon nitride film which is a continuous-wave laser light or a laser light with repetition rate of equal to or more than 10 MHz to melt and later crystallize the amorphous semiconductor film to form a crystalline semiconductor film, and forming a semiconductor element using the crystalline semiconductor film.

In addition, in the method for manufacturing thereof, the following is preferable.

1) The silicon nitride including oxygen is formed by plasma CVD in an atmosphere including $SiH_4$, $NH_3$, and $N_2O$, or an atmosphere including $SiH_4$ and $NH_3$, 2) the amorphous semiconductor film has a film thickness of equal to or more than 20 nm and equal to or less than 80 nm, 3) the continuous-wave laser light or the laser light with repetition rate of equal to or more than 10 MHz has a wavelength which is absorbed by the amorphous semiconductor film.

A crystalline semiconductor film of the present invention includes: a specific crystal structure, in other words, plane orientations of crystal grains in three surfaces that are perpendicular to each other are aligned at a certain ratio; therefore, an excellent semiconductor characteristic can be expressed. Specifically, according to the first mode, in the first surface of the semiconductor film, in a plane orientation of crystal grains within a range of ±10° of angle fluctuation, in a direction of <001> is equal to or more than 60% and less than 100%, preferably equal to or more than 70% and less than 100%, in the second surface of the semiconductor film, in a plane orientation of crystal in a range of ±10° of angle fluctuation, in any direction of <301><401>, <501>, or <601> is equal to or more than 60% and less than 100%, preferably equal to or more than 70% and less than 100%, in the third surface of the semiconductor film, in a plane orientation of crystal within a range of ±10° of angle fluctuation, in any direction of <301> <401>, <501>, or <601> is equal to or more than 60% and less than 100%, preferably equal to or more than 70% and less than 100%, the first surface of the semiconductor film includes: a first direction is a direction perpendicular to the surface of the substrate and, the first surface is a surface to which the first direction serves as a normal vector, the second surface of the semiconductor film includes: a second direction is a direction parallel to the surface of the substrate and is parallel to the direction of crystal growth of crystal grains, and the second surface is a surface to which the second direction serves as a normal vector, and the third surface of the semiconductor film includes: a third direction is a direction parallel to the surface of the substrate and is perpendicular to the direction of crystal growth of crystal grains, and the third surface is a surface to which the third direction serves as a normal vector.

In other words, the crystalline semiconductor film of the present invention has the aforementioned crystal structure, and the invention can provide a semiconductor device such as a thin film transistor (hereinafter referred to as TFT) in which a variation of electrical characteristics is reduced among adjacent semiconductor elements due to the semiconductor film, and a method for manufacturing thereof. In addition, in that case, a silicon nitride film with optimized thickness and composition ratios is formed over the amorphous semiconductor film. The amorphous semiconductor film is irradiated with a laser light which is a continuous-wave laser light or a laser light with repetition rate of equal to or more than 10 MHz through the silicon nitride film to melt and later crystallize the amorphous semiconductor film. Thus a crystalline semiconductor film is formed in which plane orientation of crystal grains in three surfaces that are perpendicular to each other are aligned at equal to or more than a certain ratio. As a result, a semiconductor device having excellent characteristics in which electrical characteristic is excellent and a variation of electrical characteristics is reduced among adjacent semiconductor elements can be manufactured. In addition, a similar regard can also be applied to the second mode.

BRIEF DESCRIPTION OF DRAWINGS

FIG. 2 is a perspective view describing plane orientation of a crystalline semiconductor film of the present invention.

FIGS. 3A to 3D are cross-sectional diagrams describing a method for manufacturing a semiconductor device of the present invention.

FIGS. 4A to 4C are cross-sectional diagrams describing a method for manufacturing a semiconductor device of the present invention.

FIGS. 5A to 5C are cross-sectional diagrams describing a method for manufacturing a semiconductor device of the present invention.

FIGS. 19A to 19D are orientation map images of a crystalline silicon film of an embodiment obtained by EBSP measurement.

FIGS. 20A to 20D are inverse pole diagrams of a crystalline silicon film of an embodiment obtained by EBSP measurement.

FIGS. 22A to 22D are orientation map images of a crystalline silicon film of a comparative example obtained by EBSP measurement.

FIGS. 24A to 24C are diagrams showing orientation ratios of a crystalline silicon film of a comparative example obtained by an inverse pole diagram.

FIGS. 25A to 25H are diagrams showing orientation map images and orientation ratios of a crystalline silicon film of an embodiment obtained by EBSP measurement.

FIGS. 26A to 26H are diagrams showing orientation map images and orientation ratios of a crystalline silicon film of an embodiment obtained by EBSP measurement.

FIGS. 30A to 30F are diagrams showing orientation ratios of a crystalline silicon film of an embodiment obtained by EBSP measurement.

FIGS. 31A to 31F are diagrams showing orientation map images and orientation ratios of a crystalline silicon film of an embodiment obtained by EBSP measurement.

FIGS. 32A to 32F are diagrams showing orientation map images and orientation ratios of a crystalline silicon film of an embodiment obtained by EBSP measurement.

DETAILED DESCRIPTION OF THE INVENTION

Described briefly below with reference to figures are embodiment modes and embodiments including the best mode for carrying out the invention; however, the present invention is not limited in any ways by the embodiment modes and embodiments, and is needless to say specified by the scope of claim.

Embodiment Mode 1

In Embodiment Mode 1, first, an abstract of a manufacturing process of a crystalline semiconductor film of the present invention is described using FIGS. 1A to 1C and FIG. 18, and subsequently, a basic matter regarding a crystal structure, a crystal structure of a semiconductor film of the present invention is specifically described with reference to FIG. 2, FIGS. 19A to 19D, and FIGS. 20A to 20D and FIGS. 21A to 21C. However, the present invention can be implemented in many different modes, and it is easily understood by those skilled in the art that modes and details herein disclosed can be modified in various ways without departing from the spirit and the scope of the present invention. Therefore, the present invention should not be interpreted as being limited to the description of the embodiment modes and embodiments to be given below.

Figure 1A:
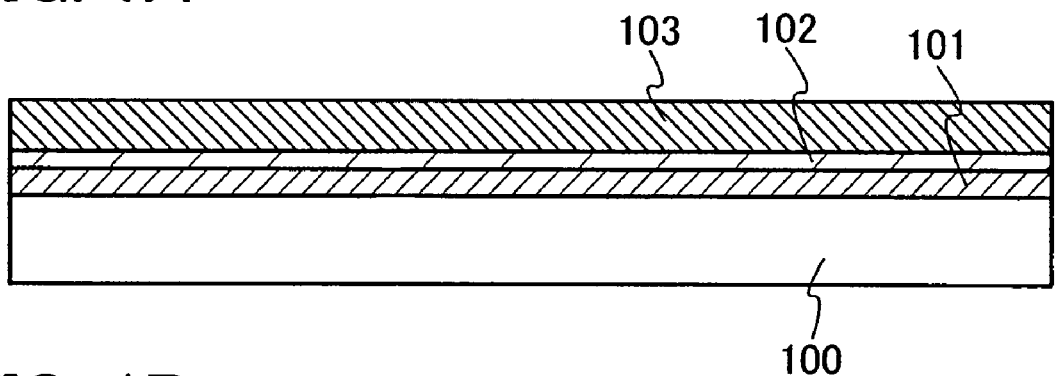
FIGS. 1A to 1C are cross-sectional diagrams describing a method for manufacturing a crystalline semiconductor film of the present invention.

First, as shown in FIG. 1A, a silicon oxide film containing nitrogen having a thickness of 50 to 150 nm is formed as an insulating film 101 which functions as a base film on one surface of a glass substrate having a thickness of 0.7 mm, for example, as a substrate 100 having an insulating surface. Further, an amorphous semiconductor film is formed by a plasma CVD, as a semiconductor film 102, over the insulating film 101 to have a thickness of greater than or equal to 20 nm and less than or equal to 100 nm, preferably, 20 nm to 80 nm.

In addition, the insulating film 101 may be provided if needed, and when the substrate 100 is made of glass, the insulating film 101 prevents impurity from diffusing to the semiconductor film 102; however, when quartz is used as the substrate 100, the insulating film 101 which functions as the base film is not needed to be provided. Moreover, a peeling film may be provided between the insulating film 101 and the substrate 100 to peel a semiconductor element from the substrate 100 after the process.

With respect to the semiconductor film 102, in this embodiment mode, amorphous silicon is used; however, polycrystalline silicon may be used, and silicon germanium ($Si_{1-x}Ge_x$ ($0<x<0.1$)) and the like may be used, and silicon carbide (SiC) in which a single crystal has a diamond structure can also be used.

Moreover, after the semiconductor film 102 is formed, the semiconductor film 102 may be heated in an electrical furnace at 500° C. for 1 hour, and in this heat treatment the amorphous silicon film is dehydrogenated. In addition, the reason of dehydrogenation is to prevent hydrogen gas from spouting out from the semiconductor film 102 when irradiation is performed with a laser beam, and this heat treatment may be omitted if hydrogen included in the semiconductor film 102 is little. In this embodiment mode, an example of using the amorphous silicon film as the semiconductor film 102 is shown; however, a polycrystalline silicon film may also be used. For example, after forming an amorphous silicon film, a polycrystalline silicon film can be formed by adding a minute amount of an element such as nickel, palladium, germanium, iron, palladium, tin, lead, cobalt, platinum, copper, or gold to the amorphous silicon film, and then performing heat treatment at 550° C. for 4 hours.

Subsequently, a silicon nitride film which has a thickness of 200 nm to 1000 nm, includes equal to or less than 10 atomic % of oxygen, and has equal to or more than 1.3 and equal to or less than 1.5 of relative proportion of nitrogen to silicon is formed over the semiconductor film 102 as a cap film 103. It is particularly to be noted that if the cap film 103 is too thin, it will become difficult to control plane orientation of a crystalline semiconductor film that is later formed; therefore, the cap film 103 is preferably formed with a thickness of equal to or more than 200 nm and equal to or less than 1000 nm.

As this cap film 103, in this embodiment mode, a silicon nitride film including oxygen with a thickness of 300 nm is formed by plasma CVD with monosilane ($SiH_4$), ammonium ($NH_3$), and nitrous oxide ($N_2O$) as gas material. Note that nitrous oxide ($N_2O$) is used as oxidizer, and instead of nitrous oxide, oxygen which has an oxidizing effect may be used.

As the cap film 103, a film having enough transmittance with respect to a wavelength of the laser beam, and having a thermal value such as a thermal expansion coefficient and a value such as ductility close to those of an adjacent semiconductor film is preferably used. Further, the cap film 103 is preferably a solid and dense film similarly to a gate insulating film of a thin film transistor to be formed later. Such a solid and dense film can be formed by reducing a deposition rate, for example. Note that when much hydrogen is included in the cap film, in a similar manner to the semiconductor film 102, heat treatment is performed for dehydrogenation.

Figure 18:
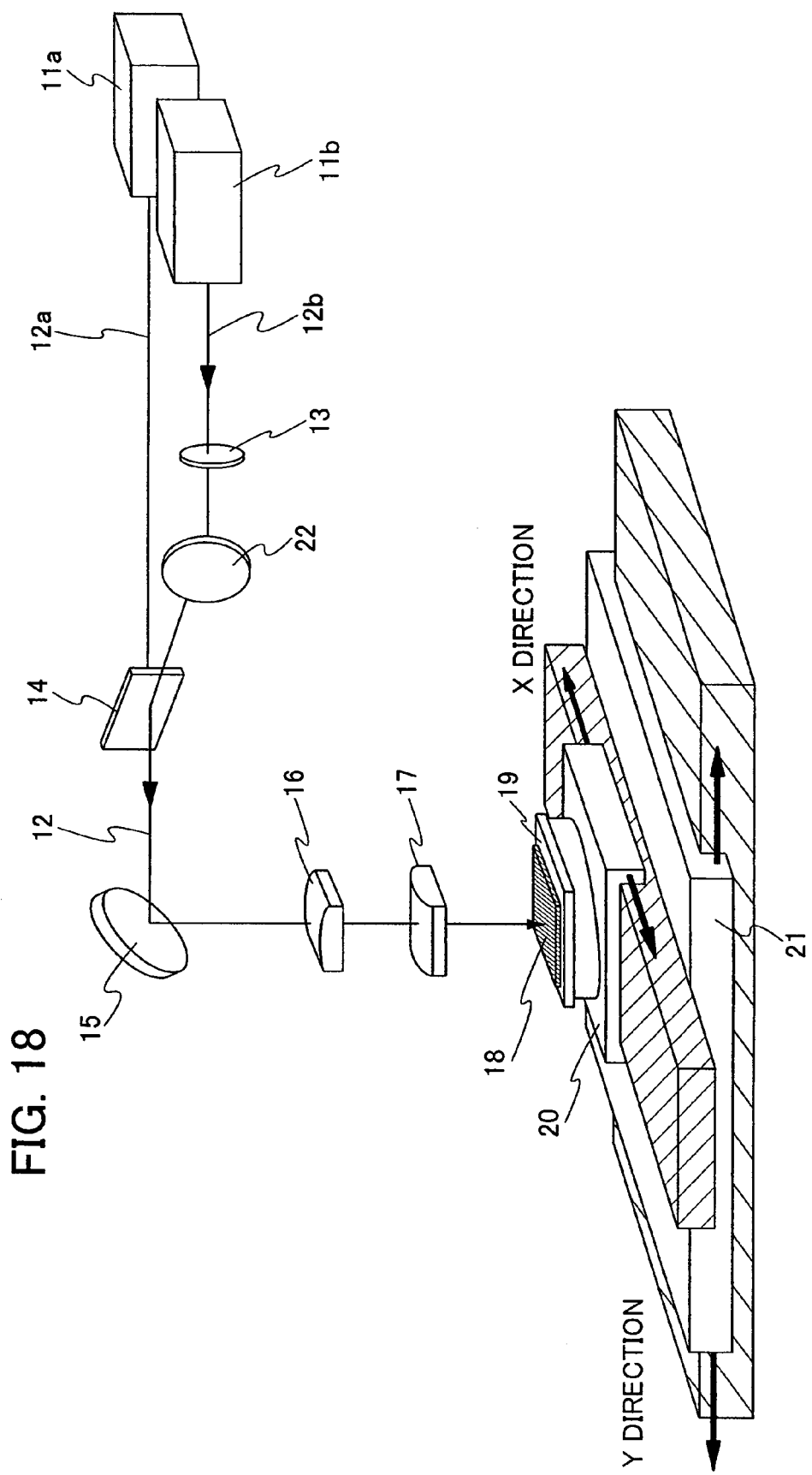
FIG. 18 is a diagram describing a brief overview of an applicable laser irradiation apparatus of the present invention.

Next, a laser oscillator and an optical system for forming a beam spot, which are used for the crystallization by irradiating the amorphous semiconductor film with a laser, will be explained. As shown in FIG. 18, as each of laser oscillators 11*a* and 11*b*, a laser oscillator emitting a wavelength that is absorbed in the semiconductor film 102 for several tens % or more is used. Typically, a second harmonic or a third harmonic can be used. Here, a CW laser with LD (Laser Diode) excitation (YVO$_4$, a second harmonic (a wavelength of 532 nm)), maximum output of which is 20 W, is prepared. It is not necessary to particularly limit the wavelength of the laser to a second harmonic; however, the second harmonic is superior to a further higher order harmonic in terms of energy efficiency.

Laser power used in this invention is within the range which can melt the semiconductor film completely and is within the range which can form a crystalline semiconductor film having aligned plane orientation of crystal grains. When laser power that is lower than this range is used, a semiconductor film can not be completely melted, and a crystalline semiconductor film in which crystal grains are small and plane orientation of crystal grains is not aligned in one direction is formed. Therefore, the two laser oscillators are prepared in the case of FIG. 18; however, one laser oscillator may be prepared as long as the output is enough. When a laser power higher than this range is used, many crystal nucleation is caused in the semiconductor film, and from the crystal nucleus, disorderly crystal growth is generated, thus a crystalline semiconductor film with uneven position, size, and plane orientation of crystal grain is formed.

When the semiconductor film 102 is irradiated with the CW laser, energy is continuously provided to the semiconductor film 102; therefore, when the semiconductor film is once brought to a melted state, the melted state can be continued. Further, a solid-liquid interface of the semiconductor film can be moved by scanning the CW laser beam; therefore, a crystal grain which is long in one direction along this movement direction can be formed. In addition, a solid laser is used because, as compared with a gas laser or the like, output has high stability and stable process is expected. Note that, without limitation to the CW laser, it is possible to use a pulse laser having a repetition rate of equal to or more than 10 MHz.

When a pulse laser having a high repetition rate is used, the semiconductor film can be always kept melting in the direction of film thickness, as long as a pulse interval of the laser is shorter than a time between melt and solidification of the semiconductor film. Thus, a semiconductor film composed of the crystal grain which is laterally grown and long in one direction by the movement of the solid-liquid interface can be formed.

In this embodiment mode, a YVO$_4$ laser is used for the laser oscillators 11*a* and 11*b*; however, other CW laser and pulse laser having a repetition rate of greater than or equal to 10 MHz can also be used. For example, as a gas laser, there is an Ar laser, a Kr laser, a CO$_2$ laser, or the like. As a solid-sate laser, there is a YAG laser, a YLF laser, a YAlO$_3$ laser, a GdVO$_4$ laser, a KGW laser, a KYW laser, an alexandrite laser, a Ti: sapphire laser, a Y$_2$O$_3$ laser, a YVO$_4$ laser, or the like. Moreover, there is a ceramic laser such as a YAG laser, a Y$_2$O$_3$ laser, a GdVO$_4$ laser, or YVO$_4$ laser. As a metal vapor laser, there is a helium cadmium laser or the like.

In addition, in the laser oscillator 11*a* and the laser oscillator 11*b*, energy uniformity of a linear beam spot that is obtained on the surface to be irradiated can be increased, when the laser beam is emitted with oscillation of TEM$_{00}$ (a single transverse mode), which is preferable.

The brief description of optical treatment of laser emitted from these laser oscillators is as follows. Laser beams 12*a* and 12*b* are each emitted with the same energy from the laser oscillators 11*a* and 11*b*. A polarization direction of the laser beam 12*b* emitted from the laser oscillator 11*b* is changed through a wavelength plate 13. The polarization direction of the laser beam 12*b* is changed because the two laser beams each having a polarization direction different from each other are synthesized by a polarizer 14.

After the laser beam 12*b* is passed through the wavelength plate 13, the laser beam 12*b* is reflected by a mirror 22 and made to enter the polarizer 14. Then, the laser beam 12*a* and the laser beam 12*b* are synthesized by the polarizer 14. The wavelength plate 13 and the polarizer 14 are adjusted so that light that has transmitted the wavelength plate 13 and the polarizer 14 has appropriate energy. Note that, in this embodiment mode, the polarizer 14 is used for synthesizing the laser beams; however, other optical element such as a polarization beam splitter may also be used.

A laser beam 12 that is synthesized by the polarizer 14 is reflected by a mirror 15, and a cross section of the laser beam is formed into a linear shape on the surface to be irradiated 18 by a cylindrical lens 16 having a focal length of 150 mm, and a cylindrical lens 17 having a focal length of 20 mm, for example. The mirror 15 may be provided depending on an arrangement of an optical system of a laser irradiation apparatus.

The cylindrical lens 16 operates in a length direction of the beam spot that is formed on the surface to be irradiated 18, whereas the cylindrical lens 17 operates in a width direction thereof. Accordingly, on the surface to be irradiated 18, a linear beam spot having a length of approximately 500 μm and a width of approximately 20 μm, for example, is formed. Note that, in this embodiment mode, the cylindrical lenses are used to form the beam spot into a linear shape; however, the present invention is not limited thereto, and other optical element such as a spherical lens may also be used. Moreover, the focal lengths of the cylindrical lenses are not limited to the above values and can be arbitrarily set.

Further, in this embodiment mode, the laser beam is shaped using the cylindrical lenses 16 and 17; however, an optical system for extending the laser beam to a linear shape and an optical system for converging thin on the surface to be irradiated may be additionally provided. For example, in order to obtain the linear cross section of the laser beam, a cylindrical lens array, a diffractive optical element, an optical waveguide, or the like can be used. In addition, with the use of a rectangular-shape laser medium, the linear cross section of the laser beam can also be obtained at an emission stage.

The ceramic laser can form a shape of laser medium relatively freely; therefore, the ceramic laser is appropriate for manufacturing such a laser beam. Note that the cross-sectional shape of the laser beam which is formed in a linear shape is preferably as narrow as possible in the width, which increases an energy density of the laser beam in the semiconductor film; therefore, a process time can be shortened.

Then, an irradiation of the laser beam will be explained. Since the surface to be irradiated 18, where the semiconductor film 102 covered by a cap film 103 is formed, is operated with a relatively high speed, the surface to be irradiated 18 is fixed to suction stage 19. The suction stage 19 can operates in X and Y directions on a plane parallel to the surface to be irradiated 18 by an X-axis uniaxial robot 20 and a Y-axis uniaxial robot 21. The uniaxial robots are disposed so that the length direction of the linear beam spot corresponds to the Y axis.

Next, the surface to be irradiated 18 is made to operate along the width direction of the beam spot, that is, the X axis, and the surface to be irradiated 18 is irradiated with the laser beam. Here, a scanning speed of the X-axis uniaxial robot 20 is 35 cm/sec, and the laser beam having an energy of 7.0 W is emitted from each of the two laser oscillators. The laser output after synthesizing the laser beams is to be 14 W. A region completely melted is formed in the semiconductor film by being irradiated with the laser beam. A crystal is grown in one plane orientation during a solidifying process; thus, a crystalline semiconductor film of the present invention can be obtained.

Note that energy distribution of the laser beams emitted from the laser oscillators in a $TEM_{00}$ mode is generally a Gaussian distribution. Note that a width of the region where crystal grains with plane orientation at three surfaces that are perpendicular to each other are formed can be changed by the optical system used for the laser beam irradiation. For example, intensity of the laser beam can be homogenized by using a lens array such as a cylindrical lens array or a fly eye lens; a diffractive optical element; an optical waveguide; or the like.

By irradiating the semiconductor film 102 with the laser beam, intensity of which is homogenized, almost all of the regions irradiated with the laser beam can be formed with crystal grains in which plane orientation is controlled at three surfaces that are perpendicular to each other. A scanning speed of the X-axis uniaxial robot 20 is appropriate when it is to be approximately several to several hundred cm/sec, and the speed may be appropriately decided by an operator in accordance with the output of the laser oscillators.

Note that, in this embodiment mode, a mode of moving the semiconductor film 102, which is the surface to be irradiated 18, by using the X-axis uniaxial robot 20 and the Y-axis uniaxial robot 21 is used. Without limitation thereto, the laser beam can be scanned by using a method for moving an irradiation system in which the surface to be irradiated 18 is fixed while an irradiation position of the laser beam is moved; a method for moving a surface to be irradiated in which the irradiation position of the laser beam is fixed while the surface to be irradiated 18 is moved; or a method in which these two methods are combined.

Note that, as described above, the energy distribution of the beam spot, which is formed by the above optical system, is a Gaussian distribution in a major axis direction; therefore, a small grain crystal is formed in a place having a low energy density at the both ends. Thus, part of the laser beam may be cut by providing a slit or the like in front of the surface to be irradiated 18 so that the surface to be irradiated 18 is irradiated only with energy enough to form crystal in which plane orientation is controlled at three surfaces that are perpendicular to each other. Alternatively, a metal film or the like that reflects the laser beam may be formed over the silicon nitride film containing oxygen, which is the cap film 103, and a pattern may be formed so that the laser beam reaches only a place of the semiconductor film where crystal in which plane orientation is controlled at three surfaces that are perpendicular to each other is desired to be obtained may be formed.

Moreover, in order to efficiently use the laser beams emitted from the laser oscillator 11a and the laser oscillator 11b, the energy of the beam spot may be uniformly distributed in a length direction by using a beam homogenizer such as a lens array or a diffractive optical element. Further, the Y-axis uniaxial robot 21 is moved by a width of the crystalline semiconductor film that is formed, and the X-axis uniaxial robot 20 is rescanned with a scanning speed at 35 cm/sec. By repeating a series of such operations, the entire surface of the semiconductor film can be efficiently crystallized.

Thereafter, the cap film is removed by performing etching. Further, a resist is applied over the crystalline semiconductor film, light-exposed, and developed, thereby forming a resist into a desired shape. Furthermore, etching is performed using the resist formed here as a mask, and the crystalline semiconductor film, which is exposed by developing, is removed. Through this process, an island-shaped semiconductor film is formed. And, by using this island shape semiconductor film, a semiconductor device having a semiconductor element such as a thin film transistor, a diode, a resistance element, a capacitance element, and a CCD can be manufactured.

Subsequently, plane orientation of the crystalline semiconductor film manufactured by this embodiment mode is described. In this embodiment mode, in order to confirm the position, the size, and the plane orientation of crystal grains of the crystalline semiconductor film from which the cap film has been removed by etching, EBSP (Electron Back Scatter Diffraction Pattern) measurement is carried out. First, a basic matter of EBSP is explained, and a result is described while complementary explanation is being added.

EBSP refers to a method by which an EBSP detector is connected to a scanning electron microscope (SEM), a direction of a diffraction image (an EBSP image) of individual crystal, which is generated when a sample highly tilted in the scanning electron microscope is irradiated with a convergent electron beam, is analyzed, and the plane orientation of crystal grains of a sample is measured from direction data and position information of a measurement point (x, y).

When an electron beam is made to enter a crystalline semiconductor film, inelastic scatterings also occur at the back, and a linear pattern, which is peculiar to crystal plane orientation by Bragg diffraction, can also be observed in the sample. Here, this linear pattern has generally been referred to as a Kikuchi line. An EBSP obtains crystal plane orientation of a sample by analyzing a Kikuchi line reflected in a detector.

In a sample having a polycrystalline structure, each crystal grain has different plane orientation. Thus, every time the irradiation position of the crystalline semiconductor film is moved, the sample is irradiated with the electron beam and the crystal plane orientation in each irradiation position is analyzed. In such a manner, the crystal plane orientation or orientation information of a crystalline semiconductor film having a flat surface can be obtained. As a measurement region is broader, the tendency of the crystal plane orientation of the entire crystalline semiconductor film can be obtained more; and as there are more measurement points, the more information on the crystal plane orientation in the measurement region can be obtained in detail.

However, the plane orientation within the crystal grains cannot be decided only with the plane orientation from observation on one surface of the crystal grain. This is because, even when a plane orientation is aligned in one direction only in one viewing plane, it cannot be said that the plane orientation is aligned within the crystal grains, if the plane orientation is not aligned in other viewing planes. In order to decide the plane orientation within a crystal grain, the plane orientations from at least two surfaces are needed, and the more information is obtained from many planes, the precision becomes higher.

Therefore, when plane orientation distributions of all three surfaces are almost uniform within the measurement region, a crystal thereof can be regarded as, approximately, a single crystal. Actually, as shown in FIG. 2, the plane orientation within a crystal can be specified with high precision by putting together pieces of information on three surfaces (a viewing plane A, a viewing plane B, and a viewing plane C) where three vectors perpendicular to each other (a vector a, a vector b, and a vector c) are each to be a normal vector.

In a crystalline semiconductor film which is formed in this embodiment, the vectors a to c are set as described below. The vector c is parallel to a scanning direction of the laser beam (i.e., a direction of crystal growth of crystal grain) and the surface of the substrate, the vector a is perpendicular to the surface of the substrate and the vector c, and the vector b is parallel to the surface of the substrate, perpendicular to a direction of crystal growth of crystal grain, and perpendicular to each of the vector a and vector c. According to the information from these three viewing planes A to C, plane orientation of the crystalline film can be specified with high precision.

First, FIG. 19A to FIG. 21C each show a result of analyzing the plane orientation (a crystal axis orientation in a direction perpendicular to a viewing plane) of a crystalline semiconductor film. The electron beam was entered the crystalline semiconductor film formed in this embodiment mode with an incidence angle of 60° with respect to the surface of the crystalline semiconductor film, and a crystal plane orientation was measured from the obtained EBSP image. The measurement region is 50 μm×50 μm. In this region, the measurement was carried out on lattice points each having 0.1 μm in length and width. Since the sample surface is a surface to be measured by an EBSP, the crystalline semiconductor film is necessary to be a top layer. Therefore, the measurement was carried out after etching the silicon nitride film containing oxygen which is the cap film.

FIG. 19A shows a plane orientation distribution in the viewing plane A where the vector a serves as a normal vector, as well, FIG. 19B shows a plane orientation distribution in the viewing plane B where the vector b serves as a normal vector, and FIG. 19C shows a plane orientation distribution in the viewing plane C where the vector c serves as a normal vector. FIGS. 19A to 19C are each an orientation map image which shows that which plane orientation is indicated by each measurement point. FIG. 19D is a diagram in which each plane orientation is color coded to be expressed, and plane orientation of measurement points of FIGS. 19A to 19C are shown by the color corresponding to the plane orientation of FIG. 19D.

Note that since FIGS. 19A to 19C are monochrome and the image is only displayed by lightness, distinction is difficult; however, in color display, it is found that orientation is strongly obtained in an orientation of <001> in the viewing plane A, an orientation of <301> in the viewing plane B, and an orientation of <301> in the viewing plane C. In addition, since the plane orientation within individual crystal grain is uniform, pieces of information on a shape, a size, or the like of individual crystal grain can be roughly obtained based on the color and shape. Moreover, plane orientation <401>, <501>, and <601> are close to plane orientation <301>; therefore, the plane orientation <401>, <501>, and <601> are approximately the same as the plane orientation <301>.

Here, according to FIGS. 19A to 19C, it is found that the crystal grains of the crystalline semiconductor film formed in this embodiment mode is composed of a domain extended long in a column shape. According to FIGS. 19A to 19C, the length of a domain is equal to or more than 5 μm and equal to or less than 50 μm, and moreover a domain with a length of equal to or more than 50 μm was found. In addition, a region to be measured in FIGS. 19A to 19C is 50 μm×50 μm, and in a larger range, a domain of equal to or more than 5 μm to equal to or less than 100 μm is found.

In addition, according to FIGS. 19A to 19C, it is found that orientation is strongly obtained in the orientation of <001>, the orientation of <301>, and the orientation of <301> in the viewing planes A, B, and C, respectively. When it is found that orientation is strongly obtained in a specific index, an orientation degree can be grasped by obtaining a proportion of how much crystal grains are gathered in vicinity of the index.

FIGS. 20A to 20C are inverse pole figures expressing frequency of appearance at viewing planes A to C in FIGS. 19A to 19C, and FIG. 20D is a scale showing appearance frequency of plane orientation. Although FIGS. 20A to 20D are monochrome and the image is only displayed by lightness so that distinction is difficult, FIGS. 20A to 20D show that a region which is closer to black has a higher ratio of crystal having plane orientation. According to the inverse pole figure in FIG. 20A, it was confirmed that the viewing plane A, <001> is the closest to black, and specifically, orientation of <001> appears with a frequency of 14.0 times or more as often as a condition in which all directions appear with identical probability.

In addition, according to an inverse pole figure in FIG. 20B, it was confirmed that the orientation of <301> is the closest to black and specifically, the orientation of <301> appears with a frequency of equal to or more than 4.8 times as often as a condition in which all orientations of the viewing plane B appear with identical probability. Moreover, according to an inverse pole figure in FIG. 20C, it was confirmed that the orientation of <301> is the closest to black and specifically, the orientation of <301> appears with a frequency of equal to or more than 4.8 times as often as a condition in which all orientations of the viewing plane C appear with identical probability.

Figure 21A:
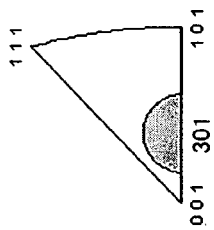
FIGS. 21A to 21C are diagrams showing orientation ratios of a crystalline silicon film of an embodiment obtained by an inverse pole diagram.
Figure 21B:
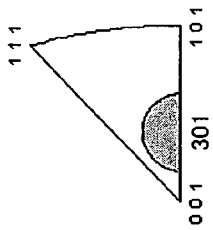
Figure 21C:
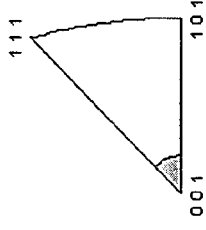

In the inverse pole figures of FIGS. 20A to 20C, orientation ratios of plane orientations with high frequency of appearance were calculated, and the results are shown in the FIGS. 21A to 21C. FIG. 21A shows a result of calculation to obtain orientation ratio at the viewing plane A, and in the inverse pole figure in FIG. 20A, the range of an angle fluctuation of the orientation of <001> is decided to be within ±10°, and a proportion of the number of the measurement points at which the angle fluctuation of the orientation of <001> with respect to all measurement points exist within ±10° is obtained; therefore, an orientation ratio can be obtained. Note that the colored region in FIG. 21A shows a region which is crystal with the range of an angle fluctuation within ±10°.

In addition, a value of Partition Fraction is the value which is the result of calculation to obtain a ratio of a point having a specific orientation among all measured points. And, the value of Total Fraction is a value which is the result of calculation to obtain orientation ratio of highly reliable measuring points among the points having a specific orientation in all measured points. According to this result, in the viewing plane A of the crystalline semiconductor film formed in Embodiment Mode 1, the orientation of <001> occupies 71.2% within the range of an angle fluctuation of ±10°. Note that as aforementioned, [100], [010], and [001], and in addition, an equivalent orientation family such as plane orientations in which 1 in each of the aforementioned plane orientations is −1 are collectively referred to as <001>.

FIGS. 21B and 21C are results of calculation to obtain orientation ratios at the viewing planes B and C according to FIGS. 20B and 20C in a similar manner to FIG. 21A. Note that the colored region in FIGS. 21B and 21C is a region showing crystal where the orientation of <301> is in the range of an angle fluctuation within ±10°, and in the viewing plane B of the crystalline semiconductor film formed in this embodiment mode, the orientation of <301> occupies 71.1% within the range of an angle fluctuation of ±10°.

In the viewing plane C of the crystalline semiconductor film formed in this embodiment, the orientation of <301> occupies 73.9% within the range of an angle fluctuation of ±10°. Note that [310], [301], [130], [103], [013], and [031], and an equivalent orientation family such as plane orientations in which any one or both of each 1 and 3 in each of the aforementioned plane orientations is a negative value are collectively referred to as <301>. In addition, in the viewing planes B and C, ratio of the orientation of <301> was shown; however, the ratio may be the ratio of the orientation <401>, <501>, or <601>.

As described through the above, the plane orientation of crystal grains is aligned in one direction with a high proportion in all of the three viewing planes. In other words, it is found that a crystal, where it can be regarded that the plane orientation of crystal grains is aligned in one direction, is formed in a crystallized region. In such a manner, it was confirmed that a crystal, of which specific plane orientation occupies an extremely high ratio, is formed over a glass substrate in a region having one side of several ten µm.

In addition, the crystalline semiconductor film manufactured in the present invention is poly-crystal. Thus, in each of the orientation ratio of plane orientation of the viewing planes A to C, if crystal defect such as crystal grain boundaries is included, the orientation ratio of plane orientation of each viewing plane is less than 100%. In addition, the measurement of EBSP can be conducted in, for example, at a channel region of a thin film transistor. That is to say the measurement is possible at a semiconductor layer which is covered by a gate wiring and a gate insulating film.

With the above result, when plane orientation of the crystalline semiconductor film manufactured by Embodiment Mode 1 is measured by EBSP, in the viewing plane A, as to the plane orientation of crystal grains, the orientation of <001> within the range of ±10° of angle fluctuation is equal to or more than 60% and less than 100%, preferably equal to or more than 70% and less than 100%. In addition, in the viewing plane B, as to the plane orientation of crystal grains, the orientation of <001> within the range of ±10° of angle fluctuation is equal to or more than 60% and less than 100%, preferably equal to or more than 70% and less than 100%, and in the viewing plane C, as to the plane orientation of crystal grains, the orientation of <001> with in the range of ±10° of angle fluctuation is equal to or more than 60% and less than 100%, preferably equal to or more than 70% and less than 100%.

As discussed above, in the crystalline semiconductor film formed in this embodiment, the plane orientation of a crystal grain is aligned in one direction or in a direction that can be substantially regarded as one direction. In other words, the crystalline semiconductor film has a property close to that of a single crystal. By using such a semiconductor film, performance of a semiconductor device can be considerably improved. For example, when TFT is formed using this crystalline semiconductor film, an equivalent electric field-effect mobility (mobility) to a semiconductor device using a single crystalline semiconductor can be obtained.

In addition, in that TFT, it is possible to reduce variation of an on current value (a value of drain current value that flows when a TFT is in an on state), an off current value (a drain current value that flows when a TFT is in an off state), a threshold voltage, an S value, and electric field-effect mobility. Since there is such an advantageous effect, an electrical characteristic of a TFT is improved, and an operational characteristic and reliability of a semiconductor device using a TFT is improved. Thus, a semiconductor device capable of high speed operation with high current driving capacity and small variation of characteristics between a plurality of elements can be manufactured.

Embodiment Mode 2

In this embodiment mode, liquid crystal display device which is one example of a semiconductor device is described with reference to FIG. 3A to FIG. 4C. As shown in FIG. 3A, in a similar manner to Embodiment Mode 1, an insulating film 101 which functions as a base film is formed over a substrate 100, an amorphous semiconductor film 102 is formed over the insulating film 101, and a cap film 103 is formed over the amorphous semiconductor film 102.

Here, as the substrate 100, a glass substrate is used. As the insulating film 101, a silicon nitride film including oxygen having a thickness of 40 to 60 nm and a silicon oxide film including nitrogen having a thickness of 80 to 120 nm are respectively formed by plasma CVD. In addition, an amorphous silicon film which has a thickness of 20 to 80 nm is formed as the amorphous silicon film 102 by plasma CVD. And, as the cap film 103, a silicon nitride film which has a thickness of equal to or more than 200 nm and equal to or less than 1000 nm and has equal to or less than 10 atomic % of oxygen, and has equal to or more than 1.3 to equal to or less than 1.5 of relative proportion of nitrogen to silicon is formed.

Subsequently, as shown in FIG. 3B, irradiation of a laser light 104 is performed from the cap film 103 to the amorphous silicon film 102. As a result, a crystalline semiconductor film 105 can be formed over the insulating film 101. In addition, as the laser light 104, a laser light which has energy which can melt the amorphous semiconductor film 102 and has a wave length that can be absorbed by the amorphous semiconductor film 102 is selected. In addition, a heat treatment to extract nitrogen which is included in the amorphous semiconductor film and the cap film may be performed.

Here, as the laser light 104, second harmonic of $YVO_4$ is used, and after that the cap film 103 is removed. As a method for removing the cap film 103, dry etching, wet etching, grinding and the like can be used. Here the cap film 103 is removed by dry etching.

Subsequently, as shown in FIG. 3C, the crystalline semiconductor film 105 is selectively etched to form semiconductor layers 201 to 203. As a method for etching the crystalline semiconductor film 105, dry etching, wet etching, and the like can be used. Here, after resist is applied over the crystalline semiconductor film 105, light-exposure and development are performed to form a resist mask. By the use of the resist mask which was formed, dry etching in which flow ratio of $SF_6:O_2$ is set to 4:15 is performed to selectively etch the crystalline semiconductor film 105, and after that the resist mask is removed.

Subsequently, as shown in FIG. 3D, a gate insulating film 204 is formed over the semiconductor layers 201 to 203, and the gate insulating film is formed with silicon nitride, silicon nitride including oxygen, silicon oxide, silicon oxide including nitrogen and the like of single layer or multi-layer structure. Here, silicon oxide including nitrogen with a thickness of 115 nm is formed by plasma CVD. After that, gate electrodes 205 to 208 can be formed with a metal or a polycrystalline semiconductor doped with an impurity having one conductivity type.

In the case of using a metal, tungsten (W), molybdenum (Mo), titanium (Ti), tantalum (Ta), aluminum (Al), or the like can be used. Moreover, metal nitride obtained by nitriding the above metal can also be used. Alternatively, a structure in which a first layer including the metal nitride and a second layer including the metal are stacked may be used. Also, a paste including particles can be formed over the gate insulating film by a droplet discharging, and the paste is dried and burned to be formed. Further, a paste including particles can be formed over the gate insulating film by printing, and the paste is dried and burned to be formed. Typical examples of the particles are: gold, copper, alloy of gold and silver, alloy of gold and copper, alloy of silver and copper, alloy of gold, silver, and copper or the like.

Here, after a tantalum nitride film with a thickness of 30 nm and a tungsten film with a thickness of 370 nm are formed over the gate insulating film 204 by sputtering, a resist mask formed by photolithography is used to etch the tantalum nitride film and the tungsten film selectively, and the gate electrodes 205 to 208 each having a shape that an end portion of the tantalum nitride film extends out farther to the outside than an end portion of the tungsten film are formed.

Subsequently, with the gate electrodes 205 to 208 as a mask, impurity which imparts an n-type and impurity which imparts a p-type are added to the semiconductor layers 201 to 203, and source regions and drain regions 209 to 214 and a high concentration impurity region 215 are formed. In addition, low concentration impurity regions 216 to 223 overlapping with a part of the gate electrodes 205 to 208 are formed. Moreover, channel regions 201c to 203c, and 203d overlapping with the gate electrodes 205 to 208 are formed.

Note that here the source regions and the drain regions 209, 210, 213, 214, the high concentration impurity region 215, and the low concentration impurity regions 216, 217, and 220 to 223 are doped with boron which imparts a p-type. In addition, source regions and drain regions 211, 212, and the low concentration impurity regions 218 and 219 are doped with phosphorus which imparts an n-type.

After this, in order to activate the impurity which is added to the semiconductor layer, a heat treatment is performed. Here, heating in nitrogen atmosphere at 550° C. for 4 hours is performed. With the above steps, thin film transistors 225 to 227 are formed. In addition, as the thin film transistors 225 and 227, p channel-type thin film transistors are formed, and as the thin film transistor 226, an n channel-type thin film transistor is formed. In doing so, a driver circuit is structured with the p channel-type thin film transistor 225 and the n channel-type thin film transistor 226, and the p channel-type thin film transistor 227 functions as an element applying voltage to a pixel electrode.

Subsequently, as shown in FIG. 4A, a first interlayer insulating film which insulates the gate electrodes and wiring of the thin film transistors 225 to 227 is formed. Here, as the first interlayer insulating film, a silicon oxide film 231, a silicon nitride film 232, and a silicon oxide film 233 are stacked to be formed. Subsequently, wirings 234 to 239 connecting to source and drain regions of the thin film transistors 225 and 227 and a connecting terminal 240 are formed over the silicon oxide film 233 which is a part of the first interlayer insulating film. Here, after a Ti film with a thickness of 100 nm, an Al film with a thickness of 700 nm, and Ti film with the thickness of 100 nm are consecutively formed, with the use of a resist mask formed by photolithography process, etching is selectively performed, and the wirings 234 to 239 and the connecting terminal 240 are formed. After that, the resist mask is removed.

Next, a second interlayer insulating film 241 is formed over the first interlayer insulating film, the wirings 234 to 239, and the connecting terminal 240. As the second interlayer insulating film 241, an inorganic insulating film such as a silicon oxide film, a silicon nitride film, or a silicon oxynitride film (a silicon oxide film containing nitrogen or a silicon nitride film containing oxygen) can be used, and these insulating films are formed with a single layer or two or more layers of a multiple-layer. In addition, as a method for forming the inorganic insulating film, sputtering, LPCVD, plasma CVD, and the like may be used.

Here, after plasma CVD is used to form a silicon nitride film containing oxygen with a thickness of 100 nm to 150 nm, the silicon nitride film containing oxygen is selectively etched with the use of a resist mask formed by photolithography process to form a contact hole reaching the wiring 239 of the thin film transistor 227 and the connecting terminal 240, and at the same time the second interlayer insulating film 241 is formed. And after that, the resist mask is removed. In a similar manner to this embodiment mode 2, by formation of the second interlayer insulating film 241, exposure of TFTs of a driver circuit portion, wiring and the like can be prevented, and the TFT can be protected from contaminating material.

Subsequently, a first pixel electrode 242 connecting to the wiring 239 of the thin film transistor 227 and a conductive layer 244 connecting to the connecting terminal 240 are formed, and when a liquid crystal display device is a light transmissive type liquid crystal display device, the first pixel electrode 242 is formed with a conductive film having a light-transmitting property. In addition, when a liquid crystal display device is a reflection type liquid crystal display device, the first pixel electrode 242 is formed with a conductive film having reflectivity. Here, the first pixel electrode 242 and the conductive layer 244 are formed in such a way that after ITO containing silicon oxide with a thickness of 125 nm is formed by sputtering, and etching is selectively performed with the use of a resist mask formed by photolithography.

Subsequently, an insulating film 243 which functions as an orientation film is formed, and the insulating film 243 is formed in such a way that a high molecular compound layer such as a layer of polyimide, a polyvinyl alcohol or the like is formed by roll coating, printing, and the like, and after that rubbing is performed. In addition, the insulating film 243 can be formed by deposition of $SiO_2$ from an oblique angle to a substrate, and the insulating film 243 can be formed by irradiation of polarized UV light to a photoreactive type high molecular compound and polymerization of the photoreactive type high molecular compound; however, here the insulating film 243 is formed by printing a high molecular compound layer such as a layer of a polyimide, a polyvinyl alcohol or the like, and baking, and rubbing the layer.

Subsequently, as shown in FIG. 4B, a second pixel electrode 253 is formed adjacent to an opposing substrate 251, and an insulating film 254 is formed on the second pixel electrode as an orientation film. Note that a colored layer 252 may be formed between the opposing substrate 251 and the pixel electrode 253. In this case, the opposing substrate may be formed by the same material of the substrate 100. In addition, the second pixel electrode 253 is formed in a similar manner to the first pixel electrode 242, and the insulating film 254 which functions as an orientation film can be formed in a similar manner to the insulating film 243. Moreover, the colored layer 252 is a layer which is necessary when color display is performed, and in RGB, a colored layer in which dye and pigment corresponding to each color of red, green, and blue are dispersed is formed corresponding to each pixel.

Subsequently, the substrate 100 and the opposing substrate 251 are attached together with a sealing material 257, and a liquid crystal layer 255 is formed between the substrate 100 and the opposing substrate 251. The liquid crystal layer 255 is formed in such a way that liquid crystal material is injected into a region surrounded by the insulating films 243 and 254 which function as orientation films and the sealing material 257 by vacuum injection using capillary tube phenomenon. Moreover, the sealing material 257 is formed at one surface of the opposing substrate 251, liquid crystal material is delivered by drops to a region surrounded by the sealing material, and after that the liquid crystal layer 255 can be formed by pressure bonding of the opposing substrate 251 and the substrate 100 under reduced pressure with the sealing material.

As the sealing material 257, a thermoset epoxy resin, a UV curable acrylic resin, thermoplastic nylon, polyester, and the like are formed by a dispenser, a printing, a thermocompression and the like. Note that by application of filler to the sealing material 257, a space between the substrate 100 and the opposing substrate 251 can be maintained. Here, as the sealing material 257, thermoset epoxy resin is used.

In addition, in order to maintain the space between the substrate 100 and the opposing substrate 251, a spacer 256 can be provided between the insulating films 243 and 254 which function as orientation films, and the spacer can be formed by application of organic resin, and by etching of the organic resin to be a desired shape typically a pillar or circular pillar shape. Moreover, as the spacer, a bead spacer may be used, and here as the spacer 256, a bead spacer is used. In addition, although not shown, a polarizing plate is provided to one or both of the substrate 100 and the opposing substrate 251.

Subsequently, as shown in FIG. 4C, at a terminal portion 263, a connecting terminal connected to a gate wiring and a source wiring of a thin film transistor is formed (in FIG. 4C, the connecting terminal 240 connected to a source wiring or a drain wiring is shown). A FPC (flexible printed circuit) 262 is connected through the conductive layer 244 and an anisotropic conductive layer 261 to the connecting terminal 240, and the connecting terminal 240 receives video signals and clock signals through the conductive layer 244 and the anisotropic conductive layer 261.

At a driver circuit portion 264, a circuit which drives a pixel such as a source driver, a gate driver, and the like is formed, and here the n channel-type thin film transistor 226 and the p channel-type thin film transistor 225 are placed. In addition, CMOS circuit is formed with the n channel-type thin film transistor 226 and the p channel-type thin film transistor 225.

In a pixel portion 265, a plurality of pixels is formed, and at each pixel, a liquid crystal element 258 is formed. This liquid crystal element 258 is a part where the first pixel electrode 242, the second pixel electrode 253, and the liquid crystal layer 255 which is filled between the first pixel electrode 242 and the second electrode 253 are overlapped. Moreover, the first pixel electrode 242 included in the liquid crystal element 258 is connected electrically to the thin film transistor 227.

With the above process, a liquid crystal display device can be manufactured, and in a liquid crystal display device shown in Embodiment Mode 2, plane orientation of crystal grains is aligned in a certain direction in a semiconductor layer formed at the driver circuit portion 264 and the pixel portion 265. Thus, a variation of electric characteristics of a plurality of thin film transistors can be suppressed, and as a result, a liquid crystal display device which is capable of high-resolution display with little partial discoloration and defect can be manufactured.

Embodiment Mode 3

Embodiment Mode 3 will explain a manufacturing process of a light-emitting device having a light-emitting element as an example of a semiconductor device. As shown in FIG. 5A, the thin film transistors 225 to 227 are formed over the substrate 100 with the insulating film 101 interposed therebetween by a similar process to that of Embodiment Mode 2. The first interlayer insulating film for insulating the gate electrodes and the wires of the thin film transistors 225 to 227 is formed by stacking the silicon oxide film 231, the silicon nitride film 232, and the silicon oxide film 233. Moreover, wires 308 to 313 which connect to the semiconductor layers of the thin film transistors 225 to 227, and a connection terminal 314 are formed over the silicon oxide film 233, which is a part of the first interlayer insulating film.

Next, a second interlayer insulating layer 315 is formed over the first interlayer insulating film, the wires 308 to 313, and the connection terminal 314, and then a first electrode layer 316 which connects to the wire 313 of the thin film transistor 227 and a conductive layer 320 which connects to the connection terminal 314 are formed. The first electrode layer 316 and the conductive layer 320 are formed in such a way that after ITO including silicon oxide is formed in 125 nm by a sputtering method, the ITO is selectively etched by using a resist mask formed by a photolithography process. As is described in this embodiment mode, the formation of the second interlayer insulating layer 315 can prevent exposure of TFTs, wires, and the like of a driver circuit portion and protect TFTs from a contaminant.

Next, an organic insulating layer 317 is formed to cover an end portion of the first electrode layer 316. Here, after applying and baking photosensitive polyimide, light-exposure and development are carried out, thereby forming the organic insulating layer 317 so that the driver circuit, the first electrode layer 316 in a pixel region, and the second interlayer insulating layer 315 in a periphery of the pixel region are exposed.

Next, a layer 318 containing a light-emitting substance is formed by an evaporation method over a part of the first electrode layer 316 and the organic insulating layer 317. The layer 318 containing a light-emitting substance is formed of an organic or inorganic compound having a light-emitting property. It is to be noted that the layer 318 containing a light-emitting substance may be formed of an organic compound having a light-emitting property and an inorganic compound having a light-emitting property. Moreover, a red-light-emitting pixel, a blue-light-emitting pixel, and a green-light-emitting pixel are formed by using a red-light-emitting substance, a blue-light-emitting substance, and a green-light-emitting substance respectively for the layer 318 containing a light-emitting substance.

Here, the layer containing a red-light-emitting substance is formed by stacking DNTPD of 50 nm thick, NPB of 10 nm thick, NPB of 30 nm thick to which bis[2,3-bis(4-fluorophenyl)quinoxalinato]iridium(acetylacetonate) (abbr.: Ir(Fdpq)$_2$(acac)) is added, Alq$_3$ of 60 nm thick, and LiF of 1 nm thick. The layer containing a green-light-emitting substance is formed by stacking DNTPD of 50 nm thick, NPB of 10 nm thick, Alq$_3$ of 40 nm thick to which coumarin 545T (C545T) is added, Alq$_3$ of 60 nm thick, and LiF of 1 nm thick.

The layer containing a blue-light-emitting substance is formed by stacking DNTPD of 50 nm thick, NPB of 10 nm thick, 9-[4-(N-carbazolyl)]phenyl-10-phenylanthracene (abbr.: CzPA) of 30 nm thick to which 2,5,8,11-tetra(tert-butyl)perylene (abbr.: TBP) is added, Alq$_3$ of 60 nm thick, and LiF of 1 nm thick. Moreover, a white-light-emitting pixel may be formed by forming the layer containing a light-emitting substance with a white light-emitting substance, in addition to the red-light-emitting pixel, the blue-light-emitting pixel, and the green-light-emitting pixel. By the provision of a white-light-emitting pixel, power consumption can be reduced.

Next, a second electrode layer 319 is formed over the layer 318 containing a light-emitting substance and the organic insulating layer 317. Here, an Al film is formed in 200 nm thick by an evaporation method. Accordingly, a light-emitting element 321 is formed by the first electrode layer 316, the layer 318 containing a light-emitting substance, and the second electrode 319.

Here, a structure, a material, a function, and the like of the light-emitting element 321 are described. When the layer 318 containing a light-emitting substance is formed by a layer which uses an organic compound and which has a light-emitting function (hereinafter, this layer is shown as a light-emitting layer 343), the light-emitting element 321 functions as an organic EL (Electro Luminescence) element. The structure, the material, the function, and the like of the light-emitting element 321 will hereinafter be described in detail with reference to the drawings.

As the organic compound with a light-emitting property, for example, the following are given: 9,10-di(2-naphthyl) anthracene (abbr.: DNA); 2-tert-butyl-9,10-di(2-naphthyl) anthracene (abbr.: t-BuDNA); 4,4'-bis(2,2-diphenylvinyl)biphenyl (abbr.: DPVBi); coumarin 30; coumarin 6; coumarin 545; coumarin 545T; perylene; rubrene; periflanthene; 2,5,8,11-tetra(tert-butyl)perylene (abbr.: TBP); 9,10-diphenylanthracene (abbr.: DPA); 5,12-diphenyltetracene; 4-(dicyanomethylene)-2-methyl-6-[p-(dimethylamino)styryl]-4H-pyran (abbr.: DCM1); 4-(dicyanomethylene)-2-methyl-6-[2-joulolidine-9-yl)ethenyl]-4H-pyran (abbr.: DCM2); 4-(dicyanomethylene)-2,6-bis[p-(dimethylamino)styryl]-4H-pyran (abbr.: BisDCM); and the like.

In addition, the following compound capable of emitting phosphorescent light can also be used: bis[2-(4',6'-difluorophenyl)pyridinato-N,$C^{2'}$](picolinato)iridium (abbr.: FIrpic); bis{2-[3',5'-bis(trifluoromethyl)phenyl]pyridinato-N,$C^{2'}$}(picolinato)iridium (abbr.: Ir($CF_3$ ppy)$_2$(pic)); tris(2-phenylpyridinato-N,$C^{2'}$)iridium (abbr.: Ir(Ppy)$_3$); (acetylacetonato)bis(2-phenylpyridinato-N,$C^{2'}$)iridium (abbr.: Ir(ppy)$_2$(acac)); (acetylacetonato)bis[2-(2'-thienyl)pyridinato-N,$C^{3'}$]iridium (abbr.: Ir(thp)$_2$(acac)); (acetylacetonato)bis(2-phenylquinolinato-N,$C^{2'}$)iridium (abbr.: Ir(pq)$_2$(acac)); (acetylacetonato)bis[2-(2'-benzothienyl)pyridinato-N,$C^{3'}$] iridium (abbr.: Ir(btp)$_2$(acac)); and the like.

Figure 6A:
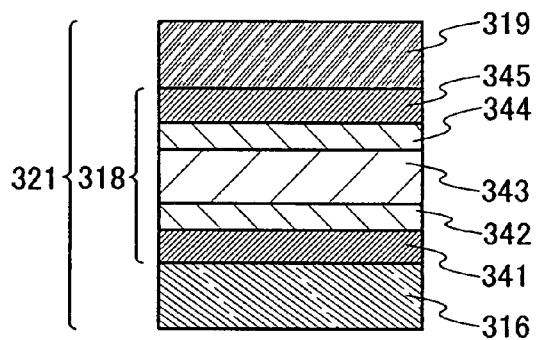
FIGS. 6A to 6E are cross-sectional diagrams describing the structures of applicable light-emitting element of the present invention.

As shown in FIG. 6A, the light-emitting element 321 shown in FIG. 5A may be formed by the layer 318 containing a light-emitting material and the second electrode layer 319 which are formed over the first electrode layer 316. The layer 318 containing a light-emitting material includes a hole-injecting layer 341 formed of a material with a hole-injecting property, a hole-transporting layer 342 formed of a material with a hole-transporting property, the light-emitting layer 343 formed of an organic compound with a light-emitting property, an electron-transporting layer 344 formed of a material with an electron-transporting property, and an electron-injecting layer 345 formed of a material with an electron-injecting property.

As the material with a hole-transporting property, the following are given: phthalocyanine (abbr.: $H_2Pc$); copper phthalocyanine (abbr: CuPc); vanadyl phthalocyanine (abbr.: VOPc); 4,4',4"-tris(N,N-diphenylamino)triphenylamine (abbr.: TDATA); 4,4',4"-tris[N-(3-methylphenyl)-N-phenylamino]triphenylamine (abbr.: MTDATA); 1,3,5-tris[N,N-di (m-tolyl)amino]benzene (abbr.: m-MTDAB); N,N'-diphenyl-N,N'-bis (3-methylphenyl)-1,1'-biphenyl-4,4'-diamine (abbr.: TPD); 4,4'-bis[N-(1-naphthyl)-N-phenylamino]biphenyl (abbr.: NPB); 4,4'-bis{N-[4-di(m-tolyl)amino]phenyl-N-phenylamino}biphenyl (abbr.: DNTPD); 4,4'-bis[N-(4-biphenylyl)-N-phenylamino]biphenyl (abbr.: BBPB); 4,4',4"-tri(N-carbazolyl)triphenylamine (abbr.: TCTA); and the like.

Described above are the examples of the material with a hole-transporting property; however, the material is not limited to these. Among the above compounds, an aromatic amine compound typified by TDATA, MTDATA, m-MTDAB, TPD, NPB, DNTPD, BBPB, TCTA, or the like is preferable as the organic compound because it easily generates holes. The substances described here mainly have a hole mobility of $10^{-6}$ $cm^2$/Vs or higher.

The material with a hole-injecting property includes a chemically-doped conductive high-molecular compound, in addition to the aforementioned material with a hole-transporting property. For example, polyethylene dioxythiophene (abbr.: PEDOT) doped with polystyrene sulfonate (abbr.: PSS), polyaniline (abbr.: PAni), or the like can also be used. Moreover, a thin film of an inorganic semiconductor such as molybdenum oxide ($MoO_x$), vanadium oxide ($VO_x$), or nickel oxide ($NiO_x$), or an ultrathin film of an inorganic insulator such as aluminum oxide ($Al_2O_3$) is also effective.

Here, the material with an electron-transporting property may be a material including a metal complex with a quinoline skeleton or a benzoquinoline skeleton, or the like such as the following: tris(8-quinolinolato)aluminum (abbr.: $Alq_3$), tris (4-methyl-8-quinolinolato)aluminum (abbr.: $Almq_3$), bis(10-hydroxybenzo[h]-quinolinato)beryllium (abbr.: $BeBq_2$), bis (2-methyl-8-quinolinolato)-4-phenylphenolato-aluminum (abbr.: BAlq), or the like. In addition to those, a metal complex having an oxazole ligand or a thiazole ligand, or the like can also be used, such as bis[2-(2-hydroxyphenyl)benzoxazolato]zinc (abbr.: Zn(BOX)$_2$), or bis[2-(2-hydroxyphenyl) benzothiazolato]zinc (abbr.: Zn(BTZ)$_2$).

In addition to the metal complex, 2-(4-biphenylyl)-5-(4-tert-butylphenyl)-1,3,4-oxadiazole (abbr.: PBD), 1,3-bis[5-p-tert-butylphenyl)-1,3,4-oxadiazole-2-yl]benzene (abbr.: OXD-7), 3-(4-tert-butylphenyl)-4-phenyl-5-(4-biphenylyl)-1,2,4-triazole (abbr.: TAZ), 3-(4-tert-butylphenyl)-4-(4-ethylphenyl)-5-(4-biphenylyl)-1,2,4-triazole (abbr.: p-EtTAZ), bathophenanthroline (abbr.: BPhen), bathocuproin (abbr: BCP), or the like can be used. The substance mentioned here mainly has an electron mobility of $10^{-6}$ $cm^2$/Vs or more.

As the material with an electron-injecting property, an ultrathin film of an insulator such as the following is often used besides the aforementioned material with an electron-transporting property: a halide of alkali metal such as LiF or CsF, a halide of alkaline-earth metal such as $CaF_2$, or an oxide of alkali metal such as $Li_2O$. Moreover, an alkali metal complex such as lithium acetyl acetonate (abbr.: Li(acac)) or 8-quinolinolato-lithium (abbr.: Liq) is also effective. In addition, a material mixed by, for example, co-evaporating the aforementioned material with an electron-transporting property and metal with a low work function such as Mg, Li, or Cs can also be used.

Figure 6B:
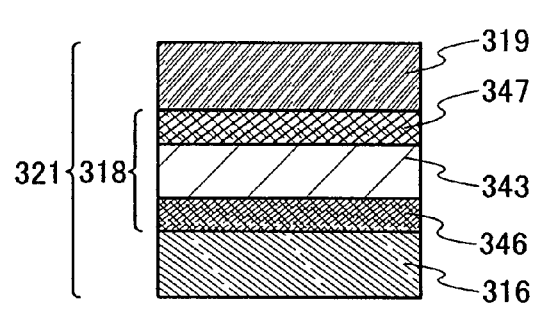

As shown in FIG. 6B, the light-emitting element 321 shown in FIG. 5A may be formed by the layer 318 containing a light-emitting material and the second electrode layer 319 which are formed over the first electrode layer 316. The layer 318 containing a light-emitting material includes a hole-transporting layer 346 formed of an organic compound and an inorganic compound having an electron-accepting property with respect to the organic compound, the light-emitting layer 343 formed of an organic compound with a light-emitting property, and an electron-transporting layer 347 formed of an inorganic compound having an electron-donating property with respect to the organic compound with a light-emitting property.

As the organic compound of the hole-transporting layer 346 formed of the organic compound with a light-emitting property and the inorganic compound having an electron-accepting property with respect to the organic compound with a light-emitting property, the aforementioned organic compound with a hole-transporting property can be used. In addition, the inorganic compound may be any kind of compound as long as it can easily accept electrons from the organic compound. As the inorganic compound, various metal oxides or metal nitrides can be used. In particular, an oxide of transition metal belonging to any of Group 4 to Group 12 in the periodic table is preferable because it easily exhibits an electron-accepting property.

Specifically, titanium oxide, zirconium oxide, vanadium oxide, molybdenum oxide, tungsten oxide, rhenium oxide, ruthenium oxide, zinc oxide, or the like is given. Among these metal oxides, oxides of transition metal belonging to Group 4 to Group 8 in the periodic table are preferable because many of them have a high electron-accepting property. In particular, vanadium oxide, molybdenum oxide, tungsten oxide, and rhenium oxide are preferable because they can be formed by vacuum evaporation and easily treated.

As the organic compound of the electron-transporting layer 347 formed of the organic compound with a light-emitting property and the inorganic compound having an electron-donating property with respect to the organic compound with a light-emitting property, the aforementioned organic compound with an electron-transporting property can be used. In addition, the inorganic compound may be any kind of compound as long as it can easily donate electrons to the organic compound. As the inorganic compound, various metal oxides or metal nitrides can be used. In particular, an oxide of alkali metal, an oxide of alkaline-earth metal, an oxide of rare-earth metal, a nitride of alkali metal, a nitride of alkaline-earth metal, and a nitride of rare-earth metal are preferable because they easily exhibit an electron-donating property. Specifically, lithium oxide, strontium oxide, barium oxide, erbium oxide, lithium nitride, magnesium nitride, calcium nitride, yttrium nitride, lanthanum nitride, and the like are given. In particular, lithium oxide, barium oxide, lithium nitride, magnesium nitride, and calcium nitride are preferable because they can be formed by vacuum evaporation and easily treated.

The electron-transporting layer 347 or the hole-transporting layer 346 formed of the organic compound with a light-emitting property and the inorganic compound is superior in electron injecting/transporting properties; therefore, various materials can be used for the first electrode layer 316 and the second electrode layer 319 with their work functions hardly limited. Moreover, the drive voltage can be reduced.

In addition, the light-emitting element 321 functions as an inorganic EL element by having a layer which uses an inorganic compound and which has a light-emitting function (this layer is hereinafter called a light-emitting layer 349) as the layer 318 containing a light-emitting substance. The inorganic EL elements are classified according to their element structures into a dispersed inorganic EL element and a thin-film inorganic EL element. They are different from each other in that the former includes a light emitting layer in which particles of a light emitting material are dispersed in a binder and the latter includes a light emitting layer formed of a thin film of a phosphor material. However, they are common in that they both require electrons accelerated by a high electric field.

In addition, the mechanism of light emission to be obtained includes donor-acceptor recombination light emission which uses a donor level and an acceptor level, and local light emission which uses core electron transition of a metal ion. In general, in many cases, a dispersed inorganic EL element uses donor-acceptor recombination light emission whereas a thin-film inorganic EL element uses local light emission. A structure of the inorganic EL element is shown below.

The light-emitting material that can be used in Embodiment Mode 3 includes a base material and an impurity element to become a light emission center, and can emit light with various colors by changing the impurity element to be contained. The light-emitting material can be manufactured by various methods such as a solid phase method and a liquid phase method (coprecipitation method). As a liquid phase method, a spray pyrolysis method, a double decomposition method, a method by precursor pyrolysis, a reverse micelle method, a method in which the above method is combined with high-temperature baking, or a freeze-drying method can be used.

In the solid phase method, a base material and an impurity element are weighed, mixed in a mortar, and reacted with each other by being heated and baked in an electric furnace so that the impurity element is contained in the base material. Baking temperatures are preferably 700 to 1500° C. This is because solid phase reaction does not progress at a temperature that is too low and the base material is decomposed at a temperature that is too high. The baking may be performed to the base material and the impurity element in a powder state; however, it is preferable to perform baking in a pellet state. This method requires baking at a comparatively high temperature but is simple; thus, this method has high productivity and is suitable for mass production.

In the liquid-phase method (coprecipitation method), a base material or a compound thereof, and an impurity element or a compound thereof are reacted with each other in a solution and dried, and thereafter, they are baked. In this method, particles of the base material as the light-emitting material are uniformly dispersed, and reaction can progress even at a low baking temperature and with the particles each having a small diameter. As the base material, a sulfide, an oxide, or a nitride can be used in the present invention.

As the sulfide, for example, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used. As the oxide, for example, zinc oxide (ZnO), yttrium oxide ($Y_2O_3$), or the like can be used.

Further, as the nitride, for example, aluminum nitride (AlN), gallium nitride (GaN), indium nitride (InN), or the like can be used. In addition, zinc selenide (ZnSe), zinc telluride (ZnTe), or the like can also be used. A ternary mixed crystal such as calcium-gallium sulfide ($CaGa_2S_4$), strontium-gallium sulfide ($SrGa_2S_4$), or barium-gallium sulfide ($BaGa_2S_4$) may also be used.

As the light emission center of local light emission, manganese (Mn), copper (Cu), samarium (Sm), terbium (Tb), erbium (Er), thulium (Tm), europium (Eu), cerium (Ce), praseodymium (Pr), or the like can be used. A halogen element such as fluorine (F) or chlorine (Cl) may be added as charge compensation.

On the other hand, a light-emitting material including a first impurity element forming a donor level and a second impurity element forming an acceptor level may be used as the light emission center of donor-acceptor recombination light emission. For example, fluorine (F), chlorine (Cl), aluminum (Al), or the like can be used as the first impurity element, and copper (Cu), silver (Ag), or the like can be used as the second impurity element.

In a case of synthesizing a light-emitting material of donor-acceptor recombination light emission by a solid phase method, a base material, the first impurity element or a compound thereof, and the second impurity element or a compound thereof are weighed, mixed in a mortar, and heated and baked in an electric furnace. Baking temperatures preferably range from 700 to 1500° C. This is because solid phase reaction does not progress at a temperature that is too low and the base material is decomposed at a temperature that is too high. The baking may be performed on the base material and the impurity element in a powder state; however, it is preferable to perform baking in a pellet state.

The aforementioned base material can be used as the base material. As the first impurity element or the compound thereof, for example, fluorine (F), chlorine (Cl), aluminum sulfide ($Al_2S_3$), or the like can be used. As the second impurity element or the compound thereof, for example, copper (Cu), silver (Ag), copper sulfide ($Cu_2S$), silver sulfide ($Ag_2S$), or the like can be used.

As the impurity element in the case of using the solid phase reaction, a compound including the first impurity element and the second impurity element may be used in combination. In this case, the impurity element easily disperses so as to promote solid phase reaction. Therefore, a uniform light-emitting material can be obtained. Moreover, since no excessive impurity elements are included, a light-emitting material with high purity can be obtained. As the compound including the first impurity element and the second impurity element at that time, for example, copper chloride (CuCl), silver chloride (AgCl), or the like can be used. The concentration of these impurity elements may be in the range of 0.01 to 10 atom %, preferably in the range of 0.05 to 5 atom %, with respect to the base material.

Figure 6C:
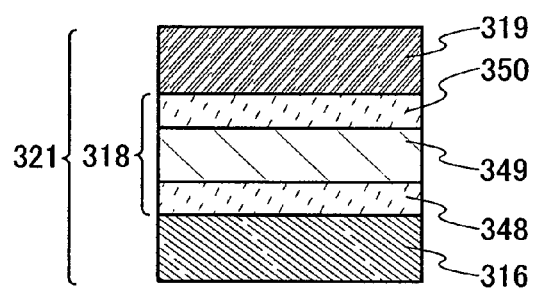

FIG. 6C shows a cross section of an inorganic EL element in which the layer 318 containing a light-emitting substance is formed by a first insulating layer 348, the light-emitting layer 349, and a second insulating layer 350. It is to be noted that the inorganic EL light-emitting element emits light by application of voltage between a pair of electrode layers which sandwiches the layer containing a light-emitting substance and can be operated by either DC driving or AC driving. In the case of a thin film inorganic EL element, the light-emitting layer 349 is a layer containing the aforementioned light-emitting material and can be formed by a vacuum evaporation method such as a resistance heating evaporating method or an electron beam evaporation (EB evaporation) method, a physical vapor deposition (PVD) method such as a sputtering method, a chemical vapor deposition (CVD) method such as an organic metal CVD method or a low-pressure hydride transport CVD method, an atomic layer epitaxy (ALE) method, or the like.

The first insulating layer 348 and the second insulating layer 350 are not particularly limited; however, they preferably have dense film quality and moreover have a high dielectric constant. For example, a film of silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like; a film in which these are mixed; or a film in which two or more of them are stacked can be used.

The first insulating layer 348 and the second insulating layer 350 can be formed by sputtering, evaporation, CVD, or the like. Their film thicknesses are not limited in particular, but are preferably in the range of 10 to 1000 nm. Since the light-emitting element of Embodiment Mode 3 does not always require hot electrons, the light-emitting element can be formed to be a thin film and has an advantage of low drive voltage. The film thickness is preferably 500 nm or less, more preferably 100 nm or less.

Although not shown, a buffer layer may be provided between the light-emitting layer 349 and the insulating layers 348 and 350 or between the light-emitting layer 349 and the electrode layers 316 and 319. The buffer layer facilitates carrier injection and has a role of suppressing mixture of the both layers. The material of the buffer layer is not particularly limited; however, for example, ZnS, ZnSe, ZnTe, CdS, SrS, BaS, CuS, $Cu_2S$, LiF, $CaF_2$, $BaF_2$, $MgF_2$, or the like, which is the base material of the light-emitting layer, can be used.

Figure 6D:
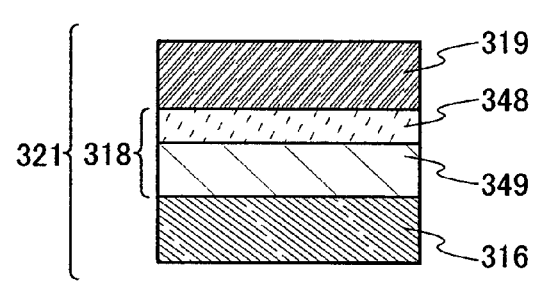

Moreover, as shown in FIG. 6D, the layer 318 containing a light-emitting substance may be formed by the light-emitting layer 349 and the first insulating layer 348. In this case, in FIG. 6D, the first insulating layer 348 is provided between the second electrode layer 319 and the light-emitting layer 349. It is to be noted that the first insulating layer 348 may be provided between the first electrode layer 316 and the light-emitting layer 349. Moreover, the layer 318 containing a light-emitting substance may be formed by only the light-emitting layer 349. In other words, the light-emitting layer 321 may be formed by the first electrode layer 316, the layer 318 containing a light-emitting substance, and the second electrode layer 319.

In the case of a dispersed inorganic EL element, a film-form layer containing a light-emitting substance is formed by dispersing particles of light-emitting material in a binder. When particles with desired size cannot be obtained sufficiently depending on the manufacturing method of the light-emitting material, the material may be crushed in a mortar or the like to be processed into particles. The binder is a substance to fix the particles of the light-emitting material in a dispersed state and to keep the shape as the layer containing a light-emitting substance. The light-emitting material is thus fixed in such a way that the light-emitting material is uniformly dispersed in the layer containing the light-emitting substance by the binder.

In the case of the dispersed inorganic EL element, the layer containing a light-emitting substance can be formed by a droplet discharging method that can selectively form the layer containing the light-emitting substance, a printing method (such as screen printing or offset printing), a coating method such as a spin coating method, a dipping method, a dispenser method, or the like. The film thickness of the layer at that time is not particularly limited; however, it is preferably in the range of 10 to 1000 nm. In the layer containing a light-emitting substance, which includes the light-emitting material and the binder, the proportion of the light-emitting material is preferably in the range of 50 to 80 wt %.

Figure 6E:
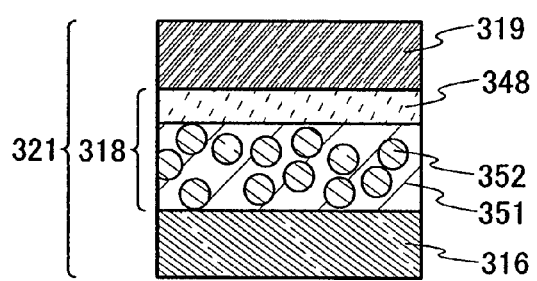

An element shown in FIG. 6E has the first electrode layer 316, the layer 318 containing a light-emitting substance, and the second electrode layer 319. The layer 318 containing a light-emitting substance is formed by the insulating layer 348 and a light-emitting layer in which a light-emitting material 352 is dispersed in a binder 351. The insulating layer 348 is in contact with the second electrode layer 319 in FIG. 6E; however, the insulating layer 348 may be in contact with the first electrode layer 316. Moreover, insulating layers may be formed in contact with the first electrode layer 316 and the second electrode layer 319. Further, the insulating layer does not have to be in contact with the first electrode layer 316 and the second electrode layer 319 in the element.

As the binder that can be used in Embodiment Mode 3, an insulating material such as an organic material and an inorganic material can be used, and moreover, a mixed material of an organic material and an inorganic material can be used. As the organic insulating material, polymer with a comparatively high dielectric constant such as a cyanoethylcellulose-based resin, a polyethylene-based resin, a polypropylene-based resin, a polystyrene-based resin, a silicone resin, a siloxane resin, an epoxy resin, vinylidene fluoride, or the like can be used. Moreover, a heat-resistant high-molecular material such as aromatic polyamide or polybenzimidazole can be used.

It is to be noted that a siloxane resin corresponds to a resin including a Si—O—Si bond, and siloxane includes a bond of silicon (Si) and oxygen (O) in its skeleton. As the substituent, an organic group including at least hydrogen (for example, an alkyl group and an aromatic hydrocarbon group) is used. In addition, a fluoro group may be used as the substituent. Furthermore, an organic group including at least hydrogen and a fluoro group may be used as the substituent.

In addition, a vinyl resin such as polyvinyl alcohol or polyvinyl butyral, a resin material such as a phenol resin, a novolac resin, an acrylic resin, a melamine resin, a urethane resin, or an oxazole resin (polybenzoxazole) may be used. Moreover, a photo curable type is also applicable. The dielectric constant can be adjusted by appropriately mixing microparticles with a high dielectric constant such as barium titanate ($BaTiO_3$) or strontium titanate ($SrTiO_3$) in these resins.

As the inorganic material used for the binder, silicon oxide ($SiO_x$), silicon nitride (SiN), silicon including oxygen and nitrogen, aluminum nitride (AlN), aluminum including oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), ZnS, or another inorganic material can be used. When the organic material is mixed with the inorganic material with a high dielectric constant (by addition or the like), the dielectric constant of the layer containing a light-emitting substance, which includes the light-emitting material and the binder can be controlled more accurately so as to increase further.

In the manufacturing process, the light-emitting material is dispersed in a solution including the binder. A solvent of the solution including the binder which is applicable to this embodiment mode is preferably a solvent in which the binder material is dissolved and which can manufacture a solution with its viscosity suitable for forming the light-emitting layer with desired film thickness. As such a solvent, an organic solvent or the like can be used. For example, in a case of using a siloxane resin as the binder, propylene glycol monomethylether, propylene glycol monomethylether acetate (also called PGMEA), 3-methoxy-3-methyl-1-butanol (also called MMB), or the like can be used.

Next, as shown in FIG. 5B, a protective film 322 is formed over the second electrode layer 319. The protective film 322 is to prevent intrusion of moisture, oxygen, and the like into the light-emitting element 321 and the protective film 322. The protective film 322 is preferably formed using silicon nitride, silicon oxide, silicon nitride oxide, silicon oxynitride, aluminum oxynitride, aluminum oxide, diamond-like carbon (DLC), carbon containing nitrogen (CN), or another insulating material by a thin-film forming method such as a plasma CVD method or a sputtering method.

In addition, when a sealing substrate 324 is attached to the second interlayer insulating film 315 over the substrate 100 by the use of a sealant 323, the light-emitting element 321 is provided in a space 325 surrounded by the substrate 100, the sealing substrate 324, and the sealant 323. The space 325 is filled with filler, which may be an inert gas (such as nitrogen or argon) or the sealant 323.

An epoxy-based resin is preferably used for the sealant 323, and the material of the sealant 323 desirably does not transmit moisture and oxygen as much as possible. As the sealing substrate 324, a glass substrate, a quartz substrate, or a plastic substrate formed of FRP (Fiberglass-Reinforced Plastics), PVF (Polyvinyl fluoride), Mylar, polyester, acrylic, or the like can be used.

Subsequently, as shown in FIG. 5C, an FPC 327 is attached to the conductive layer 320 which is in contact with the connection terminal 314, by using an anisotropic conductive layer 326 similarly to Embodiment Mode 2. Through the above steps, a semiconductor device having an active matrix light-emitting element can be formed.

Figure 7:
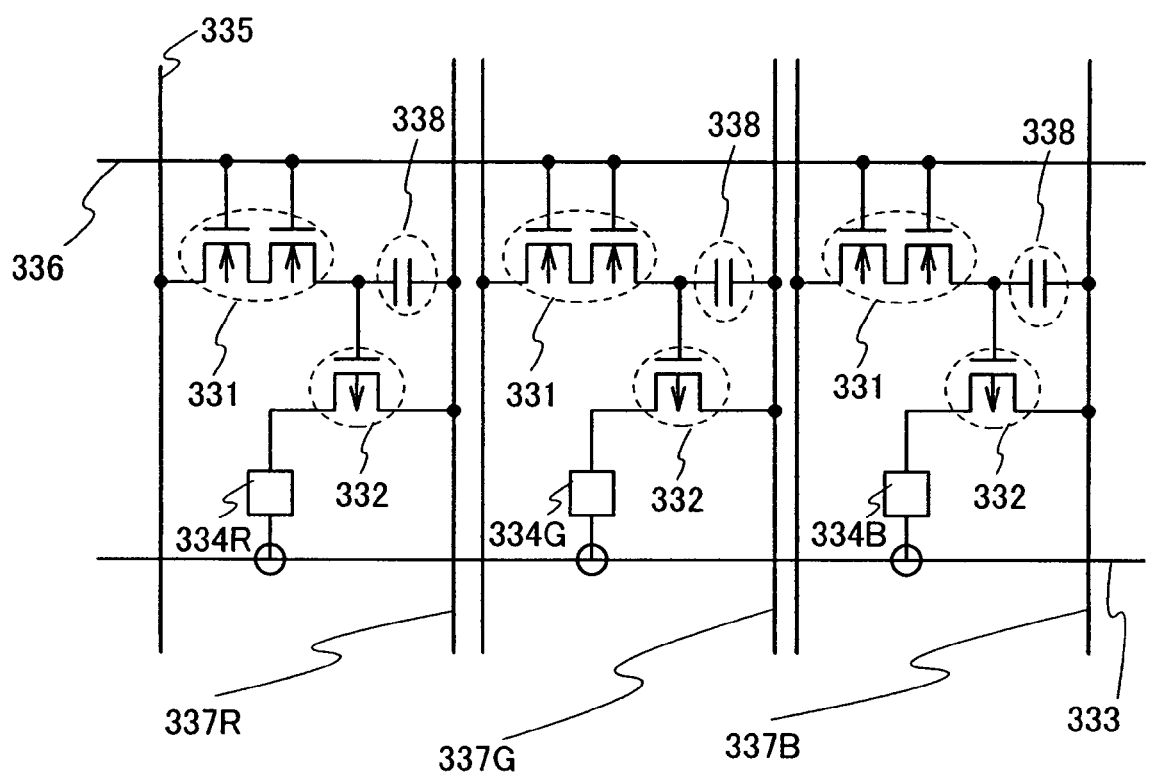
FIG. 7 is a diagram describing an equivalent circuit of an applicable light-emitting element of the present invention.

Here, FIG. 7 shows an equivalent circuit diagram of a pixel in a case of full-color display in Embodiment Mode 3. In FIG. 7, a thin film transistor 331 surrounded by a dashed line corresponds to a thin film transistor which switches the thin film transistor 227 for driving in FIG. 5A, whereas a thin film transistor 332 surrounded by a dashed line corresponds to a thin film transistor which drives a light-emitting element. In the following description, the light-emitting element is an organic EL element (hereinafter referred to as OLED) in which a layer containing a light-emitting substance is formed by a layer containing an organic compound with a light-emitting property.

In a pixel displaying red color, an OLED 334R emitting red light is connected to a drain region of the thin film transistor 332, and a red-color anode-side power source line 337R is provided in a source region thereof. The OLED 334R is provided with a cathode-side power source line 333, the thin film transistor 331 for switching is connected to a gate wire 336, and a gate electrode of the thin film transistor 332 for driving is connected to a drain region of the thin film transistor 331 for switching. The drain region of the thin film transistor 331 for switching is connected to a capacitor 338 connected to the red-color anode-side power source line 337R.

In a pixel displaying green color, an OLED 334G emitting green light is connected to a drain region of the thin film transistor 332 for driving, and a green-color anode-side power source line 337G is provided in a source region thereof. The OLED 334G is provided with a cathode-side power source line 333, the thin film transistor 331 for switching is connected to the gate wire 336, and the gate electrode of the thin film transistor 332 for driving is connected to the drain region of the thin film transistor 331 for switching. The drain region of the thin film transistor 331 for switching is connected to the capacitor 338 connected to the green-color anode-side power source line 337G.

In a pixel displaying blue color, an OLED 334B emitting blue light is connected to a drain region of the thin film transistor 332 for driving, and a blue-color anode-side power source line 337B is provided in a source region thereof. The OLED 334B is provided with the cathode-side power source line 333, the thin film transistor 331 for switching is connected to the gate wire 336, and the gate electrode of the thin film transistor 332 for driving is connected to the drain region of the thin film transistor 331 for switching. The drain region of the thin film transistor 331 for switching is connected to the capacitor 338 connected to the blue-color anode-side power source line 337B.

Different voltages depending on the material of the layer containing a light-emitting substance are applied respectively to the pixels with different colors. Here, although the source wire 335 and the anode-side power source lines 337R, 337G, and 337B are formed in parallel, the present invention is not limited to this. The gate wire 336 and the anode-side power source lines 337R, 337G, and 337B may be formed in parallel. In addition, the thin film transistor 332 for driving may have a multi-gate electrode structure.

In the light-emitting device, the driving method of screen display is not particularly restricted. For example, a dot-sequential driving method, a line-sequential driving method, a plane-sequential driving method, or the like may be used. Typically, the line sequential driving method is used, and may be appropriately combined with a time-division grayscale driving method or an area grayscale driving method. In addition, a video signal to be inputted into a source line of the light emitting device may be an analog signal or a digital signal. A driving circuit or the like may be appropriately designed in accordance with the video signal.

Further, in a light-emitting device using a digital video signal, there are two kinds of driving systems in which video signals inputted into a pixel are ones with constant voltage (CV) and in which video signals inputted into a pixel are ones with constant current (CC). Further, as for the driving system using video signals with constant voltage (CV), there are two kinds of systems in which voltage applied to a light emitting element is constant (CVCV), and in which current applied to a light emitting element is constant (CVCC). In addition, as for the driving system using video signals with constant current (CC), there are two kinds of systems in which voltage applied to a light emitting element is constant (CCCV), and in which current applied to a light emitting element is constant (CCCC). In the light-emitting device, a protective circuit for preventing electrostatic breakdown (such as a protective diode) may be provided.

Through the above steps, a light-emitting device having an active matrix light-emitting element can be manufactured. In the light-emitting device shown in this embodiment mode, plane orientations of crystals are aligned in a certain direction in semiconductor layers of thin film transistors formed in a driver circuit and a pixel portion. Therefore, variation in electrical characteristics of the thin film transistors for driving the light-emitting element can be suppressed. As a result, variation in luminance of the light-emitting element can be reduced, which allows the manufacturing of a light-emitting device capable of high-definition display with little color unevenness and few defects.

Embodiment Mode 4

Embodiment Mode 4 will explain a manufacturing process of a semiconductor device capable noncontact data transmission with reference to FIGS. 8A to 11D. First, a structure of the semiconductor device is explained with reference to FIG. 12 and application of the semiconductor device shown in this embodiment mode is explained with reference to FIGS. 13A to 13F.

Figure 8A:
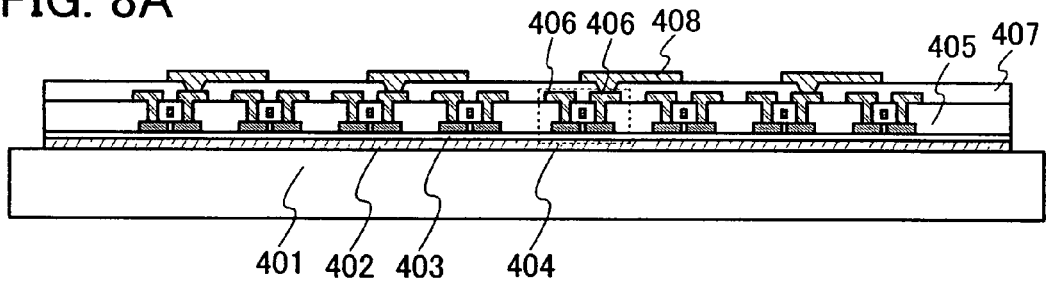
FIGS. 8A to 8E are cross-sectional diagrams describing a method for manufacturing a semiconductor device of the present invention.

As shown in FIG. 8A, a peeling film 402 is formed over a substrate 401. Next, an insulating film 403 is formed over the peeling film 402 similarly to Embodiment Modes 1 and 2, thereby forming a thin film transistor 404 over the insulating film 403. Subsequently, an interlayer insulating film 405 is formed to insulate a conductive film included in the thin film transistor 404, and source and drain electrodes 406 to be connected to the semiconductor layer of the thin film transistor 404 are formed.

After that, an insulating film 407 is formed to cover the thin film transistor 404, the interlayer insulating film 405, and the source and drain electrodes 406. Then, a conductive film 408 connected to the source and drain electrodes 406 with the insulating film 407 interposed therebetween is formed. As the substrate 401, a substrate similar to the substrate 100 can be used. As the substrate, a metal substrate or a stainless-steel substrate with an insulating film formed on one surface thereof, a plastic substrate that can withstand treatment temperature of this process, or the like can be used. Here, a glass substrate is used as the substrate 401.

The peeling layer 402 is formed of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon; an alloy material containing the element as its main component; or a compound material containing the element as its main component to have a single-layer or stacked-layer structure by a sputtering method, a plasma CVD method, a coating method, a printing method, or the like. The crystal structure of a layer including silicon as the peeling layer 402 may be amorphous, microcrystalline, or polycrystal.

When the peeling layer 402 has a single-layer structure, it is preferable to form a tungsten layer, a molybdenum layer, or a layer including a mixture of tungsten and molybdenum. Alternatively, a layer including tungsten oxide or tungsten oxynitride, a layer including molybdenum oxide or molybdenum oxynitride, or a layer including an oxide or an oxynitride of a mixture of tungsten and molybdenum is formed. The mixture of tungsten and molybdenum corresponds to, for example, an alloy of tungsten and molybdenum.

When the peeling layer 402 has a stacked-layer structure, a tungsten layer, a molybdenum layer, or a layer including a mixture of tungsten and molybdenum is preferably formed as a first layer, and a layer of an oxide, a nitride, an oxynitride, or a nitride oxide of tungsten, molybdenum, or a mixture of tungsten and molybdenum is preferably formed as a second layer. When the peeling layer 402 is formed to have a stacked-layer structure including a layer which includes tungsten and a layer which includes tungsten oxide, the layer which includes tungsten may be formed and an insulating film which includes an oxide may be formed thereover so that the layer which includes tungsten oxide is formed at an interface between the tungsten layer and the insulating layer.

Further, the layer which includes tungsten oxide may be formed by processing a surface of the layer which includes tungsten through thermal oxidation treatment, oxidation plasma treatment, $N_2O$ plasma treatment, treatment using a solution with strong oxidation power such as ozone water, treatment using water with hydrogen added, or the like. This similarly applies to the case of forming a layer including tungsten nitride, a layer including tungsten oxynitride, and a layer including tungsten nitride oxide. After forming the layer which includes tungsten, a silicon nitride layer, a silicon oxynitride layer, and a silicon nitride oxide layer are preferably formed on the layer which includes tungsten.

Tungsten oxide is expressed by $WO_x$, where x satisfies $2 \leq x \leq 3$. The x may be 2 ($WO_2$), 2.5 ($W_2O_5$), 2.75 ($W_4O_{11}$), 3 ($WO_3$), or the like. Here, the tungsten film is formed by a sputtering method to have a thickness of 20 to 100 nm, preferably 40 to 80 nm. Although the peeling layer 402 is formed in contact with the substrate 401 in the above process, the present invention is not limited to this process. An insulating film to be a base may be formed in contact with the substrate 401 and the peeling film 402 may be provided in contact with the insulating film.

The insulating film 403 formed over the peeling film can be formed similarly to the insulating film 101. Here, the insulating film is formed in such a way that a tungsten oxide film is formed on a surface of the peeling film 402 by generating plasma in the flow of N$_2$O gas and then a silicon oxide film including nitrogen is formed by a plasma CVD method. The thin film transistor 404 can be formed similarly to the thin film transistor 225 to 227 shown in Embodiment Mode 2. The source and drain electrodes 406 can be formed similarly to wires 234 to 239 shown in Embodiment Mode 2.

The interlayer insulating film 405 and the insulating film 407 covering the source and drain electrodes 406 are formed by applying and baking polyimide, acrylic, or siloxane polymer. Alternatively, they can be formed by using an inorganic compound to have a single-layer or stacked-layer structure by a sputtering method, a plasma CVD method, a coating method, a printing method, or the like. Typical examples of the inorganic compound include silicon oxide, silicon nitride, and silicon oxynitride.

Figure 8B:
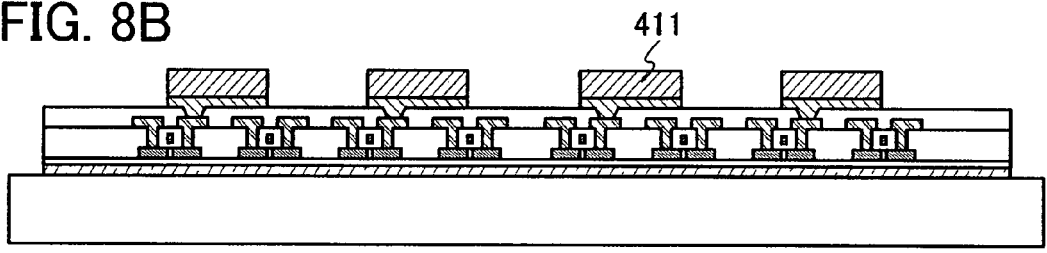

Next, as shown in FIG. 8B, a conductive film 411 is formed over the conductive film 408. Here, a composition including gold particles is printed by a printing method and heated at 200° C. for 30 minutes so that the composition is baked. Thus, the conductive film 411 is formed.

Figure 8C:
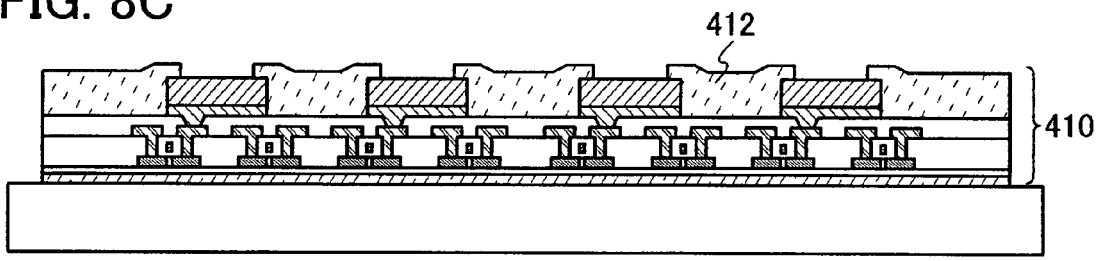

Subsequently, as shown in FIG. 8C, an insulating film 412 covering end portions of the insulating film 407 and the conductive film 411 is formed. Here, the insulating film 412 covering end portions of the insulating film 407 and the conductive film 411 is formed of an epoxy resin. At that time, a composition of an epoxy resin is applied by a spin coating method and heated at 160° C. for 30 minutes; then, a part of the insulating film that covers the conductive film 411 is removed to expose the conductive film 411. Thus, the insulating film 412 with a thickness of 1 to 20 μm, preferably 5 to 10 μm, is formed. Here, a stacked-layer body from the insulating film 403 to the insulating film 412 is referred to as an element-forming layer 410.

Figure 8D:
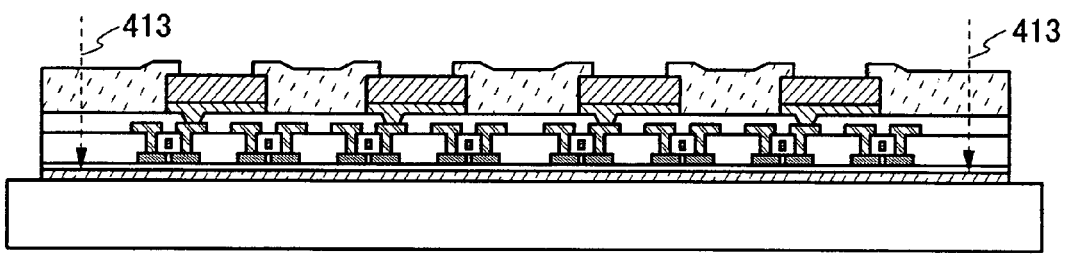
Figure 8E:
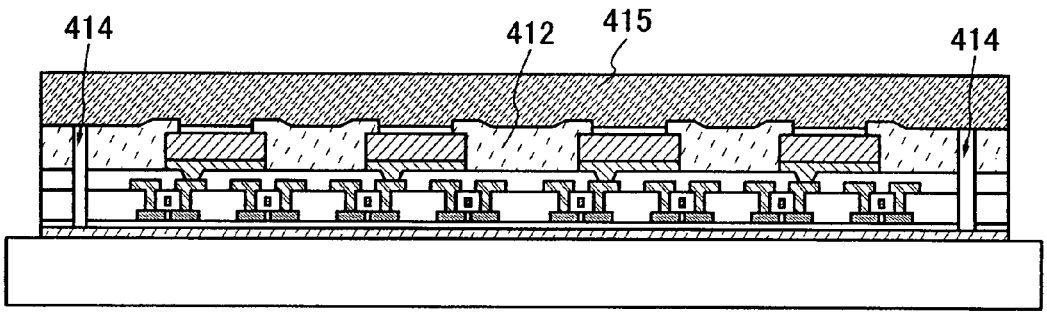

Next, the insulating films 403, 405, 407, and 412 are irradiated with laser light 413 as shown in FIG. 8D to form opening portions 414 as shown in FIG. 8E, so that a later peeling step is facilitated. After that, a sticking member 415 is attached to the insulating film 412. The laser light used to form the opening portions 414 is preferably the laser light with a wavelength that is absorbed by the insulating films 403, 405, 407, and 412; typically, laser light of an ultraviolet region, a visible region, or an infrared region is selected appropriately to be used.

As a laser oscillator capable of emitting such laser light, the following can be used: an excimer laser such as a KrF excimer laser, an ArF excimer laser, or a XeCl excimer laser; a gas laser such as a He laser, a He—Cd laser, an Ar laser, a He—Ne laser, an HF laser, or a CO$_2$ laser; a solid-state laser such as a crystal laser in which a crystal like YAG, GdVO$_4$, YVO$_4$, YLF, or YAlO$_3$ is doped with Cr, Nd, Er, Ho, Ce, Co, Ti, or Tm, a glass laser, or a ruby laser; or a semiconductor laser such as a GaN laser, a GaAs laser, a GaAlAs laser, or an InGaAsP laser can be used. In a case of using a solid-state laser, any of the fundamental wave to the fifth harmonic wave is preferably used.

As a result of the laser irradiation, the insulating films 403, 405, 407, and 412 absorb the laser light 413 to be melted, thereby forming the opening portions. When the step of irradiating the insulating films 403, 405, 407, and 412 with the laser light 413 is omitted, throughput can be improved.

Figure 9A:
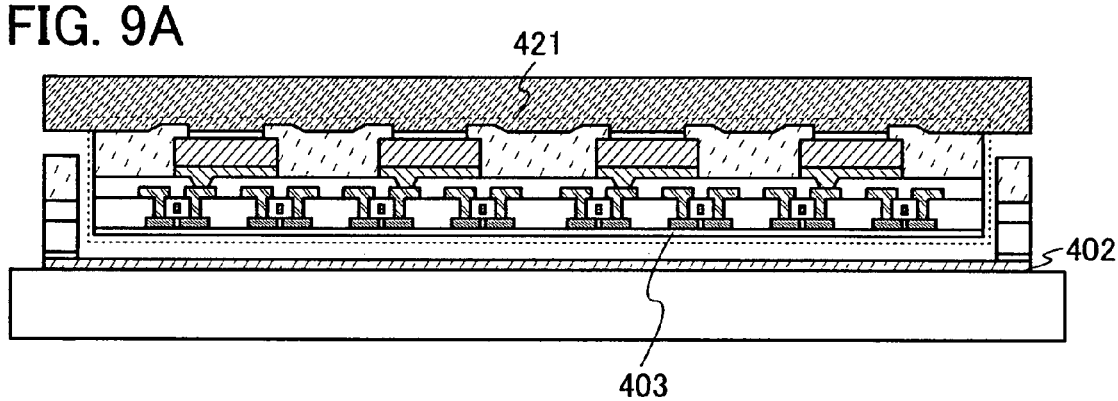
FIGS. 9A to 9D are cross-sectional diagrams describing a method for manufacturing a semiconductor device of the present invention.

Subsequently, as shown in FIG. 9A, a part 421 of the element-forming layer is peeled from the substrate 401 having the peeling film 402 by a physical means at a metal oxide film formed at the interface between the peeling film 402 and the insulating film 403. The physical means refers to a dynamic means or a mechanical means, which changes some kind of dynamic energy (mechanical energy). The typical physical means refers to mechanical power addition (for example, peeling by a human hand or grip tool, or separation treatment by rolling a roller).

The above peeling step is characterized in that a layer which does not contract by heat treatment, a layer which contracts by heat treatment, and an intermediate layer between the two layers are formed, and heat treatment is performed at the completion of the peeling step or during the peeling step, so that excess stress is applied to the intermediate layer or to a region in the vicinity of the intermediate layer, and after that, by stimulating the intermediate layer, separation occurs at the intermediate layer or in the region in the vicinity of the intermediate layer. As a result, the peeling film 402 does not contract by the heat treatment in crystallization of an amorphous silicon film, impurity activation, or dehydrogenation, while the insulating film 403 and the insulating film 412 contract, and further, a tungsten oxide layer (WO$_x$ where $2 \leq x \leq 3$) is formed at the interface between the peeling film 402 and the insulating film 403. Since the tungsten oxide layer is weak, it can easily be separated by the above physical means. As a result, the part 421 of the element-forming layer can be separated from the substrate 401 by the above physical method.

Although the metal oxide film is formed between the peeling film and the insulating film to peel the element-forming layer 410 by the physical means in Embodiment Mode 4, the present invention is not limited to this. A method can be used in which a light-transmitting substrate is used as the substrate, an amorphous silicon layer including hydrogen is used as the peeling film, and after the step of FIG. 8E, the amorphous silicon film is irradiated with laser light from a substrate side so that hydrogen included in the amorphous silicon film is vaporized and separation occurs between the substrate and the peeling film.

After the step of FIG. 8E, alternatively, a method of removing the substrate by mechanical polishing, or a method of removing the substrate by using a solution such as HF which can dissolve the substrate can be employed. In that case, the peeling layer can be omitted. As a further alternative, the following method can be used: before attaching the sticking member 415 to the insulating film 412 in FIG. 8E, a fluoride gas such as NF$_3$, BrF$_3$, or ClF$_3$ is introduced into the opening portions 414 so that the peeling film is etched away by the fluoride gas; the sticking member 415 is attached to the insulating film 412; and then the part 421 of the element-forming layer is peeled from the substrate.

As a further alternative, the following method can be used: before attaching the sticking member 415 to the insulating film 412 in FIG. 8E, a fluoride gas such as NF$_3$, BrF$_3$, or ClF$_3$ is introduced into the opening portions 414 so that the peeling layer is partially etched away by the fluoride gas; the sticking member 415 is attached to the insulating film 412; and then the part 421 of the element-forming layer is peeled from the substrate by a physical means.

Figure 9B:
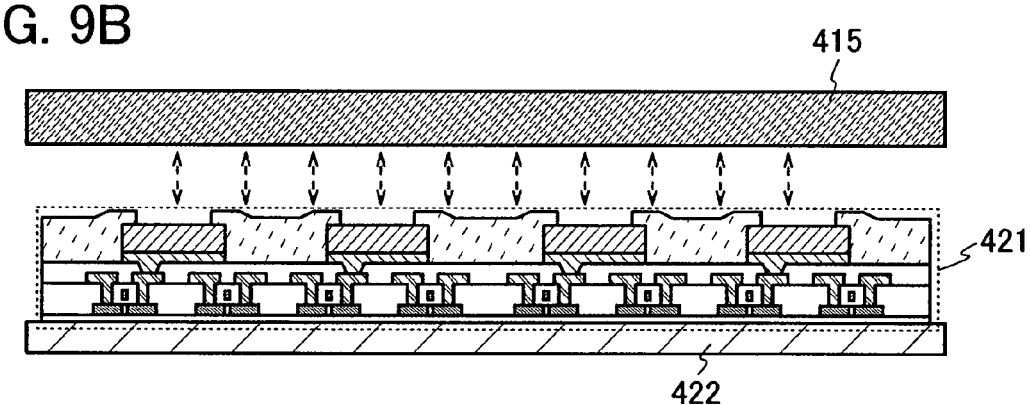
Figure 9C:
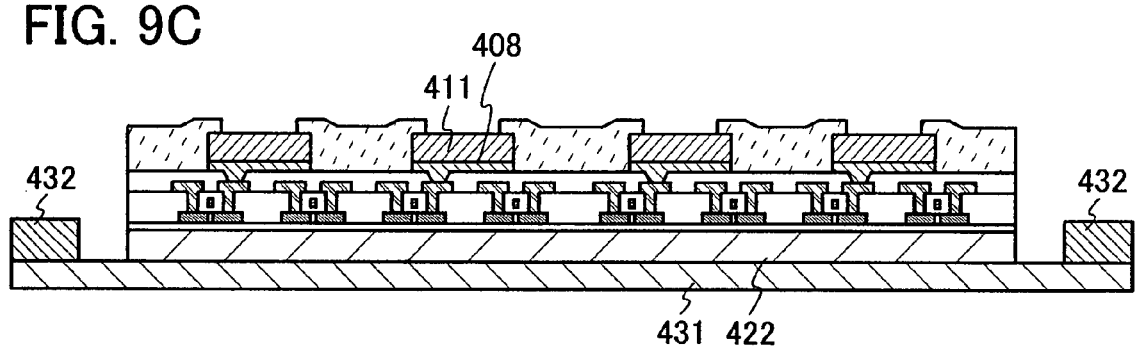
Figure 9D:
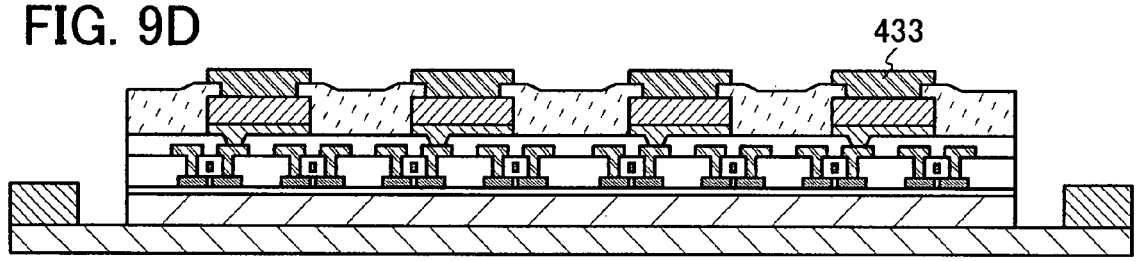

Subsequently, as shown in FIG. 9B, a flexible substrate 422 is attached to the insulating film 403 in the part 421 of the element-forming layer; then, the sticking member 415 is peeled off from the part 421 of the element-forming layer. Here, a film formed of polyaniline by a cast method is used as the flexible substrate 422; then, the flexible substrate 422 is attached to a UV sheet 431 of a dicing frame 432 as shown in FIG. 9C. Since this UV sheet 431 is adhesive, the flexible substrate 422 is fixed onto the UV sheet 431. After that, the conductive film 411 may be irradiated with laser light to increase adhesiveness between the conductive film 411 and the conductive film 408. Subsequently, a connection terminal 433 is formed over the conductive film 411 as shown in FIG.

9D. By the formation of the connection terminal 433, alignment and adhesion with the conductive film which later functions as an antenna can be conducted easily.

Figure 10A:
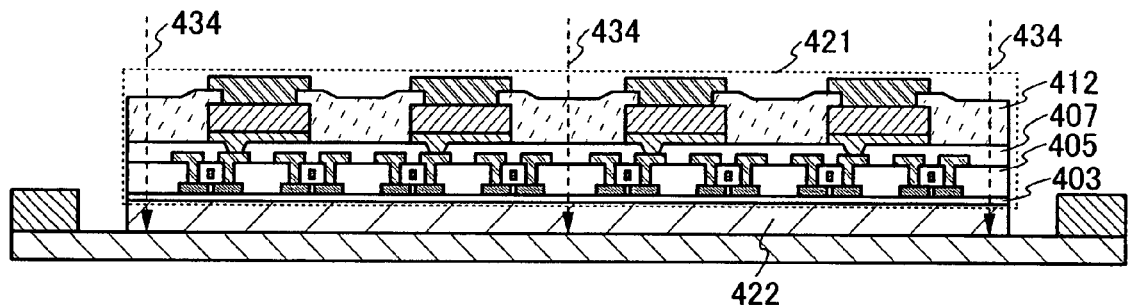
FIGS. 10A to 10C are cross-sectional diagrams describing a method for manufacturing a semiconductor device of the present invention.
Figure 10B:
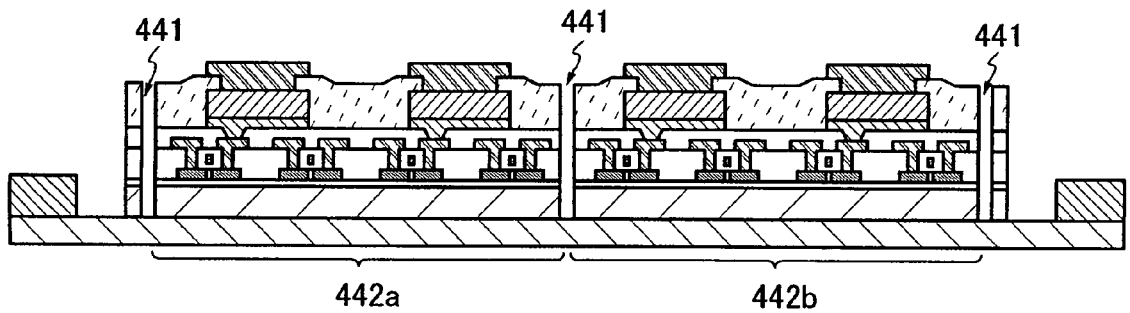

Next, as shown in FIG. 10A, the part 421 of the element-forming layer is cut. Here, the part 421 of the element-forming layer is cut into plural sections as shown in FIG. 10B by irradiating the part 421 of the element-forming layer and the flexible substrate 422 with the laser light 434. As the laser light 434, laser light described for the laser light 413 can be used as appropriate. Here, laser light which can be absorbed by the insulating films 403, 405, 407, and 412 and the flexible substrate 422 is preferably selected. Here, although the part of the element-forming layer is cut into plural sections by a laser cut method, a dicing method, a scribing method, or the like can be appropriately used instead. The element-forming layers cut into sections are shown as thin film integrated circuits 442a and 442b.

Figure 10C:
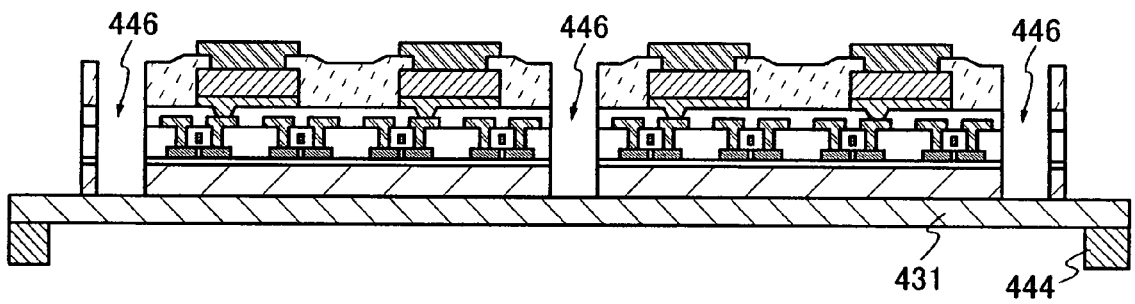

Next, as shown in FIG. 10C, the UV sheet of the dicing frame 432 is irradiated with UV light to decrease the adhesiveness of the UV sheet 431. Then, the UV sheet 431 is supported by an expander frame 444. At this time, by supporting the UV sheet 431 with the expander frame 444 while stretching the UV sheet 431, the width of a groove 441 which is formed between the thin film integrated circuits 442a and 442b can be increased. An expanded groove 446 desirably corresponds to the size of an antenna substrate to be later attached to the thin film integrated circuits 442a and 442b.

Figure 11A:
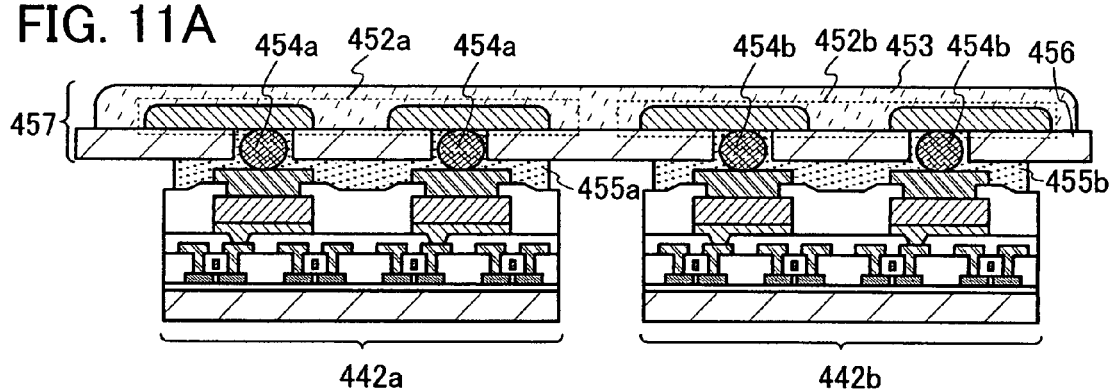
FIGS. 11A to 11D are cross-sectional diagrams describing a method for manufacturing a semiconductor device of the present invention.

Subsequently, as shown in FIG. 11A, a flexible substrate 456 having conductive films 452a and 452b functioning as antennas is attached to the thin film integrated circuits 442a and 442b with anisotropic conductive adhesives 455a and 455b. The flexible substrate 456 having the conductive films 452a and 452b functioning as antennas is provided with opening portions so as to partially expose the conductive films 452a and 452b. An insulating film 453 covering the conductive films 452a and 452b functioning as antennas is formed over the flexible substrate 456.

Accordingly, the flexible substrate 456 is attached to the thin film integrated circuits 442a and 442b while adjusting their positions so that the conductive films 452a and 452b functioning as antennas are connected to connection terminals of the thin film integrated circuits 442a and 442b with conductive particles 454a and 454b included in the anisotropic conductive adhesives 455a and 455b. Here, the conductive film 452a functioning as an antenna is connected to the thin film integrated circuit 442a by the conductive particle 454a in the anisotropic conductive adhesive 455a, while the conductive film 452b functioning as an antenna is connected to the thin film integrated circuit 442b by the conductive particle 454b in the anisotropic conductive adhesive 455b.

Figure 11B:
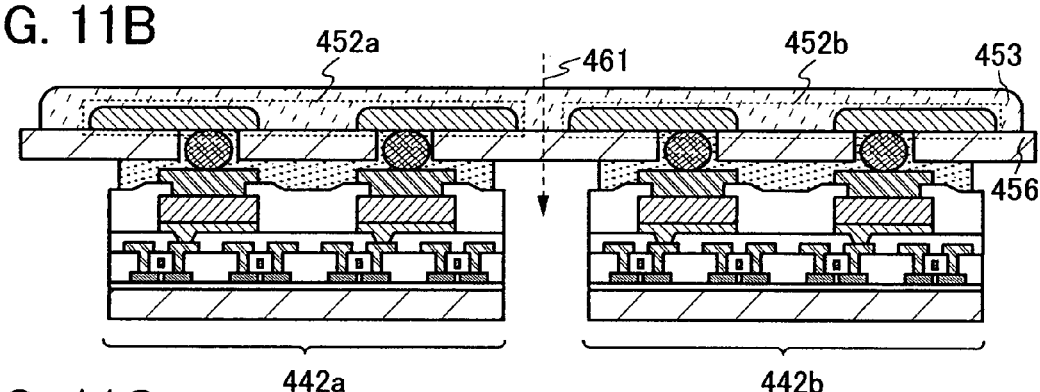
Figure 11C:
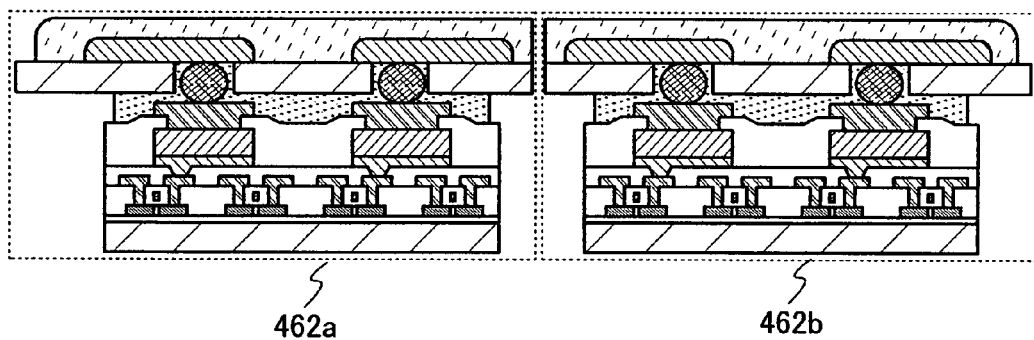

Subsequently, as shown in FIG. 11B, the insulating film 453 and the flexible substrate 456 are cut in a region where the conductive films 452a and 452b functioning as antennas and the thin film integrated circuits 442a and 442b are not formed. Here, they are cut by a laser cut method in which the insulating film 453 and the flexible substrate 456 are irradiated with laser light 461. In accordance with the above steps, semiconductor devices 462a and 462b capable of noncontact data transmission can be manufactured as shown in FIG. 11C.

Figure 11D:
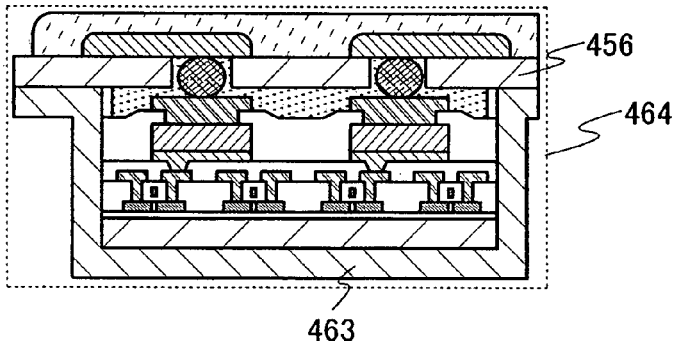

A semiconductor device 464 shown in FIG. 11D may be manufactured in such a way that the flexible substrate 456 having the conductive films 452a and 452b functioning as antennas is attached to the thin film integrated circuits 442a and 442b with the anisotropic conductive adhesives 455a and 455b in FIG. 11A; a flexible substrate 463 is provided so as to seal the flexible substrate 456 and the thin film integrated circuits 442a and 442b; and the region where the conductive films 452a and 452b functioning as antennas and the thin film integrated circuits 442a and 442b are not formed is irradiated with laser light 461 as shown in FIG. 11B. In this case, the thin film integrated circuits are sealed by the cut flexible substrates 456 and 463; therefore, deterioration of the thin film integrated circuits can be suppressed.

In accordance with the above steps, thin and lightweight semiconductor devices can be manufactured with high yield. In addition, since plane orientations of crystals of the semiconductor layers of the thin film transistors in the semiconductor device can be aligned in a specific direction, variation in electrical characteristics of the thin film transistors can be suppressed. Therefore, the semiconductor device with high reliability can be manufactured.

Figure 12:
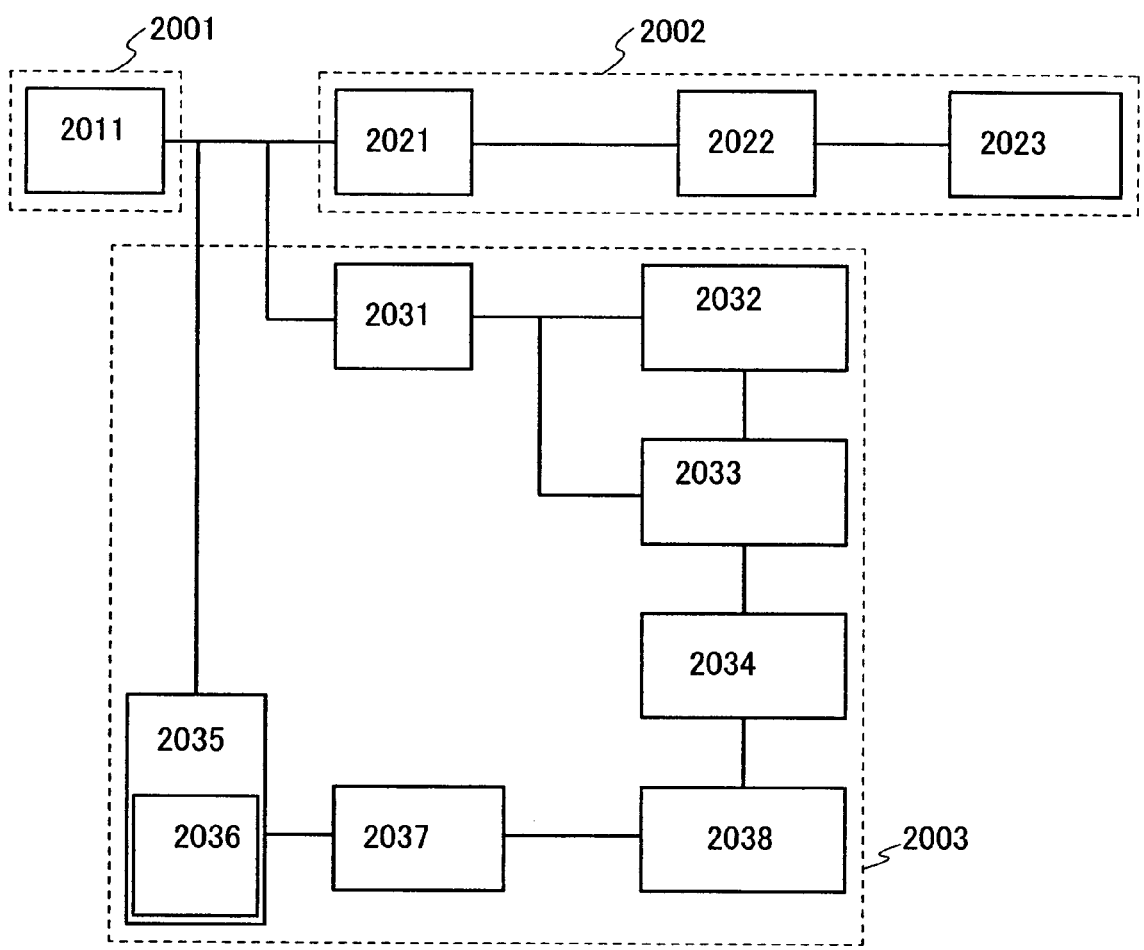
FIG. 12 is a diagram describing a structure of a semiconductor device.
Figure 13A:
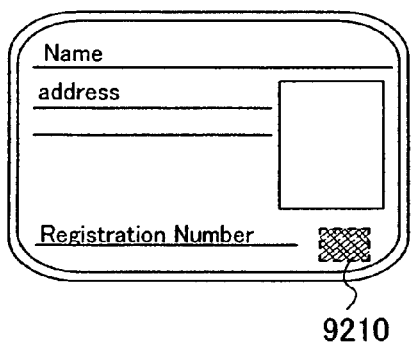
FIGS. 13A to 13F are diagrams describing applications of a semiconductor device of the present invention.
Figure 13B:
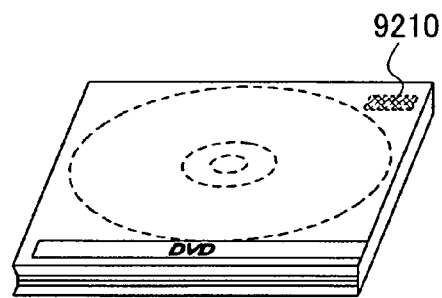
Figure 13C:
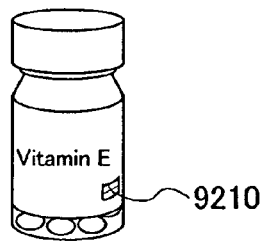
Figure 13D:
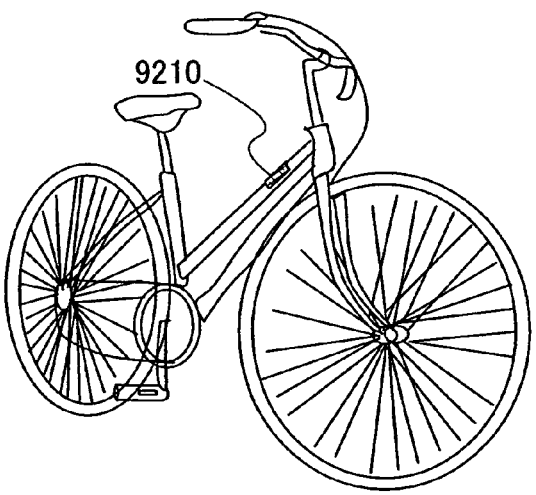
Figure 13E:
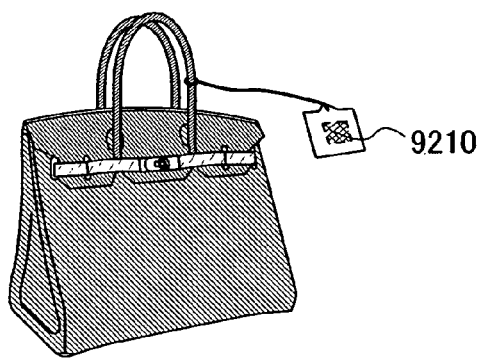
Figure 13F:
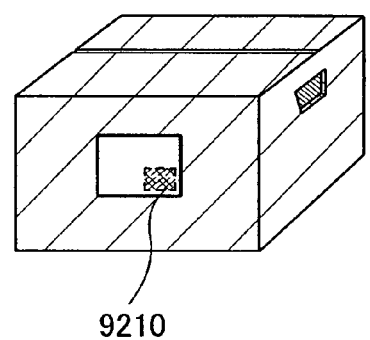

Next, a structure of the semiconductor device capable of noncontact data transmission is explained with reference to FIG. 12. The semiconductor device of Embodiment Mode 4 includes an antenna portion 2001, a power source portion 2002, and a logic portion 2003 as its main components. The antenna portion 2001 includes an antenna 2011 which receives external signals and transmits data. The signal transmission method of the semiconductor device can be any of an electromagnetic coupling method, an electromagnetic induction method, and a microwave method. The transmission method may be selected appropriately in consideration of usage by a practitioner, and an optimum antenna may be provided in accordance with the transmission method.

The power source portion 2002 includes a rectifying circuit 2021 which produces power source based on a signal received from the outside through the antenna 2011; a storage capacitor 2022 for storing the produced power source; and a constant voltage circuit 2023. The logic portion 2003 includes a demodulating circuit 2031 which demodulates a received signal, a clock generating/compensating circuit 2032 which produces a clock signal, a code recognizing and judging circuit 2033, a memory controller 2034 which produces a signal for reading data from a memory based on a received signal, a modulating circuit 2035 for superposing an encoded signal on a received signal, an encoding circuit 2037 which encodes the read data, and a mask ROM 2038 which stores data. The modulating circuit 2035 has a resistor 2036 for modulation.

A code recognized and judged by the code recognition/judgment circuit 2033 is a frame termination signal (EOF, End of Frame), a frame starting signal (SOF, Start of Frame), a flag, a command code, a mask length, a mask value, and the like. The code recognizing/judging circuit 2033 also has a cyclic redundancy check (CRC) function for discriminating transmission errors.

Next, application of the semiconductor device capable of noncontact data transmission is shown in FIGS. 13A to 13F. A semiconductor device 9210 capable of sending data without contact can be applied to various uses, such as bills, coins, securities, bearer bonds, documents (e.g., driver's licenses or resident's cards, see FIG. 13A), packaging containers (e.g., wrapping paper or bottles, see FIG. 13C), storage media (e.g., DVD software or video tapes, see FIG. 13B), vehicles (e.g., bicycles, see FIG. 13D), personal ornaments and accessories (e.g., shoes or glasses), foods, plants, animals, human body, clothing, commodities, or tags on goods such as electronic devices or on bags (see FIGS. 13E and 13F).

The semiconductor device 9210 of Embodiment Mode 4 is fixed to a product by being mounted on a printed board, attached to a surface thereof, embedded therein, and so on. For example, if the product is a book, the semiconductor device is fixed to the book by embedding it inside a paper, and if the product is a package made of an organic resin, the semiconductor device is fixed to the package by embedding it inside the organic resin. Since the semiconductor device 9210 of the present invention can be compact, thin, and lightweight, the design quality of the product itself is not degraded even after the device is fixed to the product.

By providing the semiconductor device 9210 to bills, coins, securities, bearer bonds, documents, and the like, a certification function can be provided and the forgery can be prevented by using the certification function. Moreover, when the semiconductor device of this embodiment mode is provided in containers for package, recording media, personal belongings, foods, clothes, commodities, electronic appliances, and the like, systems such as an inspection system can become more efficient.

Embodiment Mode 5

As an electronic appliance having the semiconductor device shown in any of Embodiment Modes 2 to 4, a television device (also simply called a TV or a television receiver), a digital camera, a digital video camera, a mobile phone device (also simply called a mobile phone appliance or a mobile phone), a mobile information terminal such as a PDA, a mobile game machine, a monitor for a computer, a computer, a sound reproducing device such as a car audio device, an image reproducing device provided with a recording medium, such as a home-use game machine, or the like is given. Specific examples of these are explained with reference to FIGS. 14A to 14F in Embodiment Mode 5.

Figure 14A:
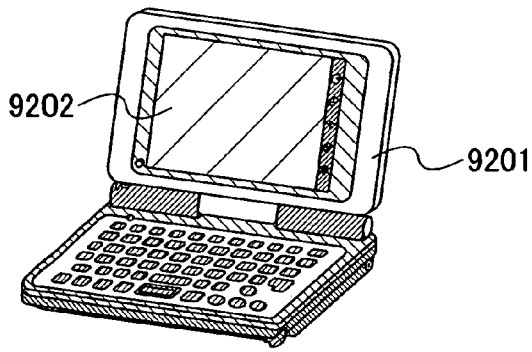
FIGS. 14A to 14F are diagrams describing electronics devices each using a semiconductor device of the present invention.
Figure 14B:
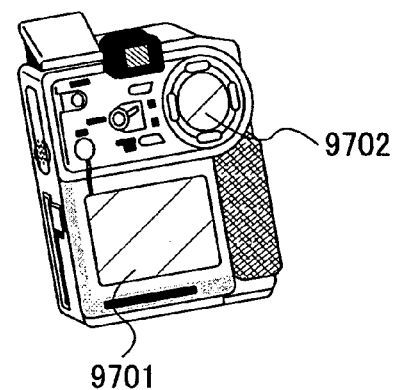
Figure 14C:
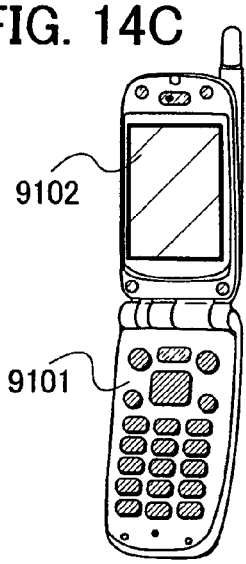

A mobile information terminal shown in FIG. 14A includes a main body 9201, a display portion 9202, and the like. By the use of the semiconductor device shown in Embodiment Mode 2 or 3 for the display portion 9202, the mobile information terminal capable of high-definition display can be provided at low price. A digital video camera shown in FIG. 14B includes a display portion 9701, a display portion 9702, and the like. By the use of the semiconductor device shown in Embodiment Mode 2 or 3 for the display portion 9701, the digital video camera capable of high-definition display can be provided at low price. A mobile terminal shown in FIG. 14C includes a main body 9101, a display portion 9102, and the like. By the use of the semiconductor device shown in Embodiment Mode 2 or 3 for the display portion 9102, the mobile terminal with high reliability can be provided at low price.

Figure 14D:
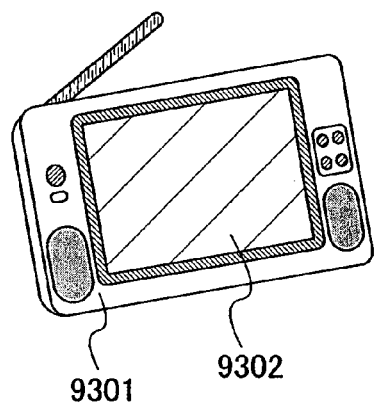

A mobile television device shown in FIG. 14D includes a main body 9301, a display portion 9302, and the like. By the use of the semiconductor device shown in Embodiment Mode 2 or 3 for the display portion 9302, the mobile television device capable of high-definition display can be provided at low price. Such a television device can be widely applied to a small-sized device to be mounted to a mobile terminal such as a mobile phone, a middle-sized device that is portable, and a large-sized device (for example, 40 inches or more).

Figure 14E:
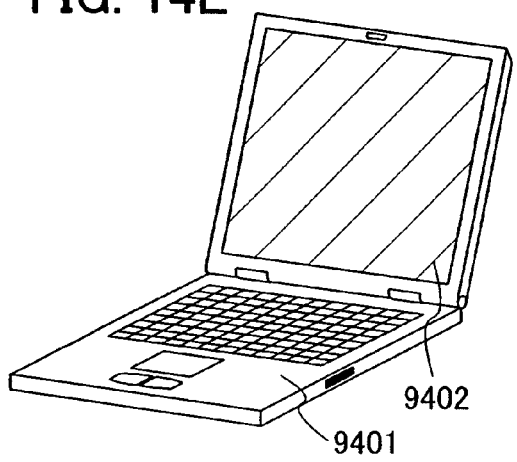
Figure 14F:
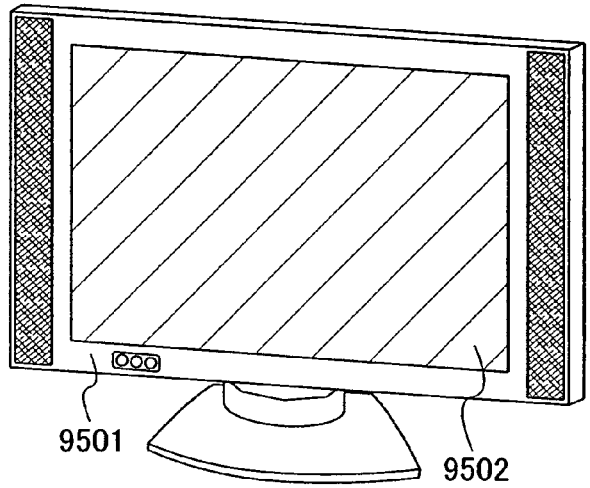

The mobile computer shown in FIG. 14E includes a main body 9401, a display portion 9402, and the like. By the use of the semiconductor device shown in Embodiment Mode 2 or 3 for the display portion 9402, the mobile computer capable of high-definition display can be provided at low price. The television device shown in FIG. 14F includes a main body 9501, a display portion 9502, and the like. By the use of the semiconductor device shown in Embodiment Mode 2 or 3 for the display portion 9502, the television device capable of high-definition display can be provided at low price.

Figure 15:
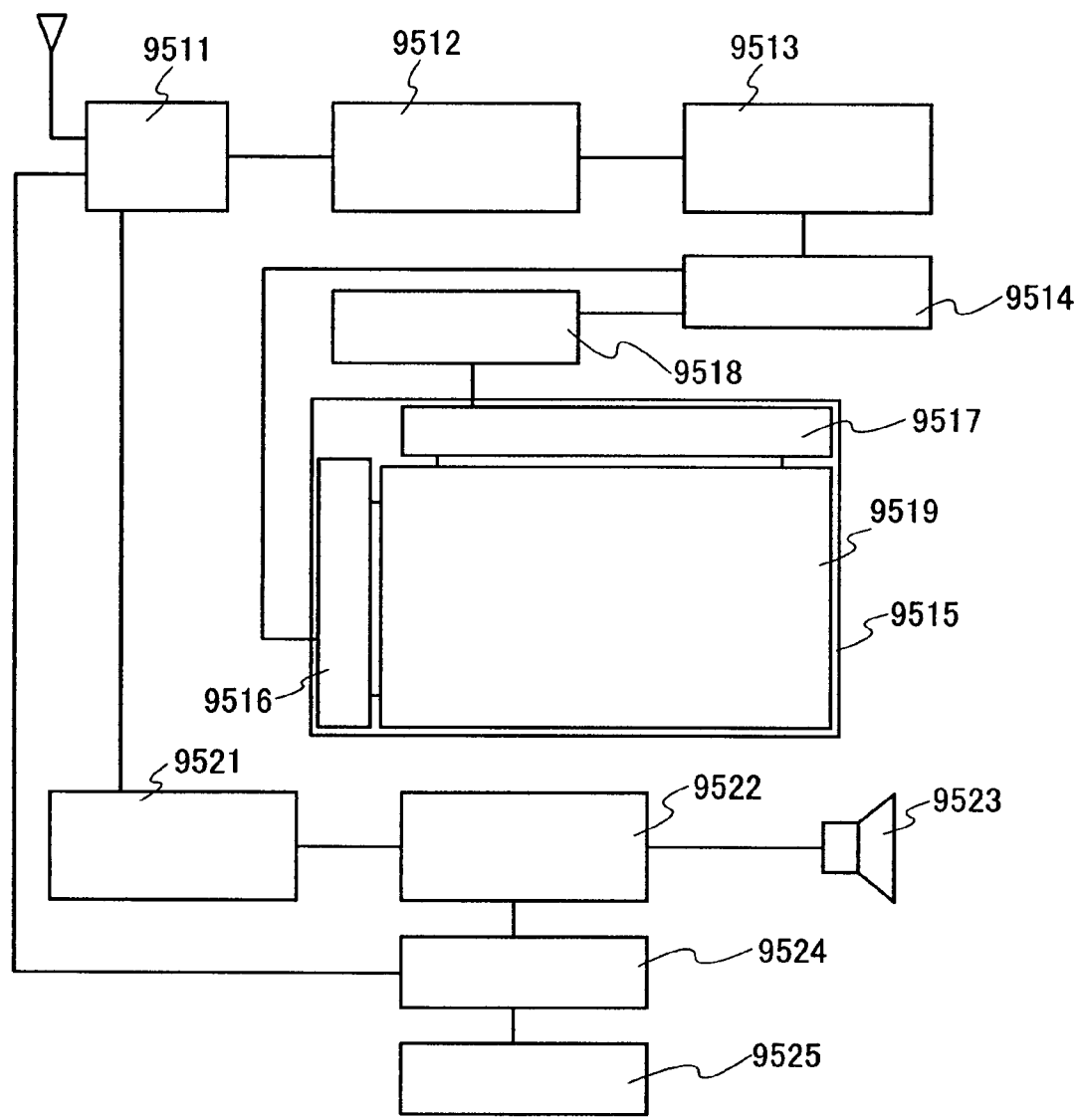
FIG. 15 is a diagram describing a structure of an electronics device using a semiconductor of the present invention.

Here, a structure of the television device is explained with reference to FIG. 15, which is a block diagram showing the main structure of the television device. A tuner 9511 receives a video signal and an audio signal. The video signal is processed through a video detecting circuit 9512, a video signal processing circuit 9513 which converts the signal outputted from the video detecting circuit 9512 into a color signal corresponding to red, green, or blue, and a controlling circuit 9514 which converts the video signal in accordance with input specification of a driver IC.

The controlling circuit 9514 outputs signals to a scanning line driver circuit 9516 and a signal line driver circuit 9517 of a display panel 9515. In a case of digital driving, a signal dividing circuit 9518 may be provided on a signal line side so that the inputted digital signal is divided into m number of signals to be supplied. The scanning line driver circuit 9516 and the signal line driver circuit 9517 are circuits for driving a pixel portion. Among the signals received by the tuner 9511, the audio signal is sent to an audio detecting circuit 9521 and its output is supplied to a speaker 9523 through an audio signal processing circuit 9522. The controlling circuit 9524 receives control information such as a receiving station (receiving frequency) and sound volume, and sends signals to the tuner 9511 and the audio signal processing circuit 9522.

The television device is formed by the inclusion of the display panel 9515; therefore, the television device consumes less electric power and can display high-definition images. The present invention is not limited to the television receiver and is applicable to a display medium particularly with a large area such as an information display board at a railway station, an airport, or the like, or an advertisement display board on the street as well as a monitor of a personal computer.

Figure 16:
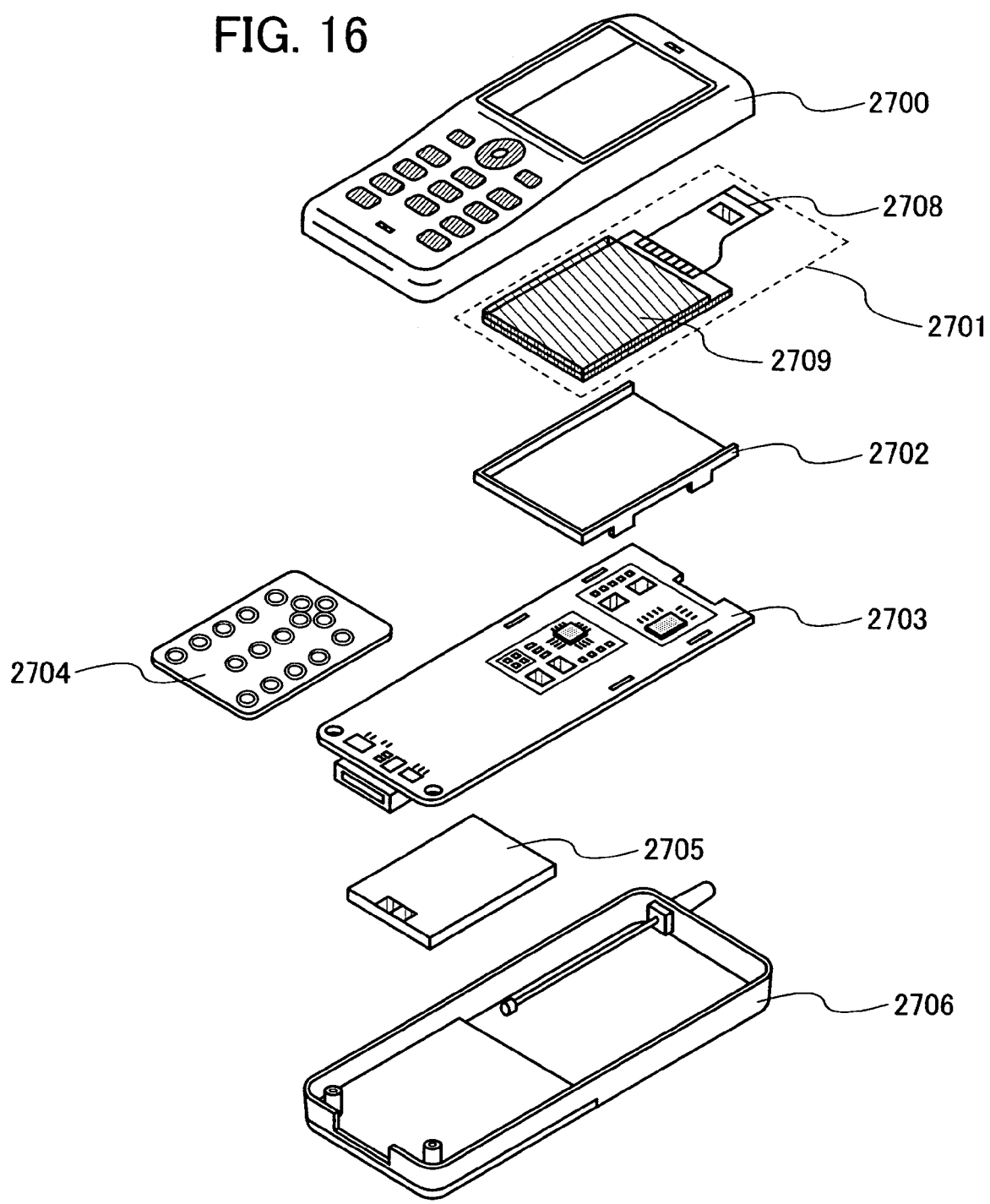
FIG. 16 is a projected view of an electronics device using a semiconductor device of the present invention.

Next, a mobile phone appliance is explained with reference to FIG. 16 as a mode of an electronic appliance with the semiconductor device of the present invention mounted. The mobile phone appliance includes cases 2700 and 2706, a panel 2701, a housing 2702, a printed wiring board 2703, an operation button 2704, and a battery 2705 (see FIG. 16), in which the panel 2701 is detachably incorporated into the housing 2702 and the housing 2702 is fitted into the printed wiring board 2703. The shape and size of the housing 2702 are appropriately changed in accordance with the electronic appliance to which the panel 2701 is incorporated.

A plurality of semiconductor devices that are packaged are mounted on the printed wiring board 2703. The semiconductor device of the present invention can be used as one of them. The semiconductor devices mounted on the printed wiring board 2703 have any function of a controller, a central processing unit (CPU), a memory, a power source circuit, an audio processing circuit, a sending/receiving circuit, and the like.

The panel 2701 is connected to the printed wiring board 2703 with a connection film 2708 interposed therebetween. The panel 2701, the housing 2702, and the printed wiring board 2703 are housed in the cases 2700 and 2706 together with the operation buttons 2704 and the battery 2705. A pixel region 2709 in the panel 2701 is provided so as to be observed through an opening window provided in the case 2700.

In the panel 2701, a pixel portion and a part of a peripheral driver circuit (a driver circuit with low operating frequency among plural driver circuits) may be formed over one substrate by using TFTs whereas another part of a peripheral driver circuit (a driver circuit with high operating frequency among plural driver circuits) may be formed over an IC chip. The IC chip may be mounted on a panel 2701 by COG (Chip On Glass), or the IC chip may be connected to a glass substrate by using TAB (Tape Automated Bonding) or a printed board.

Figure 17A:
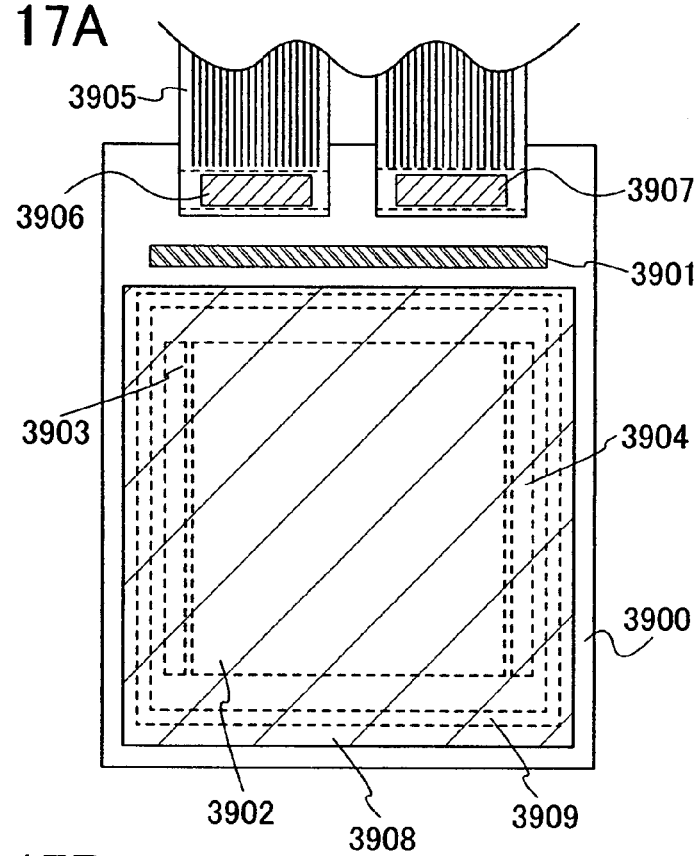
FIGS. 17A and 17B are top views of a semiconductor device of the present invention.

FIG. 17A shows an example of a structure of a panel in which a pixel portion and a part of a peripheral driver circuit are formed over one substrate and an IC chip including the other part of the peripheral driver circuit is mounted by COG or the like. The panel shown in FIG. 17A includes a substrate 3900, a signal line driver circuit 3901, a pixel portion 3902, a scanning line driver circuit 3903, a scanning line driver circuit 3904, an FPC 3905, an IC chip 3906, an IC chip 3907, a sealing substrate 3908, and a sealant 3909. With such a structure, the power consumption of the display device can be reduced, and the mobile phone appliance can be used for a longer period per charge. Moreover, cost reduction of the mobile phone is possible.

Figure 17B:
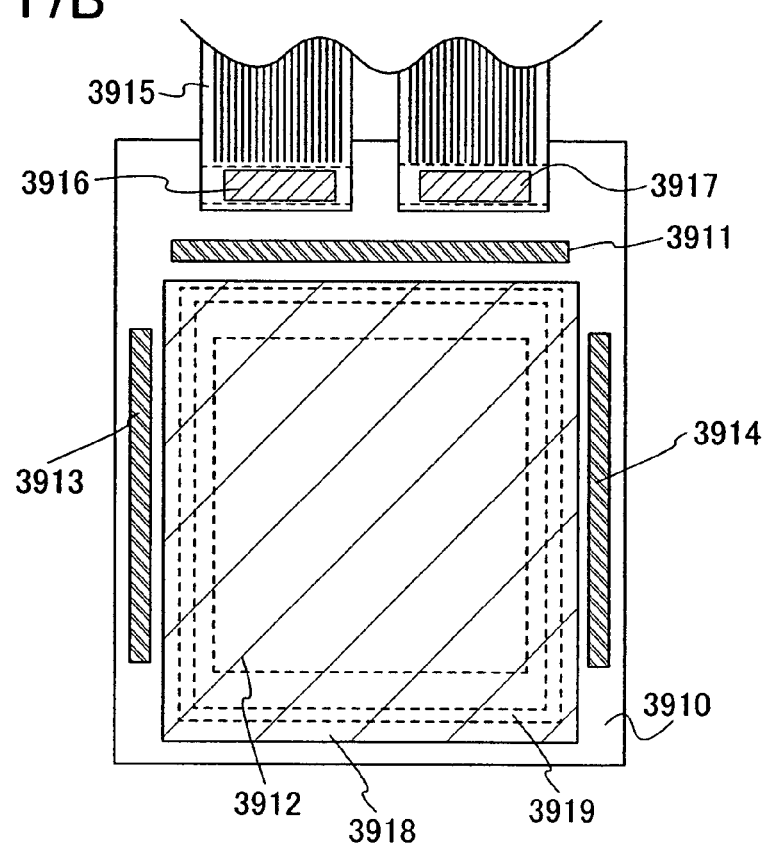

In order to further reduce the power consumption, as shown in FIG. 17B, a pixel portion may be formed over a substrate using TFTs and the entire peripheral driving circuit may be formed over an IC chip, and then the IC chip may be mounted on a display panel by COG (Chip On Glass) or the like. A display panel in FIG. 17B includes a substrate 3910, a signal line driver circuit 3911, a pixel portion 3912, a scanning line driver circuit 3913, a scanning line driver circuit 3914, an FPC 3915, an IC chip 3916, an IC chip 3917, a sealing substrate 3918, and a sealant 3919.

As thus described, the semiconductor device of the present invention is compact, thin, and lightweight. With these features, the limited space in the cases 2700 and 2706 of the electronic appliance can be used efficiently. Moreover, the cost reduction is possible, and an electronic appliance having the semiconductor device with high reliability can be manufactured.

Embodiment 1

The present invention is hereinafter explained in more detail based on the following embodiments. It goes without saying that the present invention is not limited by any of the embodiments, but is specified by the claims. Note that a method for manufacturing a crystalline silicon film according to the present invention and its crystallographic properties are described giving a comparative example in addition to the embodiments.

Figure 1B:
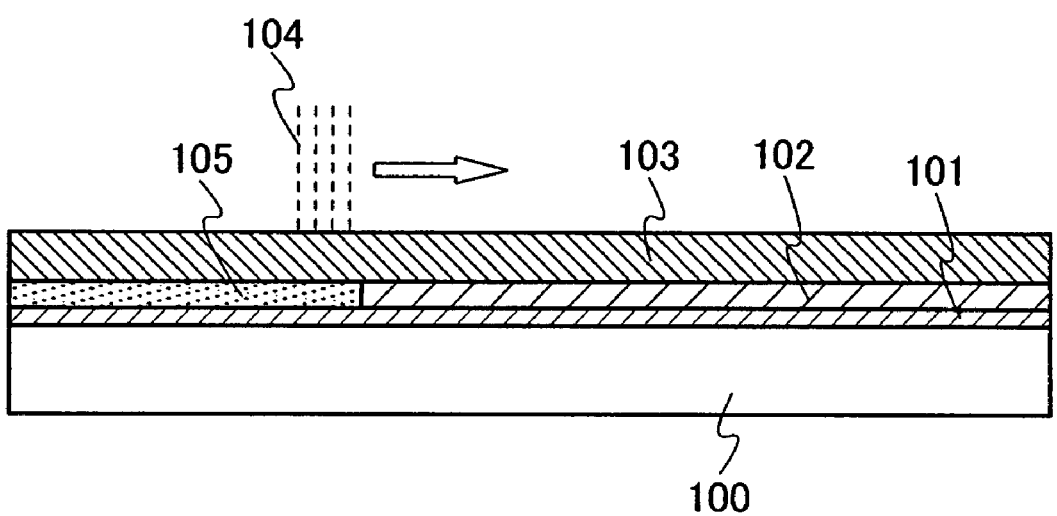
Figure 1C:
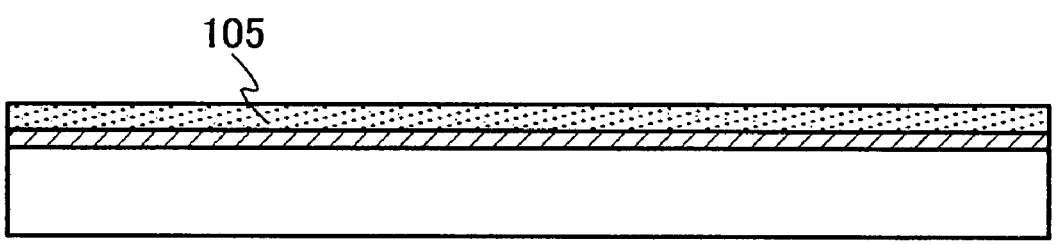

A method for manufacturing a crystalline silicon film of Embodiment 1 is described with reference to FIG. 18. As already described in Embodiment Mode 1 with reference to FIGS. 1A to 1C, the base film (insulating film) 101, the amorphous semiconductor film 102, and the cap film 103 were formed over the substrate 100. As shown in FIG. 1B, the amorphous semiconductor film 102 was irradiated with the laser light 104 through the cap film 103 and was crystallized, thereby forming the crystalline semiconductor film 105. As the substrate 100, a glass substrate having a thickness of 0.7 mm manufactured by Corning, Inc. was used. As the insulating film 101, a stacked film of a silicon nitride film containing oxygen and a silicon oxide film containing nitrogen was formed using a parallel-plate plasma CVD apparatus.

The deposition conditions were as follows.
<Silicon Nitride Film Containing Oxygen>
Thickness: 50 nm
Type of gas (flow rate): $SiH_4$ (10 sccm), $NH_3$ (100 sccm), $N_2O$ (20 sccm), $H_2$ (400 sccm)
Substrate temperature: 300° C.
Pressure: 40 Pa
RF frequency: 27 MHz
RF power: 50 W
Distance between electrodes: 30 mm
Electrode area: 615.75 cm$^2$ <Silicon Oxide Film Containing Nitrogen>
Thickness: 100 nm
Type of gas (flow rate): $SiH_4$ (4 sccm), $N_2O$ (800 sccm)
Substrate temperature: 400° C.
Pressure: 40 Pa
RF frequency: 27 MHz
RF power: 50 W
Distance between electrodes: 15 mm
Electrode area: 615.75 cm$^2$ As the amorphous semiconductor film 102, an amorphous silicon film was formed using a parallel-plate plasma CVD apparatus. The deposition conditions of the amorphous silicon film were as follows.
<Amorphous Silicon Film>
Thickness: 66 nm
Type of gas (flow rate): $SiH_4$ (25 sccm), $H_2$ (150 sccm)
Substrate temperature: 250° C.
Pressure: 66.7 Pa
RF frequency: 27 MHz
RF power: 50 W
Distance between electrodes: 25 mm
Electrode area: 615.75 cm$^2$ After the amorphous semiconductor film was formed under the above-mentioned deposition conditions, it was heated at 500° C. for an hour in an electric furnace, and then at 550° C. for four hours. This heat treatment is treatment for extracting hydrogen from the amorphous silicon film. Hydrogen is extracted in order to prevent a hydrogen gas from spouting from the amorphous silicon film when the amorphous silicon film is irradiated with a laser beam. After the heat treatment, an oxide film formed on the surface of the amorphous semiconductor film 102 was removed by hydrofluoric acid treatment for 70 seconds, and then a silicon nitride film containing oxygen was formed over the amorphous semiconductor film 102 as the cap film 103 by using a parallel-plate plasma CVD apparatus.

The deposition conditions were as follows.
<Silicon Nitride Film Containing Oxygen>
Thickness: 300 nm
Type of gas (flow rate): $SiH_4$ (10 sccm), $NH_3$ (100 sccm), $N_2O$ (20 sccm), $H_2$ (400 sccm)
Substrate temperature: 300° C.
Pressure: 40 Pa
RF frequency: 27 MHz
RF power: 50 W
Distance between electrodes: 30 mm
Electrode area: 615.75 cm$^2$ Table 1 shows compositions of the insulating film (base film) 101 and the cap film 103 obtained. Table 1 also shows a composition of a cap film of a comparative example to be described below. The values of the compositions of the films in Table 1 are those in a state before heat treatment or laser irradiation. The composition ratios were measured using Rutherford backscattering spectrometry (RBS) and hydrogen forward scattering (HFS). The measurement sensitivity was approximately ±2%.

TABLE 1

| MATERIAL | | COMPOSITION RATIO (%) | | | |
|---|---|---|---|---|---|
| | | Si | N | O | H |
| SILICON NITRIDE FILM CONTAINING OXYGEN | CAP FILM OF EMBODIMENT LOWER LAYER OF BASE FILM | 32.2 | 45.5 | 5.2 | 17.2 |

TABLE 1-continued

| MATERIAL | | COMPOSITION RATIO (%) | | | |
|---|---|---|---|---|---|
| | | Si | N | O | H |
| SILICON OXIDE FILM | CAP FILM OF COMPARATIVE EXAMPLE | 32.1 | 0.0 | 66.0 | 1.9 |
| SILICON OXIDE FILM CONTAINING NITROGEN | UPPER LAYER OF BASE FILM | 32.6 | 0.2 | 65.8 | 1.4 |

After the cap film 103 was formed, it was heated at 500° C. for an hour in an electric furnace. This heat treatment is treatment for extracting hydrogen from the silicon nitride film containing oxygen that is the cap film. Hydrogen is extracted in order to prevent a hydrogen gas from spouting from the silicon nitride film containing oxygen when the silicon nitride film containing oxygen is irradiated with a laser beam.

The amorphous silicon film was irradiated with a laser beam from a laser irradiation apparatus through the cap film 103 and was crystallized, thereby forming a crystalline silicon film. Although the laser irradiation apparatus used at that time is already described in Embodiment Mode 1, the brief description thereof is repeated here with reference to FIG. 18. As shown in the FIG. 18, the laser irradiation apparatus includes the two laser oscillators 11a and 11b and can perform irradiation with the laser beam 12 that is obtained by combining the laser beams 12a and 12b emitted from the laser oscillators 11a and 11b, respectively.

The polarization direction of the laser beam 12b emitted from the laser oscillator 11b is changed through the wavelength plate 13. This is in order to combine two laser beams having different polarization directions by the polarizer 14. After the laser beam 12b passes through the wavelength plate 13, the laser beam 12b is reflected by the mirror 22 and made to enter the polarizer 14. Then, the laser beam 12a and the laser beam 12b are combined by the polarizer 14. The wavelength plate 13 and the polarizer 14 are adjusted so that the combined laser beam 12 has suitable energy.

The laser beam 12 that is combined by the polarizer 14 is reflected by the mirror 15, and is shaped so as to have a linear cross section through the cylindrical lens 16 and the cylindrical lens 17. The cylindrical lens 16 acts in a lengthwise direction of a beam spot formed on an irradiation surface, and the cylindrical lens 17 acts in a crosswise direction thereof.

The laser irradiation apparatus includes the suction stage 19 to which the irradiation surface 18 is fixed, and the suction stage 19 can be moved in X-Y directions by the X-axis uniaxial robot 20 and the Y-axis uniaxial robot 21. As discussed above, the substrate 1 over which the insulating film 101, the amorphous semiconductor film 102, and the cap film 103 were formed was fixed to the suction stage 19, and was irradiated with a laser beam while the substrate 1 was moved along a crosswise direction of a beam spot, that is, the X axis with a lengthwise direction of a linear laser beam aligned with the Y axis.

In this embodiment, the movement speed of the substrate was set to 35 cm/sec. An LD excitation YVO$_4$ laser was used as each of the two laser oscillators, and its second harmonic (wavelength: 532 nm) was used for irradiation. The laser beam had an intensity of 14 W on the irradiation surface and had a linear shape on the irradiation surface with a length of approximately 500 μm and a width of approximately 20 μm.

<Measurement of Crystalline Silicon Film>

EBSP measurement was carried out to confirm the position, the size, and the plane orientation of crystal grains of the crystalline silicon film. In order to carry out EBSP measurement, the cap film 103 was removed by etching from the surface of the crystalline silicon film. In the EBSP measurement, the plane orientation of crystal grains was measured from on an EBSP image which is obtained by making an electron beam incident on the surface of the crystalline silicon film at an incidence angle of 60°.

The measurement region was 50 μm×50 μm and the measurement pitch was 0.1 μm. EBSP images of three viewing planes A to C which are perpendicular to each other as shown in FIG. 2 were measured. Vectors a to c in FIG. 2 indicate normal vectors of the viewing planes A to C, respectively. The viewing plane A is parallel to the surface of the substrate, which corresponds to the upper surface of the crystalline silicon film. The viewing plane C is a plane where the normal vector c is parallel to the scan direction of the laser beam. In accordance with pieces of information obtained from these three viewing planes A to C, the plane orientation of the crystalline silicon film can be specified with high accuracy.

FIGS. 19A to 21C show analysis results of plane orientations (crystal axis orientations perpendicular to viewing planes) of the crystalline silicon film. FIGS. 19A to 19C are orientation map images each showing distribution of plane orientation in the measurement area of 50 μm×50 μm. FIG. 19D is an inverse pole figure of single crystal silicon, in which each color indicates orientation.

Although it is difficult to determine from FIGS. 19A to 19C because these figures are monochrome and show only lightness, it is found from color display that orientation is strongly obtained in the orientation of <001> on the viewing plane A, in the orientation of <301> on the viewing plane B, and in the orientation of <301> on the viewing plane C. Further, it is found according to the shape and color of patterns of FIGS. 19A to 19C that the crystalline silicon film of Embodiment 1 is composed of domains each extended long in a columnar shape. In FIGS. 19A to 19C, the length of each domain is 5 μm to 50 μm, and further, a domain having a length of 50 μm or more is also observed.

FIGS. 20A to 20C are inverse pole figures showing distributions of appearance frequency of plane orientation on the viewing planes A to C. FIG. 20D shows a scale of frequency. Although it is difficult to determine from FIGS. 20A to 20D because these figures are also monochrome and show only lightness, it is found from the inverse pole figure of FIG. 20A that the orientation of <001> appears at a frequency 14.0 times or more as high as that of a state in which all directions appear with identical probability on the viewing plane A. In addition, it is found from the inverse pole figure of FIG. 20B that the orientation of <301> is closest to black on the viewing plane B; specifically, the orientation of <301> appears at a frequency 4.8 times or more as high as that of a state in which all orientations appear with identical probability. Further, it is found from the inverse pole figure of FIG. 20C that the orientation of <301> is closest to black on the viewing plane C; specifically, the orientation of <301> appears at a frequency 4.8 times or more as high as that of a state in which all orientations appear with identical probability.

FIGS. 21A to 21C show calculation results of orientation ratios of orientations that have high appearance frequency in the inverse pole figures of FIGS. 20A to 20C. FIG. 21A shows a calculation result of an orientation ratio on the viewing plane A based on FIG. 20A. In the inverse pole figure of FIG. 20A, the range of an angle fluctuation with respect to <001> is set within ±10°, and the orientation ratio was obtained by obtaining a rate of the number of measurement points having the orientation <001> within the range of angle fluctuation ±10° to all of measurement points.

The value of the obtained ratio of points having a specific orientation to all measurement points is a Partition Fraction value. The value of an orientation ratio, to all measurement points, of measurement points having high orienting reliability of the points having a specific orientation is a Total Fraction value. According to the results, it is found that the orientation <001> within the range of angle fluctuation ±10° occupies 71.2% on the viewing plane A of the present invention.

Similarly, FIGS. 21B and 21C show calculation results of orientation ratios of <301> on the viewing planes B and C based on the inverse pole figures of FIGS. 20B and 20C. The orientation ratios were obtained with the range of angle fluctuation with respect to <301> set within ±10°. It is found that the orientation of <301> occupies 71.1% and 73.9% on the viewing planes B and C, respectively. Note that although the ratios of the orientation <301> were obtained on the viewing planes B and C, an orientation ratio of the plane orientation of <401>, <501>, or <601> close to the orientation of <301> may alternatively be obtained.

Comparative Example

As a comparative example, the crystalline silicon film was formed using a different material for the cap film 103. In the comparative example, a silicon oxide film with a thickness of 500 nm was formed as the cap film 103 by using a parallel-plate plasma CVD apparatus. The deposition conditions of the insulating film 101 and the amorphous semiconductor film 102 were the same as those in the embodiment, and specific deposition conditions of the cap film 103 were as follows.
<Silicon Oxide Film>
  Thickness: 500 nm
  Type of gas (flow rate): $SiH_4$ (4 sccm), $N_2O$ (800 sccm)
  Substrate temperature: 400° C.
  Pressure: 40 Pa
  RF frequency: 60 MHz
  RF power: 150 W
  Distance between electrodes: 28 mm
In this comparative example, heat treatment for extracting hydrogen from the amorphous silicon film was carried out similarly to the embodiment. However, heat treatment for extracting hydrogen from the cap film 103 was not carried out because the cap film 103 contained little hydrogen. The intensity of a laser beam used for irradiation was 15 W, and the movement speed of the substrate was 35 cm/sec. Other than that, the crystalline silicon film was formed similar to the embodiment. The crystalline silicon film thus formed was subjected to EBSP measurement similarly to the embodiment. In the comparative example, the measurement area was 100 μm×50 μm, in which measurement was carried out at every lattice point with a pitch of 0.25 μm. Viewing planes A to C were similar to those in Embodiment 1.

Figure 23A:
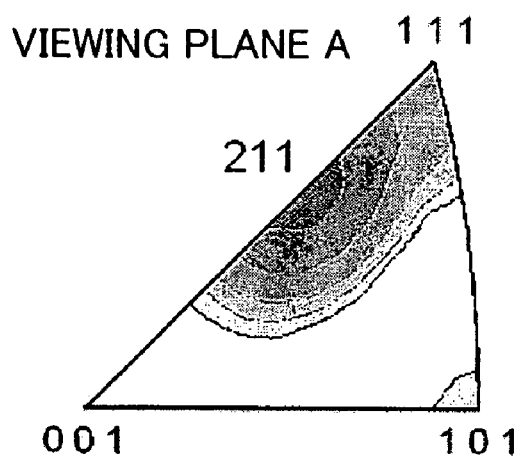
FIGS. 23A to 23D are inverse pole diagrams of a crystalline silicon film of an embodiment obtained by EBSP measurement.
Figure 23B:
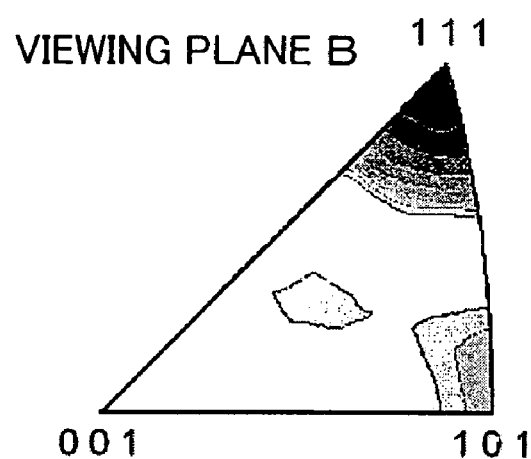
Figure 23C:
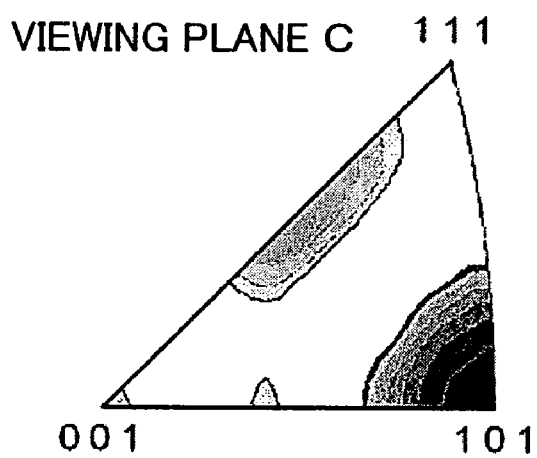
Figure 23D:
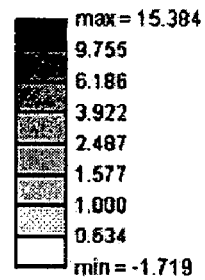

FIGS. 22A to 22C are orientation map diagrams respectively showing plane orientations on the viewing planes A to C; FIGS. 23A to 23C are inverse pole figures; and FIGS. 24A to 24C show calculation results of orientation ratios. FIGS. 23A to 23C are inverse pole figures showing distributions of appearance frequency of plane orientation on the viewing planes A to C shown in FIGS. 22A to 22C. FIG. 23D shows a scale of appearance frequency of plane orientation. Similarly to FIGS. 20A to 20C, FIGS. 23A to 23C show that a region closer to black has a higher rate of crystal grains having plane orientation.

It is found from the inverse pole figure of FIG. 23A that the orientation of <211> is closest to black on the viewing plane A; specifically, the orientation of <211> appears at a frequency 3.9 times or more as high as that of a state in which all orientations appear with identical probability. In addition, it is found from the inverse pole figure of FIG. 23B that the orientation of <111> is closest to black on the viewing plane B; specifically, the orientation of <111> appears at a frequency 9.7 times or more as high as that of a state in which all orientations appear with identical probability.

It is further found from the inverse pole figure of FIG. 23C that the orientation of <101> is closest to black on the viewing plane C; specifically, the orientation <101> appears at a frequency 9.7 times or more as high as that of a state in which all orientations appear with identical probability. A colored region in FIG. 24A is a region showing crystal grains having the orientation of <211> within the range of angle fluctuation of ±10°. A colored region in FIG. 24B is a region showing crystal grains having the orientation of <111> within the range of angle fluctuation of ±10°. A colored region in FIG. 24C is a region showing crystal grains having the orientation of <101> within the range of angle fluctuation between ±10°.

In the comparative example, as can be seen in FIGS. 23A to 23C, orientation was strongly obtained in the orientations of <211>, <111>, and <101> on the viewing planes A, B, and C, respectively. As can be seen in FIGS. 24A to 24C, the orientation ratio of <211> on the viewing plane A was 42.1%; that of <111> on the viewing plane B, 41.2%; and that of <101> on the viewing plane C, 52.3%. Note that a family of equivalent plane orientations of crystal grains such as [101], [001], and [110] are collectively referred to as <101>.

(Comparison Between Embodiment and Comparative Example)

A comparison between the orientation map images of FIGS. 19A to 19C and those of FIGS. 22A to 22C shows that each of the embodiment and the comparative example is composed of domains each extended long in a columnar shape, but the size (length, width) of a crystal grain of the embodiment is significantly larger. Further, the calculation results of the orientation ratios of the viewing planes A to C in the embodiment and the comparative example, which are shown in FIGS. 21A to 21C and FIGS. 24A to 24C, are arranged in Table 2.

As can be seen in Table 2, the plane orientation with high appearance frequency on each of the viewing planes A to C is different between the embodiment and the comparative example. It is found that in the embodiment, the plane orientation is aligned in one direction at a significantly high rate as high as 70% or more on each of the three viewing planes. In other words, it is found that a crystalline semiconductor, in which the plane orientation of crystal grains can be considered to be aligned in one direction, is formed in a crystallized region.

TABLE 2

| | | ORIENTATION | ORIENTATION RATIO (%) |
|---|---|---|---|
| VIEWING PLANE A | EMBODIMENT | <001> | 71.2 |
| | COMPARATIVE EXAMPLE | <211> | 42.1 |
| VIEWING PLANE B | EMBODIMENT | <301> | 71.1 |
| | COMPARATIVE EXAMPLE | <111> | 41.2 |
| VIEWING PLANE C | EMBODIMENT | <301> | 73.9 |
| | COMPARATIVE EXAMPLE | <101> | 52.3 |

Embodiment 2

This embodiment describes orientation ratios of the plane orientation <301> and other plane orientations on the viewing planes B and C of the sample described in Embodiment 1, with reference to FIGS. 25A to 26H. FIGS. 25A to 25D are orientation map images showing distributions of the orientations of <601>, <501>, <401>, and <301> in the measurement area of 50 μm×50 μm on the viewing plane B, respectively. Each map diagram has a length of 50 μm on each side. Note that the measurement pitch was 0.1 μm. In FIGS. 25A to 25D, a crystalline silicon film having plane orientations of <601>, <501>, <401>, and <301> is formed in colored portions, respectively.

Colored regions in FIGS. 25E to 25H are regions showing crystal grains having the orientations of <601>, <501>, <401>, and <301> with the range of angle fluctuation between ±10° or less, respectively. FIGS. 25E to 25H show calculation results of orientation ratios of the plane orientations. Each orientation ratio was obtained by obtaining a rate of the number of measurement points having each orientation with the range of angle fluctuation between ±10° or less. The value of the obtained rate of points having a specific orientation to all measurement points is a Partition Fraction value. The value of an orientation ratio, to all measurement points, of measurement points having high orienting reliability of the points having a specific orientation is a Total Fraction value.

Table 3 shows orientation ratios of the plane orientations. Note that the ratios are rounded off to the nearest whole number. Table 3 shows that each of the orientation ratios of the plane orientations of <601>, <501>, <401>, and <301> of crystal grains on the viewing plane B is 60% or more.

TABLE 3

| | PLANE ORIENTATION | | | |
|---|---|---|---|---|
| | <601> | <501> | <401> | <301> |
| ORIENTATION RATIO | 66% | 68% | 72% | 71% |

FIGS. 26A to 26D are orientation map images showing distributions of plane orientations of <601>, <501>, <401>, and <301> in the measurement area of 50 μm×50 μm on the viewing plane C, respectively. Each map image has a length of 50 μm on each side. Note that the measurement pitch was 0.1 μm. In FIGS. 26A to 26D, a crystalline silicon film having plane orientations of <601>, <501>, <401>, and <301> is formed in colored portions, respectively.

Colored regions in FIGS. 26E to 26H are regions showing crystal grains having the orientations of <601>, <501>, <401>, and <301> with the range of angle fluctuation between ±10° or less, respectively. FIGS. 26E to 26H show calculation results of orientation ratios of the plane orientations. Each orientation ratio was obtained by obtaining a rate of the number of measurement points having each orientation with the range of angle fluctuation between ±10° or less. Table 4 shows orientation ratios of the plane orientations. Note that the ratios have been rounded off to the nearest whole number.

TABLE 4

| | PLANE ORIENTATION | | | |
|---|---|---|---|---|
| | <601> | <501> | <401> | <301> |
| ORIENTATION RATIO | 69% | 72% | 75% | 74% |

Table 4 shows that each of the orientation ratios of the plane orientations of <601>, <501>, <401>, and <301> on the viewing plane C is 60% or more. From the foregoing, it is found that each of the orientation ratios of the plane orientations of <601>, <501> and <401> other than <301> is also 60% or more on the viewing planes B and C.

Embodiment 3

This embodiment describes an orientation ratio of plane orientation of a crystalline silicon film which is formed with the energy and scan speed of the laser beam and the thickness of the cap film different from those in Embodiment 1, with reference to FIGS. 27 and 28A to 28G.

First, a method for manufacturing a crystalline silicon film of Embodiment 3 is described with reference to FIG. 18. A stacked film of a silicon nitride film containing oxygen and a silicon oxide film containing nitrogen, which is the insulating film 101, was formed by using a parallel-plate plasma CVD apparatus over a substrate similar to the substrate described in Embodiment 1 under conditions similar to those in Embodiment 1. Next, an amorphous silicon film was formed as the amorphous semiconductor film 102 by using a parallel-plate plasma CVD apparatus under conditions similar to those in Embodiment 1.

Next, the substrate was heated at 500° C. for an hour in an electric furnace. After the heat treatment, an oxide film formed on the surface of the amorphous semiconductor film 102 due to heating was removed by hydrofluoric acid treatment. The hydrofluoric acid treatment was performed for 90 seconds. After that, a silicon nitride film containing oxygen was formed over the amorphous semiconductor film 102 as the cap film 103 by using a parallel-plate plasma CVD apparatus.

The deposition conditions were as follows. Note that the deposition conditions except for the thickness were similar to those in Embodiment 1.
<Silicon Nitride Film Containing Oxygen>
  Thickness: 400 nm
  Type of gas (flow rate): $SiH_4$ (10 sccm), $NH_3$ (100 sccm), $N_2O$ (20 sccm), $H_2$ (400 sccm)
  Substrate temperature: 300° C.
  Pressure: 40 Pa
  RF frequency: 27 MHz
  RF power: 50 W
  Distance between electrodes: 30 mm
  Electrode area: 615.75 $cm^2$ After the cap film 103 was formed, it was heated at 600° C. for four hours in an electric furnace. This heat treatment is treatment for extracting hydrogen from the silicon nitride film containing oxygen that is the cap film. Hydrogen is extracted in order to prevent a hydrogen gas from spouting from the silicon nitride film containing oxygen when the silicon nitride film containing oxygen is irradiated with a laser beam. The heat treatment may be omitted if the cap film contains little hydrogen.

The amorphous silicon film was irradiated with a laser beam through the cap film 103 by using a laser irradiation apparatus and was crystallized, thereby forming a crystalline silicon film. In this embodiment, the movement speed of the substrate was set to 20 cm/sec. An LD excitation $YVO_4$ laser was used as each of the two laser oscillators, and its second harmonic (wavelength: 532 nm) was used for irradiation. The laser beam had an intensity of 8.4 W on the irradiation surface and had a linear shape on the irradiation surface with a length of approximately 500 μm and a width of approximately 20 μm.

<Measurement of Crystalline Silicon Film>

EBSP measurement was carried out to confirm the position, the size, and the plane orientation of crystal grains of the crystalline silicon film. In order to carry out EBSP measurement, the cap film 103 was removed by etching from the surface of the crystalline silicon film. In the EBSP measurement, an EBSP image was obtained by making an electron beam incident on the surface of the crystalline silicon film at an incidence angle of 60°. The plane orientation of crystal grains was measured from the EBSP image obtained. The measurement area was 50 μm×50 μm and the measurement pitch was 0.5 μm. EBSP images of three viewing planes A to C which are perpendicular to each other as shown in FIG. 2 were measured.

Figure 27:
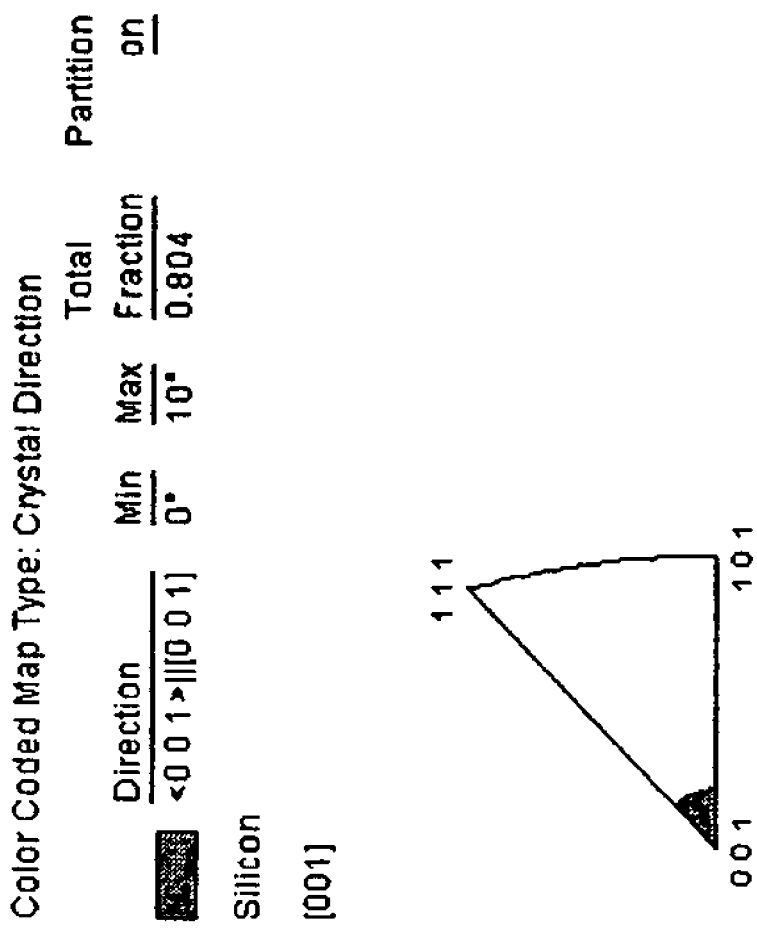
FIG. 27 is a diagram showing an orientation ratio of a crystalline silicon film of an embodiment obtained by EBSP measurement.

FIGS. 27 to 30F show analysis results of plane orientations (crystal axis orientations perpendicular to viewing planes) of the crystalline silicon film. FIG. 27 shows a calculation result of an orientation ratio of a plane orientation which has high appearance frequency in an inverse pole figure (not shown) showing distribution of appearance frequency of plane orientation on the viewing plane A. Note that a colored region is a region showing crystal grains having the orientation of <101> with the range of angle fluctuation between ±10° or less. FIG. 27 shows that the orientation of <001> within the range of angle fluctuation of ±10° occupies 80%, i.e., 60% or more on the viewing plane A of this embodiment.

Figure 28A:
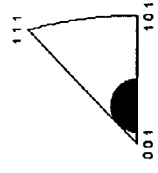
FIGS. 28A to 28G are diagrams showing orientation ratios of a crystalline silicon film of an embodiment obtained by EBSP measurement.
Figure 28B:
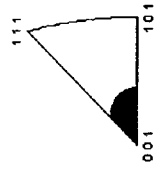
Figure 28C:
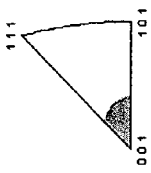
Figure 28D:
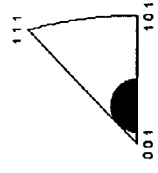
Figure 28E:
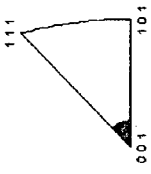
Figure 28F:
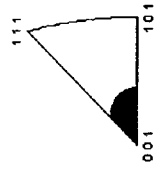
Figure 28G:
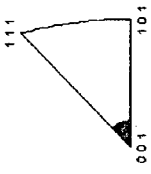

Each of FIGS. 28A to 28G shows a calculation result of an orientation ratio of a plane orientation which has high appearance frequency in an inverse pole figure (not shown) showing distribution of appearance frequency of plane orientation on the viewing plane B. In FIG. 28A, a colored region is a region showing crystal grains having the plane orientation <001> with the range of angle fluctuation between ±10° or less, and an orientation ratio of crystal grains having the plane orientation <001> is shown. In FIG. 28B, a colored region is a region showing crystal grains having the plane orientation <601> with the range of angle fluctuation between ±10° or less, and an orientation ratio of crystal grains having the plane orientation <601> is shown. In FIG. 28C, a colored region is a region showing crystal grains having the plane orientation <501> with the range of angle fluctuation between ±10° or less, and an orientation ratio of crystal grains having the plane orientation of <501> is shown. In FIG. 28D, a colored region is a region showing crystal grains having the plane orientation <401> with the range of angle fluctuation between ±10° or less, and an orientation ratio of crystal grains having the plane orientation <401> is shown. In FIG. 28E, a colored region is a region showing crystal grains having the plane orientation <301> within the range of angle fluctuation between ±10° or less, and an orientation ratio of crystal grains having the plane orientation <301> is shown. In FIG. 28F, a colored region is a region showing crystal grains having the plane orientation of <201> within the range of angle fluctuation between ±10° or less, and an orientation ratio of crystal grains having the plane orientation <201> is shown. In FIG. 28G, a colored region is a region showing crystal grains having the plane orientation <101> within the range of angle fluctuation between ±10° or less, and an orientation ratio of crystal grains having the plane orientation <101> is shown. The orientation ratios of the plane orientations are arranged in Table 5. Note that the ratios have been rounded off to the nearest whole number.

TABLE 5

| | PLANE ORIENTATION | | | | | | |
|---|---|---|---|---|---|---|---|
| | <001> | <601> | <501> | <401> | <301> | <201> | <101> |
| ORIENTATION RATIO | 0% | 27% | 35% | 39% | 47% | 69% | 0% |

Figure 29A:
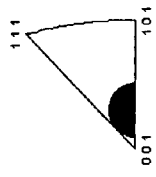
FIGS. 29A to 29G are diagrams showing orientation ratios of a crystalline silicon film of an embodiment obtained by EBSP measurement.
Figure 29B:
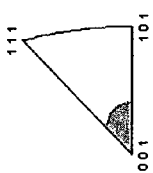
Figure 29C:
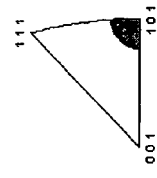
Figure 29D:
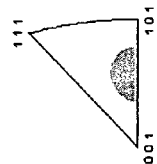
Figure 29E:
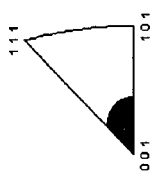
Figure 29F:
Figure 29G:
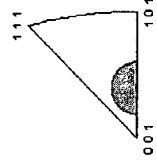

Each of FIGS. 29A to 29G shows a calculation result of an orientation ratio of a plane orientation which has high appearance frequency in an inverse pole figure (not shown) showing distribution of appearance frequency of plane orientation on the viewing plane C. In FIG. 29A, a colored region is a region showing crystal grains having the plane orientation <001> within the range of angle fluctuation between ±10° or less, and an orientation ratio of crystal grains having the plane orientation <001> is shown. In FIG. 29B, a colored region is a region showing crystal grains having the plane orientation <601> within the range of angle fluctuation between ±10° or less, and an orientation ratio of crystal grains having the plane orientation <601> is shown. In FIG. 29C, a colored region is a region showing crystal grains having the plane orientation <501> within the range of angle fluctuation between ±10° or less, and an orientation ratio of crystal grains having the plane orientation <501> is shown. In FIG. 29D, a colored region is a region showing crystal grains having the plane orientation <401> within the range of angle fluctuation between ±10° or less, and an orientation ratio of crystal grains having the plane orientation <401> is shown. In FIG. 29E, a colored region is a region showing crystal grains having the plane orientation <301> within the range of angle fluctuation between ±10° or less, and an orientation ratio of crystal grains having the plane orientation <301> is shown. In FIG. 29F, a colored region is a region showing crystal grains having the plane orientation <201> within the range of angle fluctuation between ±10° or less, and an orientation ratio of crystal grains having the plane orientation <201> is shown. In FIG. 29G, a colored region is a region showing crystal grains having the plane orientation <101> within the range of angle fluctuation between ±10° or less, and an orientation ratio of crystal grains having the plane orientation <101> is shown. The orientation ratios of the plane orientations are arranged in Table 6. Note that the ratios have been rounded off to the nearest whole number.

TABLE 6

| | PLANE ORIENTATION | | | | | | |
|---|---|---|---|---|---|---|---|
| | <001> | <601> | <501> | <401> | <301> | <201> | <101> |
| ORIENTATION RATIO | 0% | 33% | 39% | 41% | 48% | 82% | 0% |

The sum of the orientation ratios of the plane orientations <001>, <601>, <501>, <401>, <301>, <201>, and <101> shown in Table 5 is 218.3%. The sum of the orientation ratios of the plane orientations <001>, <601>, <501>, <401>, <301>, <201>, and <101> shown in Table 6 is 244.4%. FIGS. 30A to 30F show calculation results of orientation ratios obtained regarding each of overlaps between the plane orientations <001>, <601>, <501>, <401>, <301>, <201>, and <101> as an orientation ratio only of any one of the plane orientations.

Note that the sum of orientation ratios of all of <001>, <601>, <501>, <401>, <301>, <201>, and <101>, each of which is calculated regarding each of overlaps between the plane orientations <001>, <601>, <501>, <401>, <301>, <201>, and <101> as an orientation ratio only in any one of the plane orientations, is denoted by <x01> (x=0, 1, 2, 3, 4, 5, 6) as described above.

FIG. 30A is an orientation map image showing distribution of the plane orientation <001> in the measurement area of 50 μm×50 μm on the viewing plane A. FIG. 30B is an orientation map image showing distribution of the plane orientations <001>, <601>, <501>, <401>, <301>, <201>, and <101> in the measurement area of 50 μm×50 μm on the viewing plane B. FIG. 30C is an orientation map image showing distribution of the plane orientations <001>, <601>, <501>, <401>, <301>, <201>, and <101> in the measurement area of 50 μm×50 μm on the viewing plane C. Each map diagram has a length of 50 μm on each side.

In FIG. 30A, a crystalline silicon film having the plane orientation <001> is formed in a colored portion. In each of FIGS. 30B and 30C, a crystalline silicon film having the plane orientations <001>, <601>, <501>, <401>, <301>, <201>, and <101> is formed in a colored portion.

FIG. 30D shows a calculation result of an orientation ratio of crystal grains having the plane orientation <001> on the viewing plane A, in which a colored region is a region showing crystal grains having the plane orientation <001> with the range of angle fluctuation between +10° or less.

FIG. 30E shows calculation results of orientation ratios of crystal grains having the plane orientations <001>, <601>, <501>, <401>, <301>, <201>, and <101> on the viewing plane B. The whole region of the colored regions is a region showing crystal grains having the plane orientation <x01> (x=0, 1, 2, 3, 4, 5, 6) with the range of angle fluctuation between ±10° or less. The regions have different colors according to the value of x to differentiate regions corresponding to the plane orientations <001>, <601>, <501>, <401>, <301>, <201>, and <101>. Here, an overlap between the plane orientations is excluded.

FIG. 30F shows calculation results of orientation ratios of crystal grains having the plane orientations <001>, <601>, <501>, <401>, <301>, <201>, and <101> on the viewing plane C. The whole region of the colored regions is a region showing crystal grains having the plane orientation <x01> (x=0, 1, 2, 3, 4, 5, 6) with the range of angle fluctuation between ±10° or less. Similarly to FIG. 30E, regions corresponding to the plane orientations are differentiated according to the value of x.

Table 7 shows orientation ratios of the plane orientations and orientation ratios of <x01> (x=0, 1, 2, 3, 4, 5, 6) (i.e., the sum of orientation ratios in the orientations <001>, <601>, <501>, <401>, <301>, <201>, and <101> excluding an overlap) on the viewing planes A to C. Note that the ratios have been rounded off to the nearest whole number.

TABLE 7

| VIEWING PLANE A | <001> 80% | | | | | | | |
|---|---|---|---|---|---|---|---|---|
| VIEWING PLANE B | <001> 0% | <601> 0% | <501> 0% | <401> 0% | <301> 39% | <201> 41% | <101> 0% | <x01> 82% |
| VIEWING PLANE C | <001> 0% | <601> 0% | <501> 0% | <401> 0% | <301> 41% | <201> 48% | <101> 0% | <x01> 89% |

Table 7 shows that the orientation of <001> within the range of angle fluctuation of ±10° occupies 60% or more of plane orientations of crystal grains on the viewing plane A. In addition, it shows that <x01> (x=0, 1, 2, 3, 4, 5, 6) occupies 60% or more on the viewing plane B. Further, it shows that <x01> (x=0, 1, 2, 3, 4, 5, 6) occupies 60% or more on the viewing plane C. Furthermore, it shows that an orientation ratio of <x01> (x=0, 2, 3, 4, 5, 6) excluding a plane orientation when x is 1 also occupies 60% or more on each of the viewing planes B and C.

Embodiment 4

This embodiment describes an orientation ratio of plane orientation of a crystalline silicon film which is formed with the energy and scan speed of the laser beam and the thickness of the cap film different from those in Embodiment 1, with reference to FIGS. 31A to 31F.

First, a method for manufacturing a crystalline silicon film of Embodiment 4 is described with reference to FIG. 18. A stacked film of a silicon nitride film containing oxygen and a silicon oxide film containing nitrogen, which is the insulating film 101, was formed by using a parallel-plate plasma CVD apparatus over a substrate similar to the substrate described in Embodiment 1 under conditions similar to those in Embodiment 1. Next, an amorphous silicon film was formed by using a parallel-plate plasma CVD apparatus as the amorphous semiconductor film 102 under conditions similar to those in Embodiment 1. After the formation, an amorphous semiconductor film was formed under the above-described deposition conditions and then heated at 500° C. for an hour in an electric furnace and further at 550° C. for four hours.

Next, an oxide film formed on the surface of the amorphous semiconductor film 102 due to heating was removed by hydrofluoric acid treatment. The hydrofluoric acid treatment was performed for 90 seconds. After that, an oxide film was formed on the amorphous semiconductor film 102 using an aqueous solution including ozone, and the oxide film was removed by hydrofluoric acid treatment. This is in order to fully remove an impurity on the surface of the amorphous silicon film. The treatment with the aqueous solution including ozone was performed for 40 seconds, and the hydrofluoric acid treatment was performed for 90 seconds. Next, a silicon nitride film containing oxygen was formed over the amorphous semiconductor film 102 as the cap film 103 by using a parallel-plate plasma CVD apparatus.

The deposition conditions were as follows. Note that the deposition conditions except for the thickness were similar to those in Embodiment 1.

<Silicon Nitride Film Containing Oxygen>
Thickness: 400 nm
Type of gas (flow rate): $SiH_4$ (10 sccm), $NH_3$ (100 sccm), $N_2O$ (20 sccm), $H_2$ (400 sccm)
Substrate temperature: 300° C.
Pressure: 40 Pa
RF frequency: 27 MHz
RF power: 50 W
Distance between electrodes: 30 mm
Electrode area: 615.75 $cm^2$ After the cap film 103 was formed, it was heated at 600° C. for four hours in an electric furnace. This heat treatment is treatment for extracting hydrogen from the silicon nitride film containing oxygen that is the cap film. Hydrogen is extracted in order to prevent a hydrogen gas from spouting from the silicon nitride film containing oxygen when the silicon nitride film containing oxygen is irradiated with a laser beam.

The amorphous silicon film was irradiated with a laser beam through the cap film 103 by using a laser irradiation apparatus and was crystallized, thereby forming a crystalline silicon film. In this embodiment, the movement speed of the substrate was set to 10 cm/sec. An LD excitation $YVO_4$ laser was used as each of the two laser oscillators, and its second harmonic (wavelength: 532 nm) was used for irradiation. The laser beam had an intensity of 6.4 W on the irradiation surface and had a linear shape on the irradiation surface with a length of approximately 500 μm and a width of approximately 20 μm.

<Measurement of Crystalline Silicon Film>

EBSP measurement was carried out to confirm the position, the size, and the plane orientation of crystal grains of the crystalline silicon film. In order to carry out EBSP measurement, the cap film 103 was removed by etching from the surface of the crystalline silicon film. In the EBSP measurement, an EBSP image was obtained by making an electron beam incident on the surface of the crystalline silicon film at an incidence angle of 60°. The plane orientation of crystal grains was measured from the EBSP image obtained.

The measurement area was 50 μm×50 μm and the measurement pitch was 0.5 μm. EBSP images of three viewing planes A to C which are perpendicular to each other as shown in FIG. 2 were measured. FIGS. 31A to 31F show analysis results of plane orientations (crystal axis orientations perpendicular to viewing planes) of the crystalline silicon film.

FIG. 31A is an orientation map image showing distribution of the plane orientation <001> in the measurement area of 50 μm×50 μm on the viewing plane A. FIG. 31B is an orientation map image showing distribution of the plane orientations <001>, <301>, <201>, and <101> in the measurement area of 50 μm×50 μm on the viewing plane B. FIG. 31C is an orientation map image showing distribution of the plane orientations <001>, <301>, <201>, and <101> in the measurement area of 50 μm×50 μm on the viewing plane C. Each map image has a length of 50 μm on each side.

In FIG. 31A, a crystalline silicon film having the plane orientation <001> is formed in a colored portion. In each of FIGS. 31B and 31C, a crystalline silicon film having the plane orientations <001>, <301>, <201>, and <101> is formed in a colored portion.

FIG. 31D shows a calculation result of an orientation ratio of crystal grains having the plane orientation <001> on the viewing plane A, in which a colored region is a region showing crystal grains having the plane orientation <001> with the range of angle fluctuation between ±10° or less.

FIG. 31E shows calculation results of orientation ratios of crystal grains having the plane orientations <001>, <301>, <201>, and <101> on the viewing plane B. The whole region of the colored regions is a region showing crystal grains having the plane orientation <x01> (x=0, 1, 2, 3) with the range of angle fluctuation between ±10° or less. The regions have different colors according to the value of x to differentiate regions corresponding to the plane orientations <001>, <301>, <201>, and <101>. Here, an overlap between plane orientations is excluded.

FIG. 31F shows calculation results of orientation ratios of crystal grains having the plane orientations <001>, <301>, <201>, and <101> on the viewing plane C. The whole region of the colored regions is a region showing crystal grains having the plane orientation <x01> (x=0, 1, 2, 3) within the range of angle fluctuation between ±10° or less. Similarly to FIG. 31E, regions corresponding to the plane orientations are differentiated according to the value of x.

Table 8 shows orientation ratios of plane orientations on the viewing planes A to C and orientation ratios of <x01> (x=0, 1, 2, 3) (i.e., the sum of orientation ratios in the orientations <001>, <301>, <201>, and <101> excluding an overlap) on the viewing planes B and C. Note that the ratios have been rounded off to the nearest whole number.

TABLE 8

| | | | | | |
|---|---|---|---|---|---|
| VIEWING PLANE A | <001> 76% | | | | |
| VIEWING PLANE B | <001> 10% | <301> 46% | <201> 11% | <101> 5% | <x01> 72% |
| VIEWING PLANE C | <001> 10% | <301> 57% | <201> 10% | <101> 9% | <x01> 86% |

Table 8 shows that the orientation <001> with the range of angle fluctuation between +10° occupies 76%, i.e., 60% or more of plane orientations of crystal grains on the viewing plane A. In addition, it shows that <x01> (x=0, 1, 2, 3) occupies 72%, i.e., 60% or more on the viewing plane B. Note that an orientation ratio of <x01> (x=0, 1, 2, 3, 4, 5, 6) obtained according to similar calculation is 79%, i.e., 60% or more on the viewing plane B.

In addition, it shows that <x01> (x=0, 1, 2, 3) occupies 86%, i.e., 60% or more on the viewing plane C. Note that an orientation ratio of <x01> (x=0, 1, 2, 3, 4, 5, 6) obtained according to similar calculation is 88%, i.e., 60% or more on the viewing plane C. In other words, the orientation ratio of <x01> (x=0, 1, 2, 3) is 60% or more, and the orientation ratio of <x01> (x=0, 1, 2, 3, 4, 5, 6) exceeds that of <x01> (x=0, 1, 2, 3). Further, it shows that an orientation ratio of <x01> (x=0, 2, 3) excluding a plane orientation when x is 1 is also 60% or more on each of the viewing planes B and C.

Embodiment 5

This embodiment describes an orientation ratio of plane orientation of a crystalline silicon film which is formed with the energy and scan speed of the laser beam and the composition and thickness of the cap film different from those in Embodiment 1, with reference to FIGS. 32A to 32F.

First, a method for manufacturing a crystalline silicon film of Embodiment 5 is described with reference to FIG. 18. A stacked film of a silicon nitride film containing oxygen and a silicon oxide film containing nitrogen, which is the insulating film 101, was formed by using a parallel-plate plasma CVD apparatus over the substrate 100 similar to the substrate described in Embodiment 1. As the substrate 100, a glass substrate having a thickness of 0.7 mm manufactured by Corning, Inc. was used.

Figure 33:
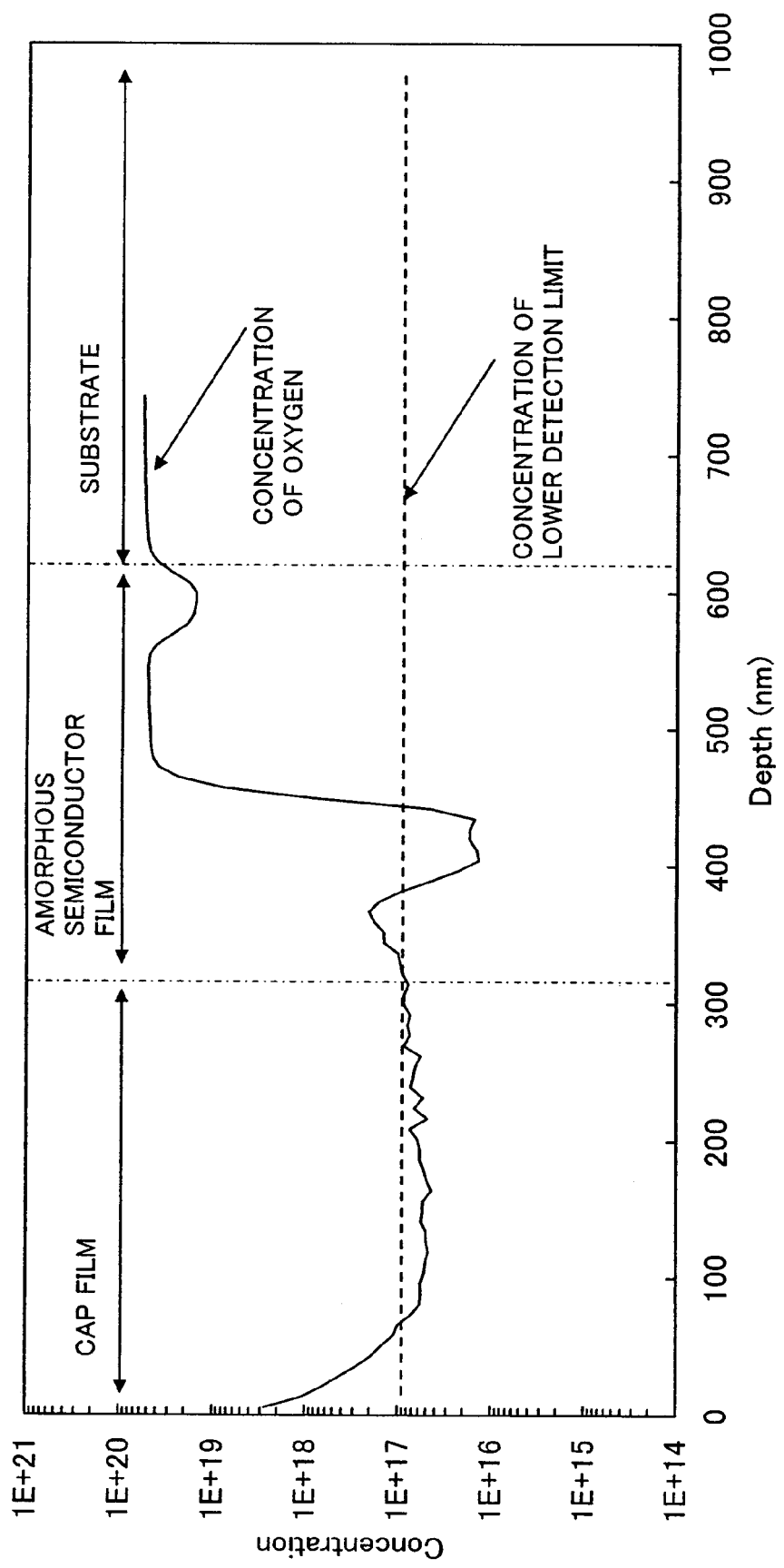
FIG. 33 is a diagram showing concentration of oxygen of a cap film of an embodiment obtained by SIMS measurement.

The deposition conditions were as follows.
<Silicon Nitride Film Containing Oxygen>
  Thickness: 50 nm
  Type of gas (flow rate): $SiH_4$ (15 sccm), $NH_3$ (150 sccm), $N_2O$ (20 sccm), $H_2$ (1200 sccm)
  Substrate temperature: 330° C.
  Pressure: 40 Pa
  RF frequency: 13.56 MHz
  RF power: 250 W
  Distance between electrodes: 24.5 mm
  Electrode area: 2972.8 $cm^2$
<Silicon Oxide Film Containing Nitrogen>
  Thickness: 100 nm
  Type of gas (flow rate): $SiH_4$ (30 sccm), $N_2O$ (1200 sccm)
  Substrate temperature: 330° C.
  Pressure: 40 Pa
  RF frequency: 13.56 MHz
  RF power: 50 W
  Distance between electrodes: 24.5 mm
  Electrode area: 2972.8 $cm^2$ As the amorphous semiconductor film 102, an amorphous silicon film was formed by using a parallel-plate plasma CVD apparatus. The deposition conditions of the amorphous silicon film were as follows.
<Amorphous Silicon Film>
  Thickness: 66 nm
  Type of gas (flow rate): $SiH_4$ (280 sccm), $H_2$ (300 sccm)
  Substrate temperature: 330° C.
  Pressure: 170 Pa
  RF frequency: 13.56 MHz
  RF power: 250 W
  Distance between electrodes: 24.5 mm
  Electrode area: 2972.8 $cm^2$ Next, a silicon nitride film containing oxygen at a concentration below the detection limit of SIMS was formed over the amorphous semiconductor film 102 as the cap film 103 by using a parallel-plate plasma CVD apparatus. The deposition conditions were as follows.
<Silicon Nitride Film Containing Oxygen At Concentration Below Detection Limit>
  Thickness: 300 nm
  Type of gas (flow rate): $SiH_4$ (15 sccm), $NH_3$ (150 sccm), $H_2$ (1200 sccm)
  Substrate temperature: 330° C.
  Pressure: 40 Pa
  RF frequency: 13.56 MHz
  RF power: 250 W
  Distance between electrodes: 24.5 mm
  Electrode area: 2972.8 $cm^2$ FIG. 33 shows the concentration of oxygen in the cap film 103 deposited. The values of the oxygen concentrations of the films shown in FIG. 33 are those in a state before heat treatment or laser irradiation. The oxygen concentrations were measured using secondary ion mass spectrometry (SIMS). In FIG. 33, the oxygen concentration of the cap film 103 of Embodiment 5 is almost equal to or below the detection limit of current SIMS. Therefore, in practice, the concentration is thought to be further lower ($1 \times 10^{17}$ atoms/$cm^3$ or lower).

After the cap film 103 was formed, it was heated at 500° C. for an hour in an electric furnace, and then at 550° C. for four hours. This heat treatment is treatment for extracting hydrogen from the silicon nitride film containing oxygen at a concentration below the detection limit, which is the cap film. Hydrogen is extracted in order to prevent a hydrogen gas from spouting from the silicon nitride film containing oxygen at a concentration below the detection limit when the silicon nitride film containing oxygen is irradiated with a laser beam.

The amorphous silicon film was irradiated with a laser beam through the cap film 103 by using a laser irradiation apparatus and was crystallized, thereby forming a crystalline silicon film. In this embodiment, the movement speed of the substrate was set to 20 cm/sec. An LD excitation $YVO_4$ laser was used as each of the two laser oscillators, and its second harmonic (wavelength: 532 nm) was used for irradiation. The laser beam had an intensity of 9.6 W on the irradiation surface and had a linear shape on the irradiation surface with a length of approximately 500 µm and a width of approximately 20 µm.

<Measurement of Crystalline Silicon Film>

EBSP measurement was carried out to confirm the position, the size, and the plane orientation of crystal grains of the crystalline silicon film. In order to carry out the EBSP measurement, the cap film 103 was removed by etching from the surface of the crystalline silicon film. In the EBSP measurement, the plane orientation of crystal grains was measured from an EBSP image obtained by making an electron beam incident on the surface of the crystalline silicon film at an incidence angle of 60°.

The measurement region was 50 µm×50 µm and the measurement pitch was 0.5 µm. EBSP images of three viewing planes A to C which are perpendicular to each other as shown in FIG. 2 were measured. FIGS. 32A to 32F show analysis results of plane orientations (crystal axis orientations perpendicular to viewing planes) of the crystalline silicon film.

FIG. 32A is an orientation map image showing distribution of the plane orientation <001> in the measurement area of 50 µm×50 µm on the viewing plane A. FIG. 32B is an orientation map image showing distribution of the plane orientations <001>, <301>, <201>, and <101> in the measurement area of 50 µm×50 µm on the viewing plane B. FIG. 32C is an orientation map image showing distribution of the plane orientations <001>, <301>, <201>, and <101> in the measurement area of 50 µm×50 µm on the viewing plane C. Each map image has a length of 50 µm on each side.

In FIG. 32A, a crystalline silicon film having the plane orientation <001> is formed in a colored portion. In each of FIGS. 32B and 32C, a crystalline silicon film having the plane orientations <001>, <301>, <201>, and <101> is formed in a colored portion.

FIG. 32D shows a calculation result of an orientation ratio of crystal grains having the plane orientation <001> on the viewing plane A, in which a colored region is a region showing crystal grains having the plane orientation <001> within the range of angle fluctuation between ±10° or less.

FIG. 32E shows calculation results of orientation ratios of crystal grains having the plane orientations <001>, <301>, <201>, and <101> on the viewing plane B. The whole region of the colored regions is a region showing crystal grains having the plane orientation <x01> (x=0, 1, 2, 3) within the range of angle fluctuation between ±10° or less. The regions have different colors according to the value of x to differentiate regions corresponding to the plane orientations <001>, <301>, <201>, and <101>. Here, an overlap between plane orientations is excluded.

FIG. 32F shows calculation results of orientation ratios of crystal grains having the plane orientations <001>, <301>, <201>, and <101> on the viewing plane C. The whole region of the colored regions is a region showing crystal grains having the plane orientation <x01> (x=0, 1, 2, 3) within the range of angle fluctuation between ±10° or less. Similarly to FIG. 32E, regions corresponding to the plane orientations are differentiated according to the value of x.

Table 9 shows orientation ratios of plane orientations on the viewing planes A to C and an orientation ratio of <x01> (x=0, 1, 2, 3) (i.e., the sum of orientation ratios of the orientations <001>, <301>, <201>, and <101> excluding an overlap) on the viewing planes B and C. Note that the ratios have been rounded off to the nearest whole number.

TABLE 9

| VIEWING PLANE A | <001> | | | | |
|---|---|---|---|---|---|
| | 68% | | | | |
| VIEWING PLANE B | <001> | <301> | <201> | <101> | <x01> |
| | 36% | 20% | 16% | 1% | 72% |
| VIEWING PLANE C | <001> | <301> | <201> | <101> | <x01> |
| | 45% | 18% | 19% | 0% | 81% |

Table 9 shows that the orientation <001> within the range of an angle fluctuation of ±10° occupies 68%, i.e., 60% or more on the viewing plane A. In addition, it shows that <x01> (x=0, 1, 2, 3) occupies 72%, i.e., 60% or more on the viewing plane B. Note that an orientation ratio of <x01> (x=0, 1, 2, 3, 4, 5, 6) obtained according to similar calculation is 81%, i.e., 60% or more on the viewing plane B.

Further, it shows that <x01> (x=0, 1, 2, 3) occupies 81%, i.e., 60% or more on the viewing plane C. Note that an orientation ratio of <x01> (x=0, 1, 2, 3, 4, 5, 6) obtained according to similar calculation is 85%, i.e., 60% or more on the viewing plane C. In other words, the orientation ratio of <x01> (x=0, 1, 2, 3) is 60% or more, and the orientation ratio of <x01> (x=0, 1, 2, 3, 4, 5, 6) exceeds that of <x01> (x=0, 1, 2, 3). Furthermore, it shows that an orientation ratio of <x01> (x=0, 2, 3) excluding a plane orientation when x is 1 also is 60% or more on each of the viewing planes B and C.

This application is based on Japanese Patent Application serial no. 2006-077484 filed in Japan Patent Office on Mar. 20, 2006, the entire contents of which are hereby incorporated by reference.

What is claimed is:

1. A method for manufacturing a semiconductor device comprising:
    forming an insulating film over a substrate;
    forming an amorphous semiconductor film having a film thickness of equal to or more than 20 nm and equal to or less than 80 nm over the insulating film;
    forming, over the amorphous semiconductor film, a silicon nitride film in which a film thickness is 200 nm to 1000 nm, equal to or less than 10 atomic % of oxygen is included, and a relative proportion of nitrogen to silicon is equal to or more than 1.3 and equal to or less than 1.5; and
        forming a crystalline semiconductor film from the amorphous semiconductor film by irradiating the amorphous semiconductor film with a laser light through the silicon nitride film such that energy of the laser light is absorbed in the amorphous semiconductor film,
    wherein at a first plane of the crystalline semiconductor film, a ratio of crystal grains of an orientation of <001> within a range of ±10° of angle fluctuation is equal to or more than 60% and less than 100%,
    wherein at a second plane of the crystalline semiconductor film, a ratio of crystal grains of an orientation of any one of <001>, <101>, <201>, <301>, <401>, <501>, or <601> within a range of ±10° of angle fluctuation is equal to or more than 60% and less than 100%,
    wherein at a third plane of the crystalline semiconductor film, a ratio of crystal grains of an orientation of any one of <001>, <101>, <201>, <301>, <401>, <501>, or <601> within a range of ±10° of angle fluctuation is equal to or more than 60% and less than 100%,
    wherein a normal vector of the first plane is perpendicular to the surface of the substrate,
    wherein a normal vector of the second plane is parallel to the surface of the substrate and is parallel to the direction of crystal growth of crystal grain,
    wherein a normal vector of the third plane is parallel to the surface of the substrate and is perpendicular to the direction of crystal growth of crystal grain, and
    wherein the laser light is a continuous-wave laser light or a laser light with repetition rate of equal to or more than 10 MHz.

2. The method for manufacturing a semiconductor device according to claim 1, wherein the silicon nitride film including oxygen is formed by plasma CVD in an atmosphere including $SiH_4$, $NH_3$, and $N_2O$.

3. The method for manufacturing a semiconductor device according to claim 1, wherein the silicon nitride film including oxygen is formed by plasma CVD in an atmosphere including $SiH_4$ and $NH_3$.

4. The method for manufacturing a semiconductor device according to claim 1, wherein the amorphous semiconductor film has a film thickness of equal to or more than 20 nm and equal to or less than 80 nm.

5. A method for manufacturing a semiconductor device comprising:
    forming an insulating film over a substrate;
    forming an amorphous semiconductor film having a film thickness of equal to or more than 20 nm and equal to or less than 80 nm over the insulating film;
    forming, over the amorphous semiconductor film, a silicon nitride film in which a film thickness is 200 nm to 1000 nm, equal to or less than 10 atomic % of oxygen is included, and a relative proportion of nitrogen to silicon is equal to or more than 1.3 and equal to or less than 1.5;
    forming a crystalline semiconductor film from the amorphous semiconductor film by irradiating the amorphous semiconductor film with a laser light through the silicon nitride film such that energy of the laser light is absorbed in the amorphous semiconductor film; and
    forming a semiconductor element using the crystalline semiconductor film,
    wherein at a first plane of the crystalline semiconductor film, a ratio of crystal grains of an orientation of <001> within a range of ±10' of angle fluctuation is equal to or more than 60% and less than 100%,
    wherein at a second plane of the crystalline semiconductor film, a ratio of crystal grains of an orientation of any one of <001>, <101>, <201>, <301>, <401>, <501>, or <601> within a range of ±10" of angle fluctuation is equal to or more than 60% and less than 100%, wherein at a third plane of the crystalline semiconductor film, a ratio of crystal grains of an orientation of any one of <001>, <101>, <201>, <301>, <401>, <501>, or <601> within a range of ±10' of angle fluctuation is equal to or more than 60% and less than 100%,
wherein a normal vector of the first plane is perpendicular to the surface of the substrate,
wherein a normal vector of the second plane is parallel to the surface of the substrate and is parallel to the direction of crystal growth of crystal grain,
wherein a normal vector of the third plane is parallel to the surface of the substrate and is perpendicular to the direction of crystal growth of crystal grain, and
wherein the laser light is a continuous-wave laser light or a laser light with repetition rate of equal to or more than 10 MHz.

6. The method for manufacturing a semiconductor device according to claim 5, wherein the silicon nitride film including oxygen is formed by plasma CVD in an atmosphere including $SiH_4$, $NH_3$, and $N_2O$.

7. The method for manufacturing a semiconductor device according to claim 5, wherein the silicon nitride film including oxygen is formed by plasma CVD in an atmosphere including $SiH_4$ and $NH_3$.

8. The method for manufacturing a semiconductor device according to claim 5, wherein the amorphous semiconductor film has a film thickness of equal to or more than 20 nm and equal to or less than 80 nm.

9. The method for manufacturing a crystalline semiconductor film according to claim 1, wherein the irradiating is performed while scanning the continuous-wave laser light or the laser light with repetition rate of equal to or more than 10 MHz.

10. The method for manufacturing a crystalline semiconductor film according to claim 9, wherein a crystal grain in the crystalline semiconductor film formed by the irradiating is long along a direction of the scanning.

11. The method for manufacturing a semiconductor device according to claim 5, wherein the irradiating is performed while scanning the continuous-wave laser light or the laser light with repetition rate of equal to or more than 10 MHz.

12. The method for manufacturing a semiconductor device according to claim 11, wherein a crystal grain in the crystalline semiconductor film formed by the irradiating is long along a direction of the scanning.

13. The method for manufacturing a semiconductor device according to claim 5, wherein the semiconductor device is used for a display device.

14. The method for manufacturing a semiconductor device according to claim 5, wherein the semiconductor device is a thin film transistor.

* * * * *